(12) United States Patent
Molnar

(10) Patent No.: US 6,739,947 B1
(45) Date of Patent: May 25, 2004

(54) IN SITU FRICTION DETECTOR METHOD AND APPARATUS

(75) Inventor: Charles J Molnar, Wilmington, DE (US)

(73) Assignee: Beaver Creek Concepts Inc, Wilmington, DE (US)

( * ) Notice: Subject to any disclaimer, the term of this patent is extended or adjusted under 35 U.S.C. 154(b) by 238 days.

(21) Appl. No.: 09/939,957

(22) Filed: Aug. 27, 2001

Related U.S. Application Data

(63) Continuation-in-part of application No. 09/533,409, filed on Mar. 29, 2000, and a continuation-in-part of application No. 09/435,181, filed on Nov. 5, 1999, now Pat. No. 6,283,829.

(60) Provisional application No. 60/128,281, filed on Apr. 8, 1999, provisional application No. 60/128,278, filed on Apr. 8, 1999, provisional application No. 60/127,393, filed on Apr. 1, 1999, provisional application No. 60/107,301, filed on Nov. 6, 1998, provisional application No. 60/107,300, filed on Nov. 6, 1998, provisional application No. 60/107,299, filed on Nov. 6, 1998, and provisional application No. 60/107,298, filed on Nov. 6, 1998.

(51) Int. Cl.⁷ .............................................. B24B 49/14
(52) U.S. Cl. .......................... 451/8; 451/5; 451/41; 451/285
(58) Field of Search ............................... 451/4, 5, 8–11, 451/41, 60, 63, 36, 285–290, 449; 438/690, 691, 692, 693; 216/38, 88, 89, 91; 252/79.1

(56) References Cited

U.S. PATENT DOCUMENTS

| | | | |
|---|---|---|---|
| 4,421,068 A | 12/1983 | Aral | 122/448 |
| 4,544,375 A | 10/1985 | Rehmat et al. | 48/197 |
| 5,023,045 A | 6/1991 | Watnabe et al. | 376/215 |
| 5,069,002 A | 12/1991 | Sandhu | 51/165 R |

(List continued on next page.)

FOREIGN PATENT DOCUMENTS

| | | | |
|---|---|---|---|
| WO | WO 98/08919 | 3/1998 | |
| WO | WO 99/64527 | 12/1999 | C09G/1/02 |
| WO | WO 00/00561 | 1/2000 | C09G/1/02 |
| WO | WO 00/00567 | 1/2000 | C09K/3/14 |

OTHER PUBLICATIONS 6204181 withdrawn from issue, Molnar, filed Nov. 5, 1999, published Mar. 20, 2001, Ser. No. 09/438180.

Berman, Mike et al., "Review of in Situ and in Line Detection for CMP Applic.", Semiconductor Fabtech, 8ᵗʰ edition, pp. 267–274.

Bibby, Thomas, "Endpoint Detection for CMP", Journal of Electronic Materials, vol. 27, #10, 1998, pp. 1073–1081.

"Understanding and Using Cost of Ownership", Wright Williams & Kelly, Dublin, CA, rev 0595–1.

(List continued on next page.)

Primary Examiner—Joseph J. Hail, III
Assistant Examiner—Anthony Ojini

(57) ABSTRACT

An apparatus and method of using a friction detectors for finishing semiconductor wafers is described. The method uses friction sensors for detecting and improving control during finishing. The method can aid control of finishing while using lubricating films, preferably lubricating boundary layers, in the operative finishing interface. The method can generally aid control of differential lubricating films such as lubricating boundary layers and improve differential finishing of semiconductor wafers. Planarization and localized finishing can be improved using differential lubricating boundary layer methods of finishing. Defects can be reduced using the in situ friction detector method. Real time improvements to cost of manufacture semiconductor wafer manufacture can be made by tracking and using current in process cost of manufacture parameters. The semiconductor wafers can be tracked individually or by process group such as a process batch. Abrasive finishing surfaces can be used.

42 Claims, 13 Drawing Sheets

U.S. PATENT DOCUMENTS

| | | | | |
|---|---|---|---|---|
| 5,107,445 A | | 4/1992 | Jensen | 36/525 |
| 5,137,544 A | | 8/1992 | Medellin | 51/308 |
| 5,154,512 A | | 10/1992 | Schietinger | 374/9 |
| 5,166,080 A | | 11/1992 | Schietinger | 437/7 |
| 5,196,353 A | | 3/1993 | Sandhu | 437/7 |
| 5,232,875 A | * | 8/1993 | Tuttle et al. | 438/693 |
| 5,308,438 A | | 5/1994 | Cote | 156/636 |
| 5,314,843 A | | 5/1994 | Yu | 437/225 |
| 5,340,370 A | | 8/1994 | Cadien | 51/38 |
| 5,352,277 A | | 10/1994 | Sasaki | 106/6 |
| 5,413,941 A | | 5/1995 | Koos | 437/8 |
| 5,456,627 A | * | 10/1995 | Jackson et al. | 451/11 |
| 5,486,995 A | | 1/1996 | Krist et al. | 364/149 |
| 5,521,814 A | | 5/1996 | Teran et al. | 364/402 |
| 5,537,325 A | | 7/1996 | Iwakiri et al. | 364/468.28 |
| 5,595,526 A | | 1/1997 | Yau | 451/8 |
| 5,597,442 A | | 1/1997 | Chen | 156/626.1 |
| 5,609,511 A | | 3/1997 | Moriyama | 451/5 |
| 5,609,517 A | | 3/1997 | Lofaro | 451/529 |
| 5,614,444 A | | 3/1997 | Farkas | 437/225 |
| 5,624,300 A | * | 4/1997 | Kishii et al. | 451/36 |
| 5,639,388 A | | 6/1997 | Kimura | 216/84 |
| 5,643,060 A | | 7/1997 | Sandhu | 451/285 |
| 5,647,952 A | | 7/1997 | Chen | 156/636.1 |
| 5,667,629 A | | 9/1997 | Pan | 438/13 |
| 5,679,063 A | * | 10/1997 | Kimura et al. | 451/287 |
| 5,682,309 A | | 10/1997 | Bartusiak et al. | 364/149 |
| 5,685,766 A | | 11/1997 | Mattingly | 451/36 |
| 5,691,895 A | | 11/1997 | Kurtzberg et al. | 364/148 |
| 5,695,384 A | | 12/1997 | Beratan | 451/28 |
| 5,695,660 A | | 12/1997 | Litvak | 216/85 |
| 5,722,879 A | | 3/1998 | Cronin | 451/281 |
| 5,728,308 A | | 3/1998 | Muroyama | 216/88 |
| 5,733,176 A | | 3/1998 | Robinson | 451/41 |
| 5,733,819 A | | 3/1998 | Kodama | 438/692 |
| 5,735,036 A | | 4/1998 | Barr | 29/603.12 |
| 5,738,562 A | | 4/1998 | Doan | 451/5 |
| 5,740,033 A | | 4/1998 | Wassick et al. | 364/149 |
| 5,743,784 A | | 4/1998 | Birang | 451/21 |
| 5,749,769 A | | 5/1998 | Church | 451/5 |
| 5,759,917 A | | 6/1998 | Grover et al. | 438/690 |
| 5,762,537 A | | 6/1998 | Sandhu | 451/7 |
| 5,774,633 A | | 6/1998 | Baba et al. | 395/23 |
| 5,783,489 A | | 7/1998 | Kaufman | 438/692 |
| 5,799,286 A | | 8/1998 | Morgan et al. | 705/30 |
| 5,830,280 A | | 11/1998 | Sato | 134/2 |
| 5,833,519 A | | 11/1998 | Moore | 451/56 |
| 5,842,909 A | | 12/1998 | Sandhu | 451/7 |
| 5,858,813 A | | 1/1999 | Scherber | 438/692 |
| 5,860,847 A | | 1/1999 | Sakurai | 451/10 |
| 5,876,266 A | | 3/1999 | Miller | 451/56 |
| 5,876,490 A | | 3/1999 | Ronay | 106/3 |
| 5,885,137 A | | 3/1999 | Ploessl | 106/3 |
| 5,885,334 A | | 3/1999 | Suzuki | 438/639 |
| 5,906,754 A | | 5/1999 | Appel | 216/88 |
| 5,910,041 A | | 6/1999 | Duescher | 451/28 |
| 5,916,855 A | | 6/1999 | Avanzino | 51/307 |
| 5,919,082 A | | 7/1999 | Walker | 451/41 |
| 5,934,978 A | | 8/1999 | Burke | |
| 5,945,347 A | | 8/1999 | Wright | 438/692 |
| 5,954,975 A | | 9/1999 | Cadien | 216/38 |
| 5,954,997 A | | 9/1999 | Kaufman | 252/79.1 |
| 5,958,794 A | | 9/1999 | Bruxuoort | 438/692 |
| 5,968,280 A | | 10/1999 | Ronay | 134/2 |
| 5,972,793 A | | 10/1999 | Tseng | 438/692 |
| 5,985,045 A | | 11/1999 | Kobayashi | 148/240 |
| 5,987,398 A | | 11/1999 | Halverson et al. | 702/179 |
| 5,993,298 A | | 11/1999 | Duescher | 451/56 |
| 6,038,540 A | | 3/2000 | Krist et al. | 705/8 |
| 6,056,781 A | | 5/2000 | Wassick et al. | 703/12 |
| 6,110,214 A | | 8/2000 | Klimasauskas | 703/2 |
| 6,121,143 A | | 9/2000 | Messner et al. | 438/692 |
| 6,128,540 A | | 10/2000 | Van Der Vegt et al. | 700/36 |
| 6,157,916 A | | 12/2000 | Hoffman | 705/8 |
| 6,197,604 B1 | | 3/2001 | Miller | 438/14 |
| 6,246,972 B1 | | 6/2001 | Klimasauskas | 703/2 |
| 6,257,953 B1 | | 7/2001 | Gitis et al. | 451/5 |
| 6,263,255 B1 | | 7/2001 | Tan et al. | 700/121 |
| 6,267,644 B1 | | 7/2001 | Molnar | 451/41 |
| 6,268,641 B1 | | 7/2001 | Yano et al. | 257/260 |
| 6,283,829 B1 | | 9/2001 | Molnar | 451/8 |
| 6,291,349 B1 | | 9/2001 | Molnar | 438/609 |
| 6,293,851 B1 | | 9/2001 | Molnar | 451/41 |
| 6,298,470 B1 | | 10/2001 | Breiner et al. | 716/4 |
| 6,408,227 B1 | | 6/2002 | Singhvi et al. | 700/266 |
| 6,526,547 B2 | | 2/2003 | Breiner et al. | 716/4 |
| 6,567,718 B1 | | 5/2003 | Campbell et al. | 700/121 |
| 6,568,989 B1 | | 5/2003 | Molnar | 451/5 |
| 2002/0010563 A1 | | 1/2002 | Ratteree et al. | 703/2 |
| 2002/0123818 A1 | | 9/2002 | Yamada et al. | 700/121 |
| 2002/0199082 A1 | | 12/2002 | Shanmugasundram et al. | 712/208 |
| 2003/0046130 A1 | | 3/2003 | Golightly et al. | 705/7 |
| 2003/0061004 A1 | | 3/2003 | Discenzo | 702/182 |
| 2003/0083757 A1 | | 5/2003 | Card et al. | 700/28 |
| 2003/0093762 A1 | | 5/2003 | Reitman et al. | 716/2 |

OTHER PUBLICATIONS

"Intermetal Dielectric Cost-of-Ownership", Case, C.B. and Case, C. J., *Semiconductor International*, Jun. 1995, pp 83–88.

"Using COO to select Nitride PECVD clean cycle", Anderson, Bob, et al., Semiconductor International, Oct. 1993, pp 86–88.

"The application of cost of ownership simulation to wafer sort and final test", Jimez, D. W. et al., SEMI's Manufacturing test Conference, Jul., 1993.

"Reducing Tungsten Deposition equipment cost of ownership through in situ contamination prevention and reduction", Burghard, R. W., et al., *Microcontamination*, Oct. 1992, pp 23–25.

"Reducing ion–implant equipment cost of ownship through in situ contamination prevention and control", Burghard, R. W., et al., *Microcontamination*, Sep. 1992, pp 27–30.

"Reducing tungsten–etch equipment cost of ownership through in situcontamination prevention and reduction", Burghard, R. W., et al., *Microcontamination*, Jun. 1992, pp 33–36.

"Reducing process equipment cost of ownership through in situ contamination prevention and reduction", Burghard, R. W., et al., *Microcontamination*, May. 1992, pp 21–24.

"Cost of ownership for inspection equipment", Dance D. and Bryson, P., Sematech, Austin, Texas, date unknown.

"Fixed abrasives and selective chemistries: some real advantages for direct STI CMP", J. J. Gaglieardi et al., CMP–MIC, Mar., 2002.

3M "SlurryFree" CMP fixed abrasives for Direct HDP STI CMP, J. J. Gagliardi et al., Technical Brief, Jun. 2001.

\* cited by examiner

Figure 8 Cost of ownership vs defect density

Figure 9 Cost of ownership vs equipment yield

Figure 10 Cost of ownership vs parametric yield

Figure 11 Cost of ownership vs wafer polishing rate

IN SITU FRICTION DETECTOR METHOD AND APPARATUS

CROSS REFERENCE TO RELATED APPLICATIONS

This application claims benefit of Provisional Application serial No. 60/107,299 filed on Nov. 6, 1998 entitled "In situ detector for finishing electronics"; Provisional Application serial No. 60/107,300 filed on Nov. 6, 1998 entitled "In situ detector for finishing workpieces"; Provisional Application serial No. 60/107,298 filed on Nov. 6, 1998 entitled "Fixed abrasive finishing method using lubricants for electronics"; Provisional Application serial No. 60/107,301 filed on Nov. 6, 1998 entitled "Finishing method with a fixed abrasive finishing element having finishing aid"; Provisional Application serial No. 60/127,393 filed on Apr. 1, 1999 entitled "Control of semiconductor wafer finishing"; Provisional Application serial No. 60/128,278 filed on Apr. 8, 1999 entitled "Improved semiconductor wafer finishing control" and Provisional Application serial No. 60/128,281 filed on Apr. 8, 1999 entitled "Semiconductor wafer finishing with partial organic boundary layer lubricant". This application is a continuation-in-part and claims benefit of Regular Patent Application with Ser. No. 09/435,181 filed on Nov. 5, 1999, now U.S. Pat. No. 6,283,829, with title "In situ friction detector method for finishing semiconductor wafers" and Regular Patent Application with Ser. No. 09/533,409 filed on Mar. 29, 2000 entitled "Improved semiconductor wafer finishing control.

Provisional Applications and Regular Patent Applications above are included herein by reference in their entirety.

BACKGROUND OF INVENTION

Chemical mechanical polishing (CMP) is generally known in the art. For example U.S. Pat. No. 5,177,908 to Tuttle issued in 1993 describes a finishing element for semiconductor wafers, having a face shaped to provide a constant, or nearly constant, surface contact rate to a workpiece such as a semiconductor wafer in order to effect improved planarity of the workpiece. U.S. Pat. No. 5,234,867 to Schultz et. al. issued in 1993 describes an apparatus for planarizing semiconductor wafers which in a preferred form includes a rotatable platen for polishing a surface of the workpiece and a motor for rotating the platen and a non-circular pad is mounted atop the platen to engage and polish the surface of the semiconductor wafer. Fixed abrasive finishing elements are also known for polishing semiconductor layers. An example is WO 98/18159 PCT application by Minnesota Mining and Manufacturing.

Semiconductor wafer fabrication generally requires the formation of layers of material having particularly small thickness. A typical conductor layer, such as a metal layer, is generally 2,000 to 6,000 angstroms thick and a typical insulating layer, for example a an oxide layer, is generally 3,000 to 5,000 angstroms thick. The actual thickness is at least partially dependent on the function of the layer along with the function and design of the semiconductor wafer. A gate oxide layer can be less than 100 angstroms while a field oxide is in the thousands of angstroms in thickness. In higher density and higher value semiconductor wafers the layers can be below 500 angstroms in thickness. Generally during semiconductor fabrication, layers thicker than necessary are formed and then thinned down to the required tolerances with techniques needed such as Chemical Mechanical Polishing. Because of the strict tolerances, extreme care is given to attaining the required thinned down tolerances. As such, it is important to accurately determine just when enough of the layer has been removed to reach the required tolerances, this is the end point for the thinning or polishing operation. One method to remove selected amounts of material is to remove the semiconductor wafer periodically from polishing for measurements such as thickness layer measurements. Although this can be done it is time consuming and adds extra expense to the operation. Further the expensive wafers can be damaged during transfer to or from the measurement process further decreasing process yields and increasing costs.

BRIEF SUMMARY OF INVENTION

Confidential applicant evaluations also suggest that lubricants supplied to the interface between the workpiece surface being finished and the polishing pad polishing surface can improve finishing. Addition of lubricants to the interface between the workpiece surface being finished and the polishing pad polishing surface can improve finishing but also changes the friction at this interface. In situ process control where lubricants are added or changed during the finishing process can change finishing performance. A method to detect in process changes due to lubricant additions and/or changes is needed in the industry. A method which can also help improve the cost of manufacture of the semiconductor wafers during a finishing cycle time having real time friction changes would be generally desirable.

As discussed above, there is a need for in situ detector for CMP and other finishing techniques which will function with or without the addition lubrication to the finishing interface. There is a need for an in situ detector and control of CMP and other finishing control parameters which account for and adjust for the addition and/or control of lubrication at the finishing interface. There is a need for an in situ detector and control of CMP and other finishing control parameters which detect the endpoint and/or/stop the CMP and/or other finishing processes. There is a need to use cost of manufacture parameters for real time process control when using operative friction sensors. There is a need to use real time process control and current cost of manufacture with active lubrication of the interface to improve the finishing costs.

It is an advantage of this invention to develop an in situ friction sensor subsystem and finishing sensor subsystem for CMP and other finishing techniques and methods which function with or without the addition lubrication to the finishing interface. It is an advantage of this invention to develop an in situ friction sensor subsystem and finishing sensor subsystem for control of CMP and other finishing control parameters which account for and adjust for the addition and/or control of lubrication at the finishing interface. It is an advantage of this invention to develop an in situ friction sensor subsystem and finishing sensor subsystem CMP and other finishing control parameters which detect the endpoint and stop the CMP and/or other finishing processes. It is an advantage of this invention to use cost of manufacture parameters for real time process control when using operative friction sensors. It is an advantage of this invention to develop to use real time process control and current cost of manufacture with active lubrication of the interface to improve the finishing costs. It is an advantage of this invention to develop a method which can also help improve the cost of manufacture of the semiconductor wafers during a finishing cycle time having real time friction changes.

These and other advantages of the invention in preferred embodiments will become readily apparent to those of ordinary skill in the art after reading the following disclosure of the invention.

A preferred embodiment of this invention is directed to a finishing apparatus comprising a workpiece carrier for holding workpiece surface to finished; a finishing element finishing surface positioned proximate the workpiece surface to be finished; a mechanism for applying an operative finishing motion to the operative finishing interface comprising workpiece surface to be finished and finishing element finishing surface; and a friction control subsystem having at least one friction sensor probe having a friction sensor surface proximate to the finishing element finishing surface and free of contact with the workpiece surface and the friction sensor subsystem being capable of in situ control of a finishing control parameter.

A preferred embodiment of this invention is directed to a finishing apparatus comprising a workpiece carrier for holding workpiece surface to finished; a finishing element finishing surface positioned proximate the workpiece surface to be finished; a mechanism for applying an operative finishing motion to the operative finishing interface comprising workpiece surface to be finished and finishing element finishing surface; and a friction control subsystem having at least one friction sensor probe having a friction sensor surface proximate to the finishing element finishing surface and free of contact with the workpiece surface, the friction sensor probe capable of measuring a change in tangential force of friction and the friction sensor subsystem being capable of in situ control of a finishing control parameter responsive to a signal from the friction sensor probe.

A preferred embodiment of this invention is directed to a finishing apparatus comprising a semiconductor wafer carrier for holding semiconductor wafer surface to be finished; a finishing element finishing surface positioned proximate the semiconductor wafer surface to be finished; a mechanism for applying an operative finishing motion to the operative finishing interface comprising the semiconductor wafer surface to be finished and finishing element finishing surface; and a friction control subsystem having at least one friction sensor probe having a friction sensor surface proximate to the finishing element finishing surface and free of contact with the semiconductor wafer surface and the friction sensor subsystem being capable of in situ control of a finishing control parameter.

A preferred embodiment of this invention is directed to a finishing apparatus comprising a semiconductor wafer carrier for holding the semiconductor wafer surface to be finished; a finishing element finishing surface positioned proximate the semiconductor wafer surface to be finished; a mechanism for applying an operative finishing motion to the operative finishing interface comprising the semiconductor wafer surface to be finished and finishing element finishing surface; and friction control subsystem having at least one friction sensor probe having a friction sensor surface proximate to the finishing element finishing surface and free of contact with the semiconductor wafer surface, the friction sensor probe capable of measuring a change in tangential force of friction and the friction sensor subsystem being capable of in situ control of a finishing control parameter responsive to a signal from the friction sensor probe.

A preferred embodiment of this invention is directed to a method of finishing of a semiconductor wafer surface comprising a step 1) of providing a finishing element finishing surface; a step 2) of positioning the semiconductor wafer surface being finished proximate to the finishing element finishing surface; a step 3) of providing an organic lubricant to the interface formed between the semiconductor wafer surface and the finishing element finishing surface; a step 4) of providing at least one operative friction sensor capable of gaining information about the finishing; a step 5) of applying an operative finishing motion between the semiconductor wafer surface being finished and the finishing element finishing surface forming an operative finishing interface having a friction; a step 6) of sensing the friction with the operative friction sensor and sending the information about the friction to a processor having access to current cost of manufacture parameters; a step 7) of evaluating finishing control parameters for improved adjustment using at least in part a minimum of two cost of manufacture parameters; and a step 8) of controlling at least two process control parameters to improve the cost of manufacture of the semiconductor wafer.

A preferred embodiment of this invention is directed to a method of finishing of a semiconductor wafer surface having a finishing cycle time comprising a step 1) of providing a finishing element finishing surface; a step 2) of positioning the semiconductor wafer surface being finished proximate to the finishing element finishing surface; a step 3) of providing an organic lubricant to the interface formed between the semiconductor wafer surface and the finishing element finishing surface; a step 4) of providing at least two operative friction sensors capable of gaining information about the finishing; a step 5) of applying an operative finishing motion between the semiconductor wafer surface being finished and the finishing element finishing surface forming an operative finishing interface with at least one friction; a step 6) of sensing friction with the at least two operative friction sensors and sending the information about the finishing to a processor having access to useful cost of manufacture parameters; a step 7) of evaluating finishing control parameters for improved adjustment using at least in part a minimum of three useful cost of manufacture parameters; and a step 8) of controlling and adjusting at least 4 times a minimum of two process control parameters to improve the cost of manufacture of the semiconductor wafer during the finishing cycle time.

A preferred embodiment of this invention is directed to a method of finishing of a semiconductor wafer surface having a finishing cycle time comprising a step 1) of providing an abrasive finishing surface; a step 2) of positioning the semiconductor wafer surface being finished proximate to the finishing element finishing surface; a step 3) of providing an organic lubricant and a finishing composition to an interface formed between the finishing element finishing surface and the semiconductor wafer surface; a step 4) of providing at least one operative friction sensor capable of gaining information about the finishing; a step 5) of applying an operative finishing motion between the semiconductor wafer surface being finished and the finishing element finishing surface forming an operative finishing interface; a step 6) of sensing the progress of the finishing of the semiconductor wafer surface with the operative sensor and sending the information about the finishing to a processor having access to current cost of manufacture parameters; a step 7) of evaluating finishing control parameters for improved adjustment using at least in part a minimum of three current cost of manufacture parameters; and a step 8) of controlling two process control parameters at least 4 times during the finishing cycle time to improve the cost of manufacture of the semiconductor wafer.

A preferred embodiment of this invention is directed to a method of finishing of a semiconductor wafer surface comprising a step 1) of providing a finishing element finishing surface; a step 2) of positioning the semiconductor wafer surface proximate to the finishing element finishing surface; a step 3) of providing an organic lubricant and a finishing composition to an interface formed between the finishing element finishing surface and the semiconductor wafer surface; a step 4) of providing at least one operative friction sensor capable of gaining information about the finishing; a step 5) of applying an operative finishing motion between the semiconductor wafer surface being finished and the finishing element finishing surface forming an operative finishing interface; a step 6) of sensing the progress of the finishing of the semiconductor wafer surface with the operative sensor and sending the information about the finishing to a processor having access to useful cost of manufacture parameters; a step 7) of evaluating finishing control parameters for improved adjustment using at least in part at least two useful cost of manufacture parameters; and a step 8) of controlling at least two process control parameters to improve the cost of manufacture of the semiconductor wafer.

A preferred embodiment of this invention is directed to a method of finishing having a finishing cycle time comprising a step 1) of providing a semiconductor wafer having a tracking code; a step 2) of providing a finishing element finishing surface; a step 3) of positioning the semiconductor wafer surface being finished proximate to the finishing element finishing surface; a step 4) of providing a lubricant to the interface formed between the semiconductor wafer surface and the finishing element finishing surface; a step 5) of providing at least one operative friction sensor capable of gaining information about the finishing; a step 6) of applying an operative finishing motion between the semiconductor wafer surface being finished and the finishing element finishing surface forming an operative finishing interface having a friction; a step 7) of sensing the friction with the operative friction sensor and sending the information about the friction to a processor having access to current cost of manufacture parameters; a step 8) of evaluating finishing control parameters for improved adjustment using at least in part a minimum of a plurality of the current cost of manufacture parameters; and a step 9) of controlling at least two process control parameters to improve the cost of manufacture of the semiconductor wafer.

A preferred embodiment of this invention is directed to a method of finishing comprising a step 1) of providing a semiconductor wafer having a tracking code; a step 2) providing an abrasive finishing surface; a step 3) of positioning the semiconductor wafer surface being finished proximate to the abrasive finishing surface; a step 4) of providing at least one operative friction sensor capable of gaining information about the finishing; a step 5) of applying an operative finishing motion between the semiconductor wafer surface being finished and the abrasive finishing surface forming an operative finishing interface having a friction; a step 6) of sensing the friction with the operative friction sensor and sending the information about the friction to a processor having access to current cost of manufacture parameters; a step 7) of evaluating using a mathematical formula to calculate in situ at least two improved process control parameter values based at least in part upon at least two cost of manufacture parameters selected from the group consisting of parametric yield, equipment yield, defect density, and finishing rate; and a step 8) of controlling at least two process control parameters to improve the cost of manufacture of the semiconductor wafer.

A preferred embodiment of this invention is directed a method of finishing of a workpiece surface being finished comprising the step of providing a finishing element finishing surface; the step of positioning the workpiece surface being finished proximate to the finishing surface; the step of providing at least one friction sensor probe having a friction sensor surface proximate to the finishing element finishing surface and free of contact with the workpiece surface; the step of applying an operative finishing motion to an operative finishing interface comprising the interface between the finishing element finishing surface and the workpiece surface being finished; the step of applying an operative friction sensor motion between the friction sensor surface and the finishing element finishing surface and wherein the operative friction sensor motion comprises applying a movement to friction sensor surface; the step of sensing a tangential friction force between the friction sensor surface and the finishing element finishing surface with a friction sensor subsystem; and the step of controlling in situ a finishing control parameter with the friction sensor subsystem.

A preferred embodiment of this invention is directed a method of finishing of a workpiece surface being finished comprising a step a) providing a finishing element finishing surface; a step b) positioning the workpiece surface being finished proximate to the finishing surface; a step c) providing at least one friction sensor probe having a friction sensor surface proximate to the finishing element finishing surface and free of contact with the workpiece surface; a step d) applying an operative finishing motion between the workpiece surface being finished and the finishing surface forming an operative finishing interface; a step e) applying an operative friction sensor motion between the friction sensor surface and the finishing element finishing surface; a step f) sensing the friction between the friction sensor surface and the finishing element finishing surface with a friction sensor subsystem; and a step g) controlling in situ a finishing control parameter with the friction sensor subsystem.

Another preferred embodiment of this invention is directed to a method of finishing of a workpiece surface being finished comprising a step a) providing a finishing element finishing surface; a step b) positioning the workpiece surface being finished proximate to the finishing surface; a step c) providing at least one friction sensor probe having a friction sensor surface proximate to the finishing element finishing surface and free of contact with the workpiece surface; a step d) providing a finishing element conditioner operatively connected for controlling through a finishing sensor subsystem during the finishing cycle; a step e) applying an operative finishing motion between the workpiece surface being finished and the finishing element finishing surface forming an operative finishing interface; a step f) applying an operative friction sensor motion between the friction sensor surface and the finishing element finishing surface; a step g) sensing the friction information between the friction sensor surface and the finishing element finishing surface with a friction sensor subsystem and transferring the sensed friction information to the finishing sensor subsystem; and a step h) controlling in situ at least one finishing element conditioning control parameter by using the friction information sensed between the friction sensor surface and the finishing element finishing surface with the finishing sensor subsystem.

Other preferred embodiments are discussed herein.

Reference Numerals in Drawings

Reference Numeral 20 workpiece

Figure 1:
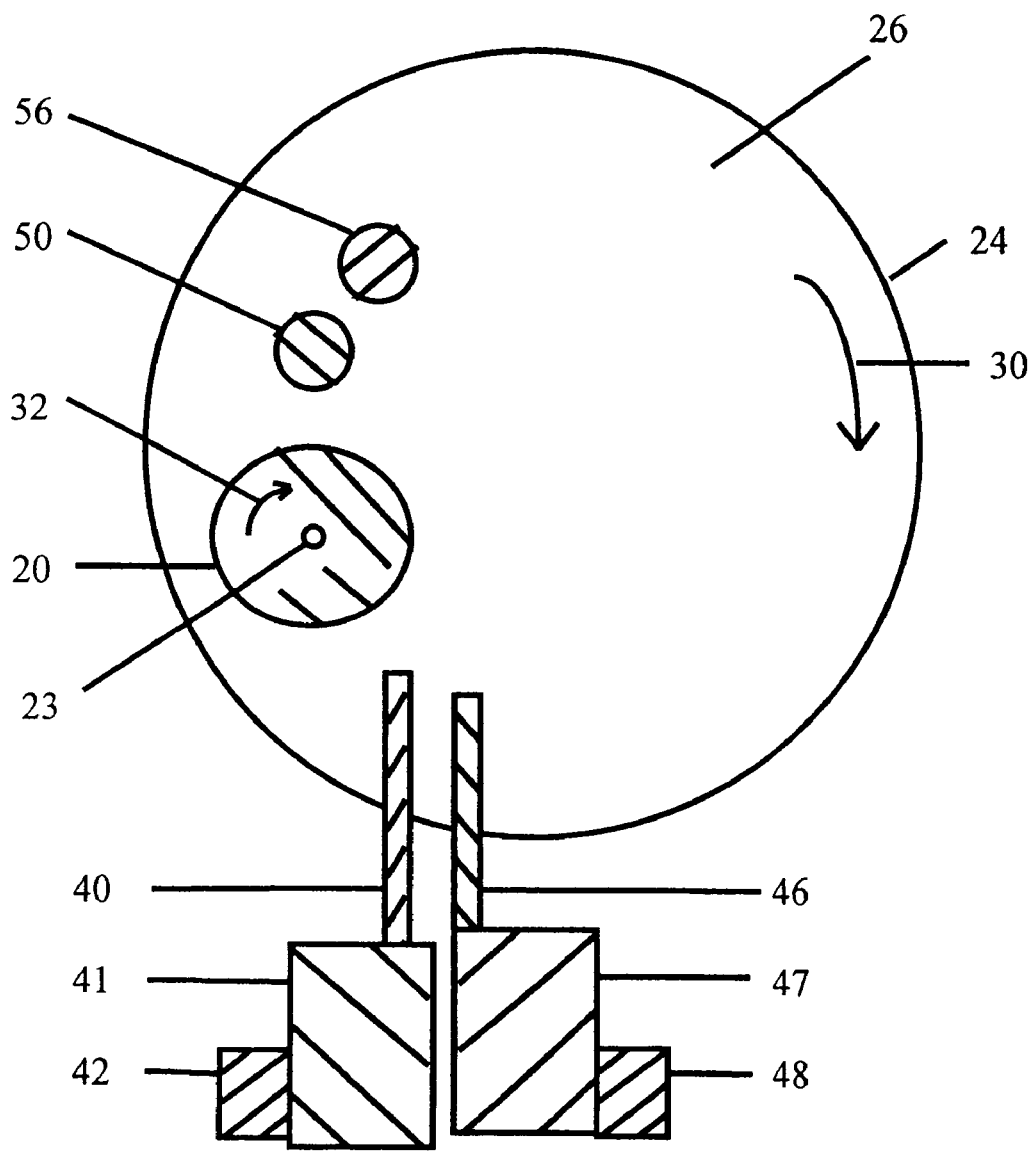
FIG. 1 is an artist's drawing of a preferred embodiment of this invention from a top down perspective.

Reference Numeral 21 workpiece surface facing away from the workpiece surface being finished.

Reference Numeral 22 surface of the workpiece being finished

Reference Numeral 23 center of rotation of the workpiece

Reference Numeral 24 finishing element

Reference Numeral 26 finishing element finishing surface

Reference Numeral 28 finishing element surface facing away from workpiece surface being finished Reference Numeral 29 finishing composition and, optionally, alternate finishing composition Reference Numeral 30 direction of rotation of the finishing element finishing surface Reference Numeral 32 direction of rotation of the workpiece being finished Reference Numeral 33 force applied perpendicular to operative finishing motion Reference Numeral 34 operative finishing motion between the workpiece surface being finished and the finishing element finishing surface Reference Numeral 35 applied pressure between the workpiece surface being finished and the finishing element finishing surface Reference Numeral 36 operative finishing motion between the first friction sensor probe surface and the finishing element finishing surface Reference Numeral 37 applied pressure between the second friction sensor probe surface and the finishing element finishing surface Reference Numeral 38 operative friction motion between the second friction sensor probe surface and the finishing element finishing surface Reference Numeral 39 applied pressure between the second friction sensor probe surface and the finishing element finishing surface Reference Numeral 40 finishing composition feed line Reference Numeral 41 reservoir of finishing composition Reference Numeral 42 feed mechanism for finishing composition Reference Numeral 46 alternate finishing composition feed line Reference Numeral 47 alternate reservoir of finishing composition Reference Numeral 48 alternate feed mechanism for finishing composition Reference Numeral 50 first friction sensor probe Reference Numeral 51 first friction sensor surface Reference Numeral 52 first friction probe motor Reference Numeral 54 operative connection between first friction sensor probe and first friction drive motor Reference Numeral 56 second friction sensor probe Reference Numeral 57 second friction sensor surface Reference Numeral 58 second friction probe motor Reference Numeral 56 operative connection between second friction sensor probe and second friction drive motor Reference Numeral 61 unwanted raised surface region on the workpiece Reference Numeral 62 carrier Reference Numeral 63 operative contact element Reference Numeral 64 motor for carrier Reference Numeral 70 platen Reference Numeral 72 surface of platen facing finishing element Reference Numeral 74 surface of platen facing base support structure Reference Numeral 76 surface of the base support structure facing the platen Reference Numeral 77 base support structure Reference Numeral 78 surface of the base support structure facing away from the platen Reference Numeral 90 body of a friction sensor probe Reference Numeral 92 insulation in a friction sensor probe Reference Numeral 94 friction sensor element Reference Numeral 95 friction sensor surface Reference Numeral 96 operative friction sensor Reference Numeral 98 thermal adjustment for port friction sensor probe Reference Numeral 102 operative sensor connections Reference Numeral 104 processor Reference Numeral 106 operative connection(s) between processor and controller Reference Numeral 108 controller Reference Numeral 110 operative connection(s) between controller and equipment controlled Reference Numeral 200 substantially perpendicular force applied to the interface between the friction sensor probe and the finishing element finishing surface.

Reference Numeral 202 represents a parallel motion in the interface between the friction sensor probe and the finishing element finishing surface Reference Numeral 800 portion of a semiconductor wafer surface having two unwanted raised regions.

Reference Numeral 802 unwanted raised regions on the semiconductor surface being finished.

Reference Numeral 804 lower local regions on the semiconductor surface being finished proximate to the unwanted raised regions.

Reference Numeral 810 finishing surface contacting unwanted raised regions

Reference Numeral 812 finishing element surface local region displaced from but proximate to and lower than the unwanted raised local regions.

Reference Numeral 900 boundary layer lubrication.

Reference Numeral 902 thinner regions of boundary layer lubrication

Reference Numeral 904 thicker regions of boundary layer lubrication

DETAILED DESCRIPTION OF THE INVENTION

The book *Chemical Mechanical Planarization of Microelectric Materials* by Steigerwald, J. M. et al published by John Wiley & Sons, ISBN 0471138274 generally describes chemical mechanical finishing and is included herein by reference in its entirety for general background. In chemical mechanical finishing the workpiece is generally separated from the finishing element by a polishing slurry. The workpiece surface being finished is in parallel motion with finishing element finishing surface disposed towards the workpiece surface being finished. The abrasive particles such as found in a polishing slurry interposed between these surfaces finish the workpiece. FIGS. 1–5 are now discussed to better illustrate the invention.

Discussion of some of the terms useful to aid in understanding this invention are now presented. Finishing is a term used herein for both planarizing and polishing. Planarizing is the process of making a surface which has raised surface perturbations or cupped lower areas into a planar surface and thus involves reducing or eliminating the raised surface perturbations and cupped lower areas. Planarizing changes the topography of the workpiece from non planar to ideally perfectly planar. Polishing is the process of smoothing or polishing the surface of an object and tends to follow the topography of the workpiece surface being polished. A finishing element is a term used herein to describe a pad or element for both polishing and planarizing. A finishing element finishing surface is a term used herein for a finishing element surface used for both polishing and planarizing. A finishing element planarizing surface is a term used herein for a finishing element surface used for planarizing. A finishing element polishing surface is a term used herein for a finishing element surface used for polishing. Workpiece surface being finished is a term used herein for a workpiece surface undergoing either or both polishing and planarizing. A workpiece surface being planarized is a workpiece surface undergoing planarizing. A workpiece surface being polished is a workpiece surface undergoing polishing. The finishing cycle time is the elapsed time in minutes that the workpiece is being finished. A portion of a finishing cycle time is about 5% to 95% of the total finishing cycle time in minutes and a more preferred portion of a finishing cycle time is 10% to 90% of the total finishing cycle time in minutes. The planarizing cycle time is the elapsed time in minutes that the workpiece is being planarized. The polishing cycle time is the elapsed time in minutes that the workpiece is being polishing.

As used herein, an emulsion is a fluid containing a microscopically heterogeneous mixture of two (2) normally immiscible liquid phases, in which one liquid forms minute droplets suspended in the other liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. A hydrocarbon oil is a non limiting example. As used herein, soluble means capable of mixing with a liquid (dissolving) to form a homogeneous mixture (solution).

As used herein, a dispersion is a fluid containing a microscopically heterogeneous mixture of solid phase material dispersed in a liquid and in which the solid phase material is in minute particles suspended in the liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. As used herein, soluble means capable of mixing with a liquid (dissolving) to form a homogeneous mixture (solution).

As used herein, a die is one unit on a semiconductor wafer generally separated by scribe lines. After the semiconductor wafer fabrication steps are completed, the die are separated into units generally by sawing. The separated units are generally referred to as "chips". Each semiconductor wafer generally has many die which are generally rectangular. The terminology semiconductor wafer and die are generally known to those skilled in the arts. As used herein, within die uniformity refers to the uniformity of within the die. As used herein, local planarity refers to die planarity unless specifically defined otherwise. Within wafer uniformity refers to the uniformity of finishing of the wafer. As used herein, wafer planarity refers to planarity across a wafer. Multiple die planarity is the planarity across a defined number of die. As used herein, global wafer planarity refers to planarity across the entire semiconductor wafer planarity. Planarity is important for the photolithography step generally common to semiconductor wafer processing, particularly where feature sizes are less than 0.25 microns. As used herein, a device is a discrete circuit such as a transistor, resistor, or capacitor. As used herein, pattern density is ratio of the raised (up) area in square millimeters to the to area in square millimeters of region on a specific region such as a die or semiconductor wafer. As used herein, pattern density is ratio of the raised (up) area in square millimeters to the total area in square millimeters of region on a specific region such as a die or semiconductor wafer. As used herein, line pattern density is the ratio of the line width to the pitch. As used herein, pitch is line width plus the oxide space. As an illustrative example, pitch is the copper line width plus the oxide spacing. Oxide pattern density, as used herein, is the volume fraction of the oxide within an infinitesimally thin surface of the die.

FIG. 1 is an artist's drawing of a particularly preferred embodiment of this invention when looking from a top down perspective including the interrelationships of some important objects when finishing according to the method of this invention. Reference Numeral 20 represents the workpiece being finished. Reference Numeral 23 is the center of the rotation of the workpiece. The workpiece surface facing the finishing element finishing surface is the workpiece surface being finished. Reference Numeral 24 represents the finishing element. Reference Numeral 26 represents the finishing element finishing surface. A finishing element finishing surface which is free of abrasive particles connected to the finishing surface is preferred for some applications. For these applications, a finishing element finishing surface which is free of inorganic abrasive particles connected to the finishing surface is more preferred and a finishing element finishing surface which is free of fixed abrasive particles is even more preferred. Abrasive particles which are connected to and/or fixed to the finishing surface increase the possibility of causing unwanted surface damage to the workpiece surface being finished but it is currently believed that lubrication of the operative finishing interface can reduce or eliminate some of these harmful effects of finishing elements finishing surfaces having a fixed abrasive. It is important to measure and control active lubrication at the operative finishing interface to minimize some of these harmful effects. It is important to have a finishing feedback subsystem with can monitor and function well with or without lubricant changes at the operative finishing interface. By having a finishing surfaces which are free of attached abrasive particles, potential damage from fixed abrasives is avoided. By having the real time friction sensor subsystems and finishing sensor subsystems of this invention, changes in friction due to real time lubrication at the operative finishing interface can be sensed, controlled and adjusted to improve finishing, with a finishing element surface free of fixed abrasives and with a finishing element surface having fixed abrasives. Feeding a finishing composition without abrasives is preferred and feeding a finishing composition without abrasive particles is more preferred. Supplying a finishing composition without abrasives is preferred and supplying a finishing composition without abrasive particles is more preferred. Feeding a water borne finishing composition having a lubricant which free of abrasive particles is also preferred and feeding a water borne finishing composition having a lubricant which is free of abrasive particles is particularly preferred. A lubricant free of separate and unconnected abrasive particles is preferred. Reference Numeral 30 represents the direction of rotation of the finishing element finishing surface. Reference Numeral 32 represents the direction of rotation of the workpiece being finished. Reference Numeral 40 represents a finishing composition feed line for adding chemicals to the surface of the workpiece such as acids, bases, buffers, other chemical reagents, abrasive particles and the like. The finishing composition feed line can have a plurality of exit orifices. A preferred finishing composition is finishing slurry. Reference Numeral 41 represents a reservoir of a finishing composition to be fed to a finishing element finishing surface. Reference Numeral 42 represents a feed mechanism for the finishing composition such as a variable air or gas pressure or a pump mechanism. Reference Numeral 46 represents an alternate finishing composition feed line for adding a finishing chemicals composition to the finishing element finishing surface to improve the quality of finishing. Reference Numeral 47 represents an alternate finishing composition reservoir of chemicals to be, optionally, fed to finishing element finishing surface. The alternate finishing composition can also contain abrasive particles and thus can be a finishing slurry. Supplying a finishing composition without abrasives is preferred and supplying a finishing composition without abrasive particles is more preferred for some applications such as where a fixed abrasive finishing element finishing surface is used for finishing. Supplying a lubricant which is free of an encapsulating film or encapsulating thin resin structure is preferred. Encapsulating lubricants is an expensive and complex step which is unnecessary in this invention. Further, encapsulated lubricants tend to burst on breaking and can deliver higher than desired localized lubricants to regions. Further, the encapsulated lubricants can prematurely burst releasing their contents during manufacture of the slurry and/or finishing element. This can contaminate the slurry and/or finishing element and adversely affect their respective finishing performance. Reference Numeral 48 represents a feed mechanism for the alternate finishing composition such as a variable pressure or a pump mechanism. A preferred embodiment of this invention is to feed liquids free of abrasives from the finishing composition feed line and the alternate finishing composition feed line in which at least one feed has a liquid having abrasive particles in a slurry. Another preferred embodiment, not shown, is to have a wiping element, preferably an elastomeric wiping element, to uniformly distribute the finishing composition(s) across the finishing element finishing surface. Multiple nozzles to feed the finishing composition and alternate finishing composition can be preferred to better distribute them across the finishing element finishing surface. Nonlimiting examples of some preferred dispensing systems and wiping elements are found in U.S. Pat. No. 5,709,593 to Guthrie et. al., U.S. Pat. No. 5,246,525 to Junichi, and U.S. Pat. No. 5,478,435 to Murphy et. al. and are included herein by reference in their entirety for general guidance and appropriate modifications by those generally skilled in the art for supplying lubricants. Alternately supplying the finishing composition through pores or holes in the finishing element finishing surface to effect a uniform distribution of the lubricant is also effective. Reference Numeral 50 represents a first friction sensor probe. Reference Numeral 56 represents a optional second friction sensor probe. A thermal sensor probe is a preferred friction sensor probe. An infrared sensor probe is a preferred thermal sensor probe. A thermocouple probe is a preferred thermal sensor probe. A thermistor probe is a preferred thermal sensor probe.

Figure 2:
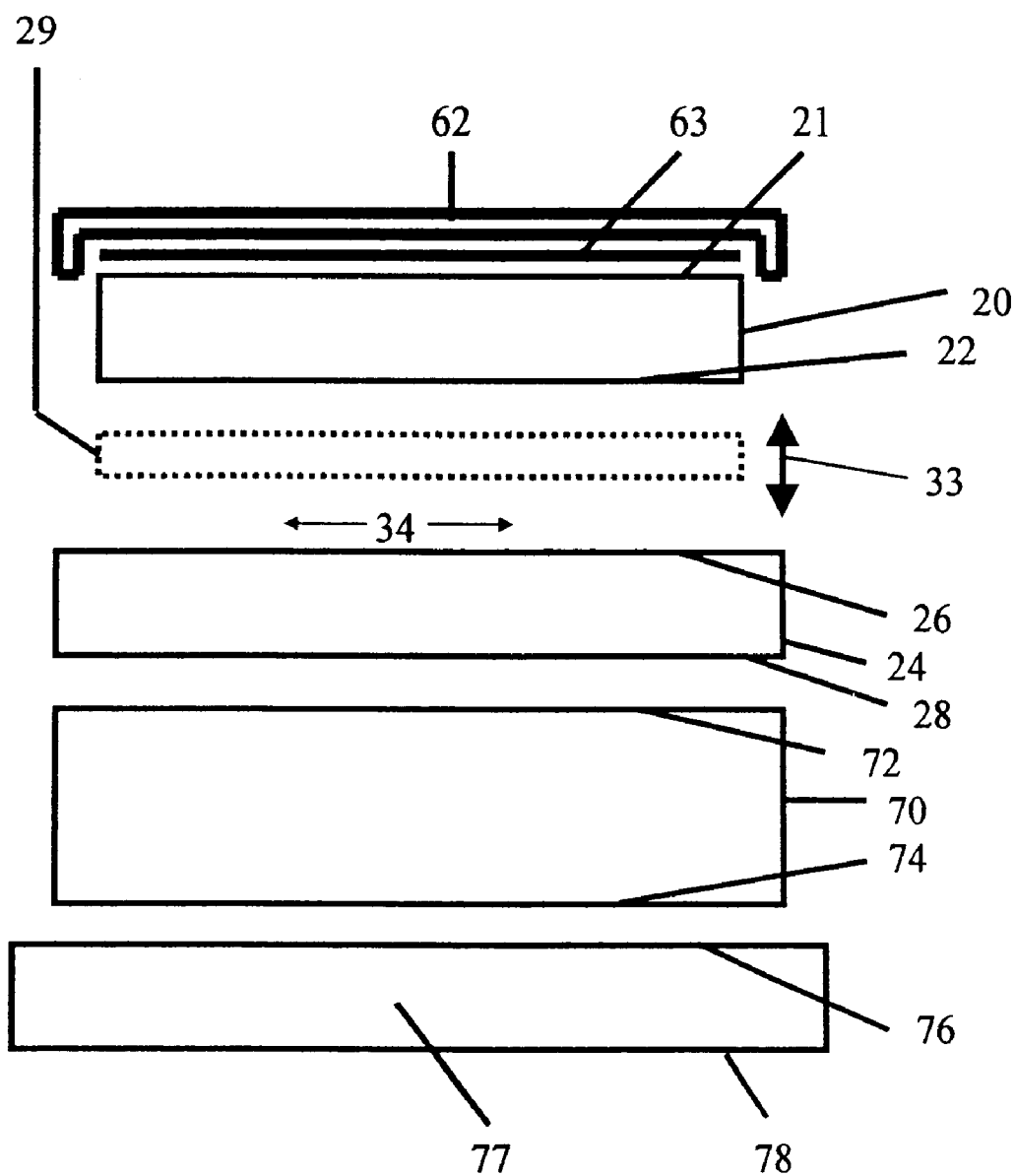
FIG. 2 is an artist's close up drawing of a particular preferred embodiment of this invention including the interrelationships of the different objects when finishing according to this invention.

FIG. 2 is an artist's closeup drawing of a preferred embodiment of this invention showing some further interrelationships of the different objects when finishing according to the method of this invention. Reference Numeral 62 represents a carrier for the workpiece and in this particular embodiment, the carrier is a rotating carrier. The rotating carrier is operable to rotate the workpiece against the finishing element which rests against the platen and optionally has a motor. Optionally, the rotating carrier can also be designed to move the workpiece laterally, in an arch, figure eight, or orbitally to enhance uniformity of polishing. The workpiece is in operative contact with the rotating carrier and optionally, has an operative contact element (Reference Numeral 63) to hold the workpiece to the carrier during finishing. An illustrative example of an operative contact element (Reference Numeral 63) is a workpiece held in place to the rotating carrier with a bonding agent. A hot wax is an illustrative example of a preferred bonding agent. Alternately, a porometric film can be placed in the rotating carrier having a recess for holding the workpiece. A wetted porometric film (an alternate operative contact element, Reference Numeral 63) will hold the workpiece in place by surface tension. An adherent thin film is another preferred example of placing the workpiece in operative contact with the rotating carrier. Reference Numeral 20 represents the workpiece. Reference Numeral 21 represents the workpiece surface facing away from the workpiece surface being finished. Reference Numeral 22 represents the surface of the workpiece being finished. Reference Numeral 24 represents the finishing element. Reference Numeral 26 represents the finishing element surface facing the workpiece surface being finished and is often referred to herein as the finishing element finishing surface. Reference Numeral 28 represents the surface of the finishing element facing away from the workpiece surface being finished. Reference Numeral 29 represents the finishing composition and optionally, the alternate finishing composition supplied between the workpiece surface being finished and surface of the finishing element facing the workpiece. Reference Numeral 33 represents a force applied perpendicularly to the operative finishing motion. Reference Numeral 34 represents a preferred direction of the operative finishing motion between the surface of the workpiece being finished and the finishing element finishing surface. Reference Numeral 70 represents the platen or support for the finishing element. The platen can also have an operative finishing motion relative to the workpiece surface being finished. Reference Numeral 72 represents the surface of the platen facing the finishing element. The surface of the platen facing the finishing element is in support contact with the finishing element surface facing away from the workpiece surface being finished. The finishing element surface facing the platen can, optionally, be connected to the platen by adhesion. Frictional forces between the finishing element and the platen can also retain the finishing element against the platen. Reference Numeral 74 is the surface of the platen facing away from the finishing element. Reference Numeral 76 represents the surface of the base support structure facing the platen. Reference Numeral 77 represents the base support structure. Reference Numeral 78 represents the surface of the base support structure facing away from the platen. The rotatable carrier (Reference Number 70) can be operatively connected to the base structure to permit improved control of pressure application at the workpiece surface being finished (Reference Numeral 22).

Figure 3:
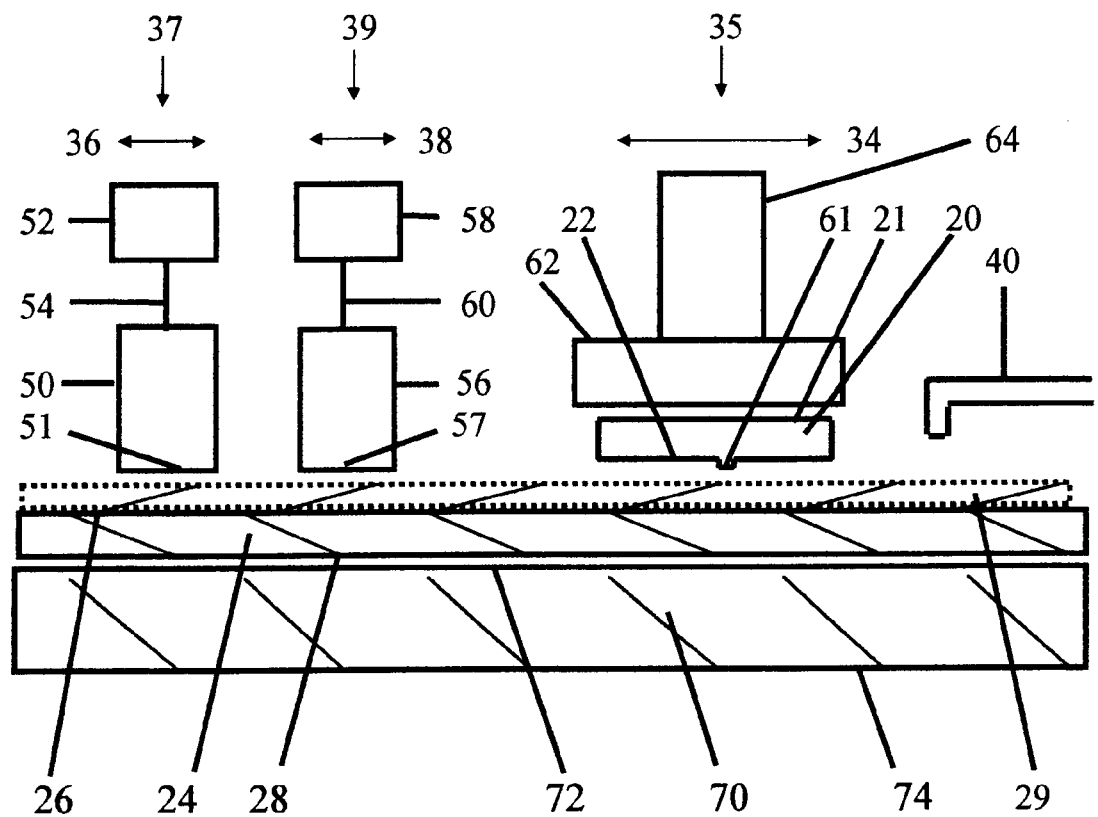
FIG. 3 is an drawing of a preferred embodiment of this invention

FIG. 3 is an artist's drawing of a preferred embodiment of this invention showing some further interrelationships of some of some the objects when finishing according to the method of this invention. Reference Numeral 20 represents the workpiece being finished. Reference Numeral 21 represents the workpiece surface facing away from the finishing element finishing surface. Reference Numeral 22 represents the workpiece surface being finished. Reference Numeral 61 represents an unwanted raised region on the workpiece surface being finished. Reference Numeral 62 represents a simplified view of the carrier for the workpiece. The carrier for the workpiece can have a number of preferred options, depending on the finishing required, such as a retainer ring, a fluid filled chuck, and/or a chuck capable of applying localized differential pressures across the wafer to better control wafer finishing. Reference Numeral 64 represents the optionally preferred motor for applying a finishing motion to workpiece being finished. Reference Numeral 34 represents a preferred operative finishing motion. Reference Numeral 35 represents a preferred operative pressure applied to workpiece surface by urging it against or towards the finishing element finishing surface. Reference Numeral 40 represents the finishing composition feed line. The alternate finishing feed line, Reference Numeral 46, is behind the Reference Numeral 40 and thus is not shown in this particular artist's drawing. Reference Numeral 24 represents the finishing element. Reference Numeral 26 represents the finishing element finishing surface. Reference Numeral 28 represents the finishing element surface facing away from the workpiece surface being finished. Reference Numeral 29 represents the finishing composition and optionally, the alternate finishing composition supplied between the workpiece surface being finished and surface of the finishing element facing the workpiece. Reference Numeral 50 represent a first friction sensor probe. An operative friction sensor capable of gaining information about the finishing is preferred. An operative finishing sensor capable of gaining information about the finishing is also preferred. Examples of discussed herein below of operative friction sensors and operative finishing sensors. Reference Numeral 51 represents the surface of the first friction probe in friction contact with finishing element finishing surface and is often referred to herein as the first friction sensor surface. Reference Numeral 52 represents an optional motor to rotate the first friction sensor probe. Reference Numeral 54 represents an optional operative connection between the first friction sensor probe and motor. Reference Numeral 36 represent a preferred friction motion between the first friction sensor probe friction sensor surface and the finishing element finishing surface. Reference numeral 37 represents an operative pressure applied to first friction probe friction sensor surface by urging it against or towards the finishing element finishing surface. Reference Numeral 56 represent a preferred optional second friction sensor probe. Reference Numeral 57 represents the surface of the second friction probe in friction contact with finishing element finishing surface and is often referred to herein as the second friction sensor surface. Reference Numeral 58 represents an optional second motor to rotate the second friction sensor probe. Reference Numeral 60 represents an optional second operative connection between the second friction sensor probe and an optional motor. Reference Numeral 38 represent a preferred friction motion between the second friction sensor probe friction sensor surface and the finishing element finishing surface. Reference numeral 39 represents an operative pressure applied to second friction probe friction sensor surface by urging it against or towards the finishing element finishing surface. The operative finishing motion, the operative first friction motion, and the operative second friction motion can differ between each other and are preferably controlled independently of each other's motions and/or pressures.

Figure 4:
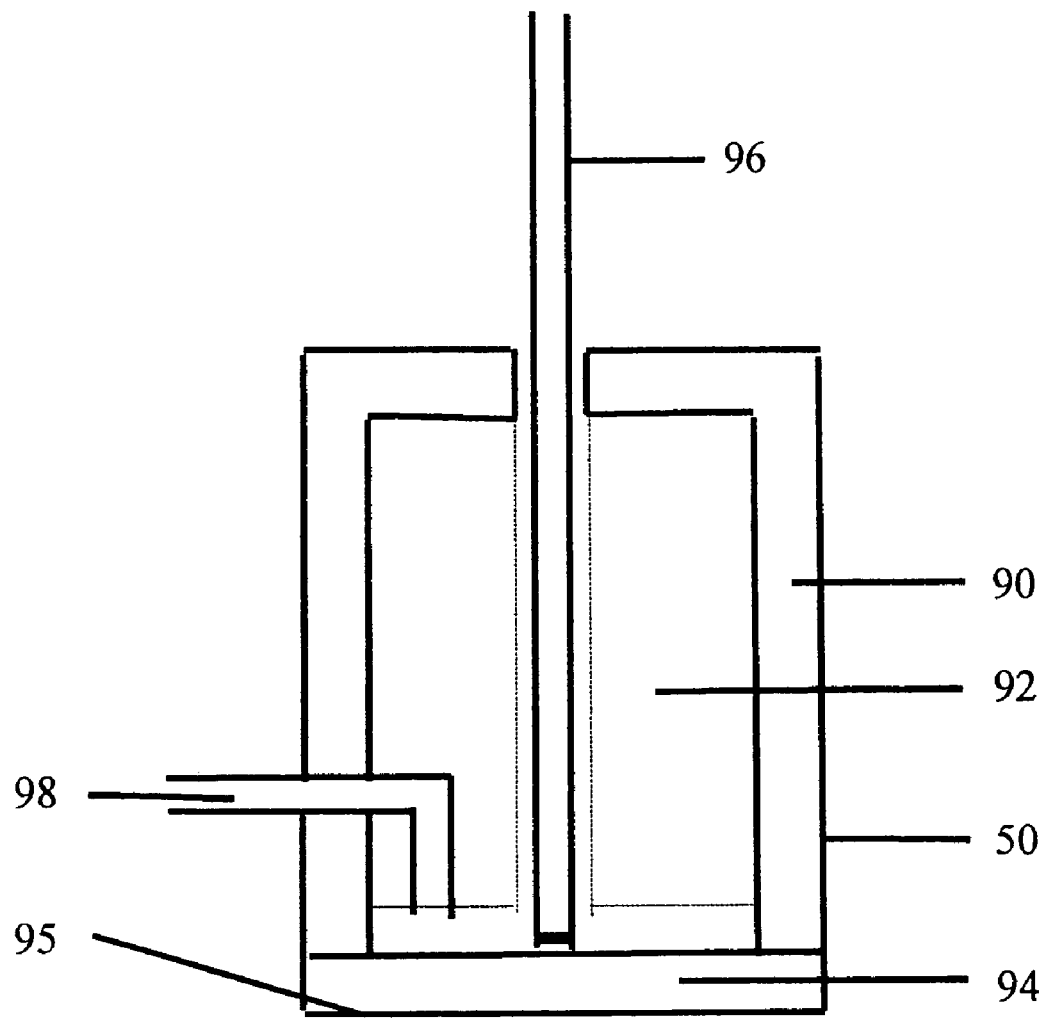
FIG. 4 is cross-sectional view of a thermal sensor probe

FIG. 4 is an artist's drawing of a preferred embodiment of one type of preferred friction sensor probe useful for this invention showing some further interrelationships of the sections in the friction sensor probe. Reference Numeral 50 represents the friction sensor probe. Reference Numeral 90 represents the body of the friction sensor probe. The body of the friction sensor probe can be comprised of many different materials. A friction sensor probe body comprising metal or plastic is preferred. Reference Numeral 92 represents optional, but preferred insulation in the friction sensor probe. Reference Numeral 94 represents a friction sensor element for the friction sensor probe. During operation, the friction sensor surface (Reference Numeral 95) is in operative friction motion with the finishing element finishing surface and the results of this friction are measured by a friction sensor probe. Shown in this embodiment is an operative friction sensor such as a thermal couple (Reference Numeral 96) which measures friction during operative friction motion by measuring changes in temperature due to increased or decreased friction. A friction sensor surface which responds to operative friction motion is preferred. A friction sensor surface which responds to operative friction motion related to the workpiece surface being finished (or material contained therein) in a manner expressible by a mathematical equation is preferred. Reference Numeral 94 represents an optional insulating material contained in the friction sensor probe body to improve accuracy of measurement of temperature changes and to reduce heat losses. Reference Numeral 96 represents a non-optical friction sensor which in this particular embodiment is a thermocouple. A thermocouple is a preferred example of a non-optical friction sensor. Reference Numeral 98 represents an thermal adjustment port can be used to adjust the temperature upwards or downwards. A thermal adjustment port for feeding fluid cooling medium is preferred and feeding a gas cooling medium is especially preferred. The optional cooling port is useful to change and more particularly to decrease the temperature rapidly and economically between workpieces being finished.

Some preferred embodiments for the friction sensor element and its friction sensor surface will now be discussed further. A friction sensor element for the friction sensor probe can be an integral member of the friction sensor probe body. This is an example of a preferred permanent friction sensor element attachment to the friction sensor surface. A replaceable friction sensor element is preferred for a number of applications because it can lower the cost of finishing the workpieces. The replaceable friction sensor element is preferably attached to the friction sensor probe body. A preferred example of a replaceable friction sensor element is a temporary friction sensor element. A temporary attachment mechanism attaching the replaceable friction sensor element to the friction sensor probe body is one preferred attachment mechanism. A preferred replaceable friction sensor element can be attached to the friction sensor body with a temporary adhesive mechanism or a temporary mechanical attachment mechanism. A preferred temporary mechanical attachment mechanism is a mechanism selected from the group consisting of a friction fit mechanism, a snap fit mechanism, and a cam lock mechanism. The friction sensor element can be adhered to the friction sensor probe body, snap fit in the friction body, and/or friction fit in the friction sensor probe body. A preferred temporary adhesive mechanism includes a temporary adhesive coating, temporary adhesive surface, and a temporary adhesive tape. A permanently attached friction sensor element can also be preferred for some applications. These friction sensor probes can easily be replaced as a unit and thus reduce operator time for changes. A permanently attached friction sensor surface can be permanently adhered to the friction sensor body, molded into the friction sensor body, or permanently mechanically attached to the friction sensor body. An abrasion resistant friction sensor surface is often preferred because they last longer in service.

Different friction sensor surfaces are preferred for different finishing applications. A friction sensor surface that responds in a similar manner to friction as the workpiece surface or a region of the workpiece surface is often preferred. A preferred workpiece is a heterogeneous semiconductor wafer surface having conductive regions and non-conductive regions. Semiconductor wafer surfaces having a heterogeneous semiconductor wafer surface needed finishing, particularly planarized, are generally well known to those skilled in the semiconductor arts. A quartz friction sensor surface is preferred because it is low cost and is substantially abrasion resistant. A quartz friction sensor surface is often a low cost material that approximates a non conductive region proximate to the surface of the heterogeneous semiconductor wafer during finishing. A friction sensor surface comprising a silicon dioxide composition is a preferred friction sensor surface. A non conductive friction sensor surface can be preferred for some finishing applications, particularly where the workpiece has a non conductive region being finished. A friction sensor surface comprised of a metal is often preferred. A friction sensor surface comprising an aluminum composition is a preferred friction sensor surface. A friction sensor surface comprising a tungsten composition is a preferred friction sensor surface. A friction sensor surface comprising a copper composition is a preferred friction sensor surface. A friction sensor surface comprising a conductive composition is a preferred friction sensor surface, particularly where the workpiece has conductive regions being finished. A friction sensor surface comprising a synthetic polymeric composition is a preferred friction sensor surface. A friction sensor surface comprising a material having a fibrous filler is a preferred friction sensor surface. A friction sensor surface comprising a synthetic polymeric composition having a fibrous filler is a preferred friction sensor surface. A friction sensor surface comprising a surface having microasperities is a preferred friction sensor surface. A friction sensor surface comprising a surface having attached particles is a preferred friction sensor surface and a friction sensor surface comprising a surface having attached abrasion resistant particles is a more preferred friction sensor surface. Particles having a hardness of greater than the finishing element finishing surface can be preferred for some applications, particularly those applications having an abrasive free finishing composition. Silica particles are an example of preferred abrasion resistant particles and colloidal silica is a more preferred example of abrasion resistant particles. A friction sensor surface having particles having a hardness of greater than any abrasive particles in the finishing composition is particularly preferred for finishing wherein a finishing or alternate finishing composition contains finishing composition abrasive particles. A friction sensor surface having a hardness of greater than the finishing element finishing surface can be preferred for some applications, particularly those applications having an abrasive free finishing composition. Particles are preferably quite small. A friction sensor surface comprising a surface having microasperities to simulate a workpiece surface before finishing is a preferred friction sensor surface. A friction sensor surface comprising a surface having microasperities which sense changes to the finishing element finishing surface is a preferred friction sensor surface. A friction sensor surface comprising a surface having microasperities which sense changes to finishing element finishing surface wear is a preferred friction sensor surface. A friction sensor surface having similar characteristics such as friction or roughness to materials proximate to the surface of the workpiece is preferred. Each of these preferred friction sensor surfaces detect friction which is related to finishing of a workpiece and provides useful information for controlling the finishing of a workpiece.

A single friction sensor probe having at least one friction sensor is preferred and a single friction sensor probe having at least two friction sensors is more preferred for some applications. A single friction sensor probe having at least one friction sensor surface is preferred and a single friction sensor probe having at least two friction sensor surfaces is more preferred for some applications. A single friction sensor surface having at least one proximate friction sensor is preferred and a single friction sensor surface having at least two proximate friction sensors is more preferred for some applications. Multiple friction sensors can improve precision of the measurements (for instance in different temperature regions) and multiple friction surfaces per friction sensor probe body can sometimes reduce costs by eliminating multiple friction sensor probe bodies where only one is needed for the specific application. As an example one friction sensor surface can best measure the friction of the finishing element finishing surface while the other might best measure the friction of a region in the operative finishing interface.

Figure 5:
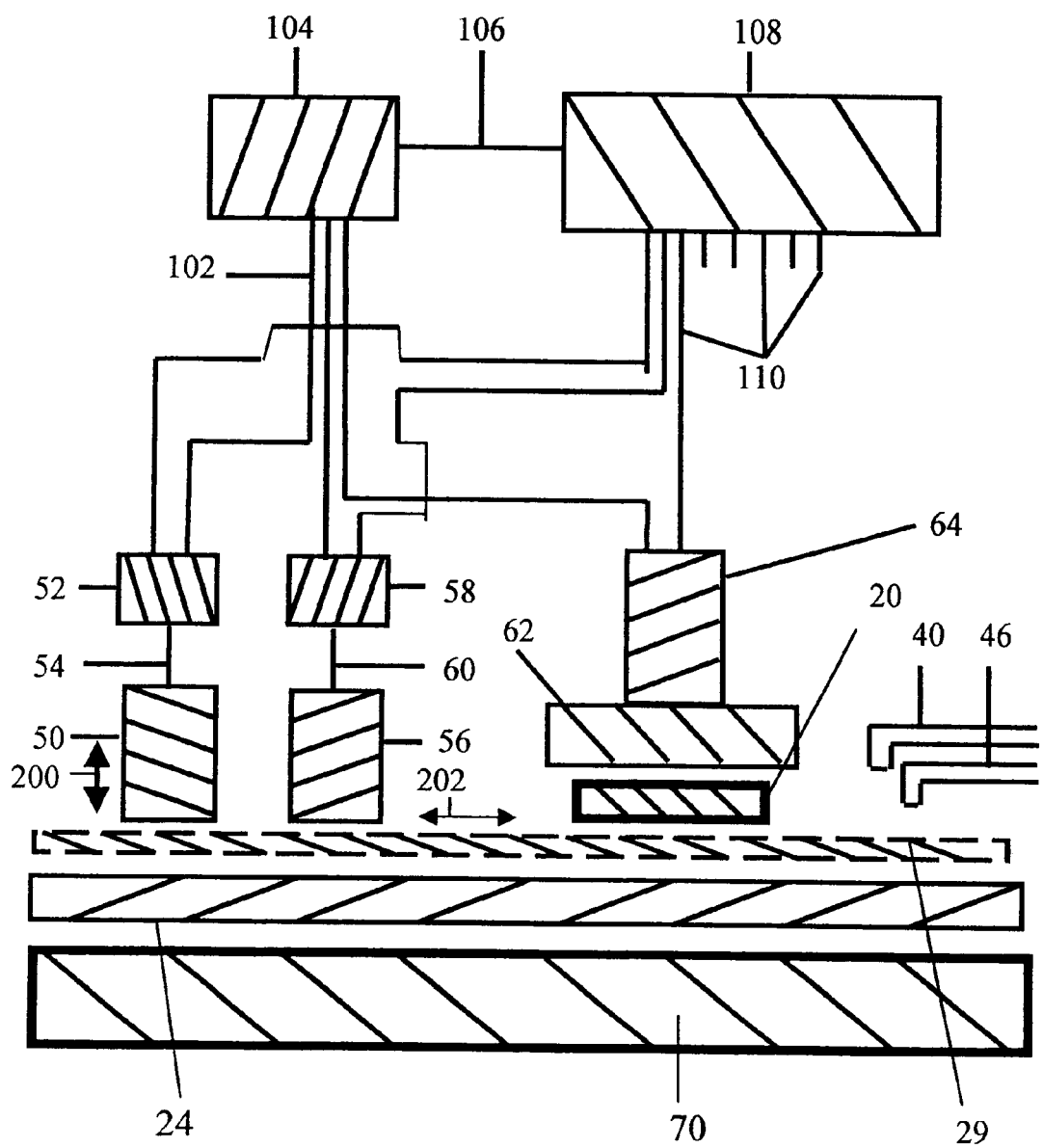
FIG. 5 is a artist's simplified view the some major components in a finishing sensor subsystem of a preferred embodiment of this invention.

FIG. 5 is a artist's drawing of the some of the objects and their interconnections in a preferred embodiment of the invention. Reference Numeral 20 represents the workpiece being finished. Reference Numeral 24 represents the finishing element. Reference Numeral 29 represents the finishing composition and, optionally, the alternate finishing composition. Reference Numeral 40 represents the feed line for the finishing composition. Reference Numeral 46 represents the feed line for the alternate finishing composition. Reference Numeral 50 represents the first friction sensor probe. Reference numeral 52 represents an optional drive mechanism such as a motor or vibrating transducer for the first friction sensor probe. Reference Numeral 54 represents the operative connection between the first friction sensor probe and the drive mechanism. Reference Numeral 56 represents the second friction sensor probe. Reference Numeral 200 represents a perpendicular force applied to the interface between the friction sensor probe and the finishing element finishing surface. Reference Numeral 202 represents a parallel motion in the interface between the friction sensor probe and the finishing element finishing surface. Reference Numeral 200 and Reference Numeral 202 are preferred operative friction sensor probe interface motions. Reference numeral 58 represents an optional drive mechanism such as a motor or vibrating transducer for the second friction sensor probe. Reference Numeral 60 represents the operative connection between the second friction sensor probe and the drive mechanism. Reference Numeral 62 represents the carrier for the workpiece. Reference Numeral 64 represents the drive motor carrier for the carrier. Reference Numeral 70 represents the platen. Reference Numeral 102 represents preferred operative sensor connections from the first friction sensor probe, second friction sensor probe, and workpiece finishing assembly to the processor (Reference Numeral 104). Preferably the sensor connections are electrical connections. A data processor is a preferred processor and a electronic data processor is a more preferred data processor and a computer is a even more preferred processor. The processor (Reference Numeral 104) is preferably connected a controller (Reference Numeral 108) with an operative processor to controller connection(s) represented by Reference Numeral 106. The controller is preferably in operative controlling connection (Reference Numeral 110) with the first friction sensor probe, the second friction sensor probe, and the workpiece finishing sensor subsystem and can adjust finishing control parameters during finishing the workpiece. An operative electrical connection is a preferred operative connection. An operative electromagnetic wave system such as operative infrared communication connections is another preferred operative connection. The controller can also adjust the operating friction probe control parameters such as, but not limited to, pressure exerted against the finishing element finishing surface and the friction probe friction sensor surface and related relative friction motion between the finishing element finishing surface and the friction probe friction sensor surface such as relative parallel motion. Preferred finishing control parameters are discussed elsewhere herein.

A finishing element finishing surface tends to have a higher friction than necessary with the workpiece being finished. The higher friction can lead to higher than necessary energy for finishing. The higher friction can lead to destructive surface forces on the workpiece surface being finished and on the finishing element finishing surface which can cause deleterious surface damage to the workpiece. The higher friction can lead to premature wear on the finishing element and even to the abrasive slurry particle wear. This premature wear on the finishing element and abrasive slurry particles can unnecessarily increase the cost of finishing a workpiece. Further, this higher than necessary friction can lead to higher than necessary changes in performance of the finishing element finishing surface during the finishing of a plurality of workpieces which makes process control more difficult and/or complex. Applicant currently believes that the higher than desirable defects in the workpiece surface being finished can at least partially be due to the fact that the abrasive particles in slurries although generally free to move about can become trapped in an elastomeric finishing element surface thus preventing rolling action and leading to a more fixed scratching type action. Further fixed abrasive finishing element surfaces can also scratch or damage of sensitive workpiece surface. Further, abrasive slurry particles which are not lubricated can tend to become dull or less effective at finishing the workpiece surface being finished which can reduce their effectiveness during finishing. Current CMP slurries are generally complex chemical slurries and applicant has found confidentially the addition of some new chemicals, such as lubricants, can cause instability over time, precipitation of the abrasive particulates and/or agglomeration of the abrasive particulates to form large particles which can cause unwanted scratching to the workpiece surface being finished. Further, precipitation and/ or agglomeration of the abrasive slurry particulates can have an adverse impact on the economical recycling of slurry for finishing workpiece surfaces by forming the larger particulates which either are not recycled or must be reprocessed at an increased expense to decrease their size to be within specification. Each of the above situations can lead to less than desirable surface quality on the workpiece surface being finished, higher than desirable manufacturing costs, and earlier than necessary wear on the expensive finishing element finishing surface. Applicant currently believes that proper choice of a lubricant supplied to the interface between the finishing surface and the workpiece surface being finished can help reduce or eliminate damage to the workpiece surface being finished and also generally help to reduce workpiece finishing manufacturing costs. Applicant currently believes that proper choice and supply of a lubricant from the finishing element to the interface of the workpiece surface being finished and the finishing element finishing surface can reduce or eliminate the negative effects of high friction such as chatter. Applicant currently believes that proper choice and supply of a lubricant to the interface of the workpiece surface being finished and the finishing element finishing surface can extend the useful life of the finishing element finishing surface by reducing erosive and other wear forces. The lubricant can help to maintain the desirable "cutting ability" of the abrasive slurry particles. The lubricant when transferred from the finishing element finishing surface to the interface between the workpiece being finished and the finishing element finishing surface can help reduce the instability of the abrasive slurry particulates to lubricants. Transferring the lubricant at the point of use from the finishing element finishing surface can reduce or prevent negative interactions between the finishing composition or lubricant (and optional abrasive slurry particles therein). Supplying the lubricant from the finishing element finishing surface can further reduce the of chatter, micro localized distortions in the finishing element finishing surface, and also increases the uniformity of finishing across the surface of the workpiece surface being finished. Preferably the lubricant is dispersed proximate to the finishing element finishing surface and more preferably, the lubricant is dispersed substantially uniformly proximate to the finishing element finishing surface. Lubrication reduces the friction which reduces adverse forces particularly on a high speed belt finishing element which under high friction can cause belt chatter, localized belt stretching, and/or belt distortions, high tendency to scratch and/or damage workpiece surface being finished. Localized and or micro localized distortions to the surface of a finishing element and chatter can also occur with other finishing motions and/ elements and can help to reduce or eliminate these.

Supplying of a lubricant from the finishing element finishing surface to the interface of the workpiece surface being finished and the finishing element finishing surface reduces or destroys the effectiveness of current in situ friction measurement feedback systems known in CMP. Particularly troublesome is changes in friction during finishing due to changes in type or amount of lubricant. Current known systems, quite simply, have no effective feedback loop to deal with these changes. By having at least one friction sensor probe to measure the change in friction due to changes in lubricating and/or finishing conditions while also having a friction sensor probe to monitor the progress of finishing on the finishing element finishing surface, effective feedback for finishing of workpieces one can accomplish effective in situ control of finishing. By having at least two friction sensor probes to measure the changes in friction due to changes in lubricating and/or finishing conditions whilst also having a feedback subsystem to monitor the progress of finishing on the workpieces one can more effectively accomplish in situ control of finishing. Thus one can more effectively control, preferably in situ, finishing during changes in lubricant changes such as composition, concentration, or operating condition changes such as applied pressure or operative finishing motion changes.

Supplying an organic boundary lubricant to the operative finishing interface (located between finishing element finishing surface and the workpiece surface being finished) can further reduce the of chatter, micro localized distortions in the finishing element finishing surface, and also increases the uniformity of finishing across the surface of the workpiece surface being finished. Forming the lubricating boundary layer differentially can improve local planarity and enhance finishing flexibility as discussed herein. Lubrication reduces abrasive wear to the abrasive particles and to the finishing element finishing surface by reducing friction forces. Differential boundary lubrication can enhance localized finishing rates to improve the semiconductor wafer surface. Supply of a thin lubricating boundary layer is particularly preferred. An effective amount of boundary lubricant often can help meeting a plurality of these advantages simultaneously.

The semiconductor industry is in a relentless journey to increase computing power and decrease costs. Finishing of a semiconductor wafer using in situ calculations of cost of manufacture parameters to improve control finishing parameters can help simultaneously to decrease cost and reduce unwanted defects. Using current cost of manufacture parameters along with a friction sensing method to evaluate and adjust the boundary layer lubrication in a manner that adjustably controls the coefficient of friction in the operative finishing interface can be particularly effective at reducing unwanted surface defects such as microscratches and microchatter. This system is particularly preferred for finishing with fixed abrasive finishing elements. In addition generally helping to improve such parameters as equipment yield, parametric yield, and defect density, the "cuttability" or cut rate of the fixed abrasive finishing element can generally be extended which improves uptime or equipment utilization. The coefficient of friction in the operative finishing interface can change any number of times during a relatively short finishing cycle time making manual calculations ineffective. Further, the semiconductor wafer cost of manufacture parameters are relatively complex to calculate and the finishing process is relatively short thus manual calculations for equipment adjustment and control are even more difficult and ineffective. Rapid, multiple adjustments of process control parameters using process sensors operatively connected to a processor with access to cost of manufacture parameters are particularly preferred for the rapid in situ process control of this invention which helps to increase computing power in the finished semiconductor wafer and decrease manufacturing costs. Thus one can more effectively control, preferably in situ, finishing during changes in lubricating aid changes (like composition, concentration, or operating condition changes) and as applied pressure or operative finishing motion changes by using the systems taught herein. Optimizing the cost of manufacture during real time with preferred operative friction sensor(s) information and useful cost of manufacture information such as current cost of manufacture information, preferably derived from individual and/or semiconductor wafer cost tracking information during manufacture, can aid in reducing costs on this relentless journey. Control of the coefficient of friction in the operative finishing interface is particularly useful and effective to help reduce unwanted surface defects, preferably when combined with real time cost of manufacture information, information processing capability, and real time finishing control capability.

The new problem recognition of this invention and unique solution including, but not limited to, the new friction sensor subsystems, finishing sensor subsystems, use of cost of manufacture parameters for in situ process control, and the new finishing method of operation disclosed herein are considered part of the invention.

Finishing Element

A finishing element having a synthetic polymeric body is preferred. A synthetic polymeric body comprising at least one material selected from the group consisting of an organic synthetic polymer, an inorganic polymer, and combinations thereof is preferred. A preferred example of organic synthetic polymer is an thermoplastic polymer. Another preferred example of an organic synthetic polymer is a thermoset polymer. An organic synthetic polymeric body comprising organic synthetic polymers including materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl polymers, polybutadienes, polyisoprenes, EPDM elastomers, and styrene butadiene elastomers is preferred. Preferred stiff finishing surfaces can comprise polyphenylene sulfide, polysulfone, and polyphenylene oxide resins. Phenolic resins can also be used. Polyolefin polymers are particularly preferred for their generally low cost. A preferred polyolefin polymer is polyethylene. Another preferred polyolefin polymer is a propylene polymer. Another preferred polyolefin polymer is a ethylene propylene copolymer. Copolymer organic synthetic polymers are also preferred. Polyurethanes are preferred for their inherent flexibility in formulations. A finishing element comprising a foamed organic synthetic polymer is particularly preferred because of their flexibility and ability to transport the finishing composition. A finishing element comprising a foamed polyurethane polymer is particularly preferred. Foaming agents and processes to foam organic synthetic polymers are generally known in the art. A finishing element comprising a compressible porous material is preferred and comprising a organic synthetic polymer of a compressible porous material is more preferred.

A finishing element having a body element comprising a mixture of a plurality of organic synthetic polymers can be particularly tough, wear resistant, and useful. An organic synthetic polymeric body comprising a plurality of organic synthetic polymers and wherein the major component is selected from materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl polymers, polybutadienes, polyisoprenes, EPDM elastomers, and styrene butadiene elastomers is preferred. Preferred stiff finishing surfaces can comprise polyphenylene sulfide, polysulfone, and polyphenylene oxide resins. Phenolic resins can also be used. The minor component is preferably also an organic synthetic polymer and is preferably a modifying and/or toughening agent. A preferred example of an organic synthetic polymer modifier is a material which reduces the hardness or flex modulus of the finishing element body such an polymeric elastomer. A compatibilizing agent can also be used to improve the physical properties of the polymeric mixture. Compatibilizing agents are often also synthetic polymers and have polar and/or reactive functional groups such as carboxylic acid, maleic anhydride, and epoxy groups. Organic synthetic polymers of the above descriptions are generally available commercially. Illustrative nonlimiting examples of commercial suppliers of organic synthetic polymers include Exxon Co., Dow Chemical, Sumitomo Chemical, and BASF.

A finishing element comprising a synthetic polymer composition having a plurality of layers is also preferred. A finishing element comprising at least one layer of a soft synthetic polymer is preferred. A finishing element comprising at least one layer of a elastomeric synthetic polymer is preferred. A finishing element comprising at least one layer of a thermoset elastomeric synthetic polymer is preferred.

Further illustrative nonlimiting examples of preferred finishing elements for use in the invention are also discussed. A finishing element having at least a layer of an elastomeric material having a Shore A hardness of at least 30 A is preferred. ASTM D 676 is used to measure hardness. A porous finishing element is preferred to more effectively transfer the polishing slurry to the surface of the workpiece being finished. A finishing element comprising a synthetic resin material is preferred. A finishing element comprising a thermoset resin material is more preferred. A finishing element having layers of different compositions is preferred to improve the operative finishing motion on the workpiece surface being finished. As an example, a finishing element having two layers, one a hard layer and one a soft layer, can better transfer the energy of operative finishing motion to the workpiece surface being finished than a similar thickness finishing element of only a very soft layer. A thermoset synthetic resin is less prone to elastic flow and thus is more stable in this application. A finishing element which is thin is preferred because it generally transfers the operative finishing motion to the workpiece surface being finished more efficiently. A finishing element having a thickness from 0.5 to 0.002 cm is preferred and a thickness from 0.3 to 0.005 cm is more preferred and a finishing element having a thickness from 0.2 to 0.01 cm is even more preferred. Current synthetic resin materials can be made quite thin now. The minimum thickness will be determined by the finishing element's integrity and longevity during polishing which will depend on such parameters as tensile and tear strength. A finishing element having sufficient strength and tear strength for chemical mechanical finishing is preferred.

An finishing element having a flex modulus in particular ranges is also preferred. An finishing element having a high flex modulus is generally more efficient for planarizing. An finishing element having a low flex modulus is generally more efficient for polishing. Further a continuous belt finishing element can have a different optimum flex modulus than a finishing element disk. One also needs to consider the workpiece surface to be finished in selecting the flex modulus. A finishing element comprising a synthetic resin having flex modulus of at most 1,000,000 psi is preferred and having flex modulus of at most 800,000 psi is more preferred and 500,000 psi is more preferred. Pounds per square in is psi. Flex modulus is preferably measured with ASTM 790 B at 73 degrees Fahrenheit. Finishing elements comprising a synthetic resin having a very low flex modulus are also generally known to those skilled in the art such as elastomeric polyurethanes which can also be used. A finishing element having a flex modulus of greater than 1,000,000 psi can be preferred for some particular planarizing applications. When finishing lubricated interfaces between the finishing element finishing surface and the workpiece being finished, generally a higher flex modulus and/or harder finishing element can be used because abrasive scratching is often reduced.

For some embodiments, polishing pad designs and equipment such as in U.S. Pat. No. 5,702,290 to Leach, a polishing pad having a high flexural modulus can be effective and preferred. A finishing element having a continuous phase of material imparting resistance to local flexing is preferred. A preferred continuous phase of material is a synthetic polymer, more preferably an organic synthetic polymer. An organic synthetic polymer having a flexural modulus of at least 50,000 psi is preferred and having a flexural modulus of at least 100,000 psi is more preferred and having a flexural modulus of at least 200,000 psi is even more preferred for the continuous phase of synthetic polymer in the finishing element. An organic synthetic polymer having a flexural modulus of at most 5,000,000 psi is preferred and having a flexural modulus of at most 3,000,000 psi is more preferred and having a flexural modulus of at most 2,000,000 psi is even more preferred for the continuous phase of synthetic polymer in the finishing element. An organic synthetic polymer having a flexural modulus of from 5,000,000 to 50,000 psi is preferred and having a flexural modulus of from 3,000,000 to 100,000 psi is more preferred and having a flexural modulus of at from 2,000,000 to 200,000 psi is even more preferred for the continuous phase of synthetic polymer in the finishing element. For some less demanding applications (such as die with a lower pattern density), a flexural modulus of at least 20,000 psi is preferred. These ranges of flexural modulus for the synthetic polymers provide useful performance for finishing a semiconductor wafer and can improve local planarity in the semiconductor. Flexural modulus is preferably measured with ASTM 790 B at 73 degrees Fahrenheit. Pounds per square inch is psi.

A finishing element having Young's modulus in particular ranges is also preferred. A finishing element having a high Young's modulus is generally more efficient for planarizing. A finishing element having a low Young's modulus is generally more efficient for polishing. Further a continuous belt finishing element can have a different optimum Young's modulus than a finishing element disk. One also needs to consider the workpiece surface to be finished in selecting the Young's modulus. For a flexible finishing element having a Young's modulus from 100 to 700,000 psi (pounds per square in inch) is preferred and having a Young's modulus from 300 to 200,000 psi (pounds per square in inch) is more preferred and having a Young's modulus from 300 to 150,000 psi (pounds per square in inch) is even more preferred. Particularly stiff finishing elements can have a preferred Young's modulus of at least 700,000 psi. For particularly flexible finishing elements, a Young's modulus of less than 100,000 psi are preferred and less than 50,000 psi is more preferred.

A reinforcing layer or member can also be included with or attached to the finishing element finishing body. A finishing element having a finishing body connected to a reinforcing layer is preferred and a finishing element having a finishing body integral with a reinforcing layer is more preferred. Preferred nonlimiting examples of reinforcing layers or members are fabrics, woven fabrics, film layers, and long fiber reinforcement members. A continuous belt can have substantially continuous fibers therein. Aramid fibers are particularly preferred for their low stretch and excellent strength. The reinforcing layers can be attached with illustrative generally known adhesives and various generally known thermal processes such as extrusion coating or bonding.

Fixed abrasive finishing elements are known for polishing. Illustrative nonlimiting examples of fixed abrasive polishing elements include U.S. Pat. No. 4,966,245 to Callinan, U.S. Pat. No. 5,624,303 to Robinson, U.S. Pat. No. 5,692,950 to Rutherford et. al., U.S. Pat. No. 5,823,855 to Robinson and these patents are included herein by reference in their entirety for guidance and modification as appropriate by those skilled in the art. Also included by reference are the confidential patent applications filed on the same date as this application with private serial number 2FASL11499 and title "Method of finishing with a fixed abrasive finishing element having finishing aids" and application with private serial number 3FALL11499 titled "Fixed abrasive finishing method using lubricants for electronics." Fixed abrasive finishing elements having abrasive particles can be preferred. Inorganic abrasive particles comprise preferred abrasive particles. Organic synthetic particles comprise preferred abrasive particles. A fixed abrasive finishing element having abrasive asperities on the finishing surface is a preferred fixed abrasive finishing element. Abrasive particles can be dispersed in the finishing element to make a low cost abrasive finishing element. Abrasive asperities can be molded into a finishing element surface with low cost and at high speed making them preferred for some applications.

Figure 6A:
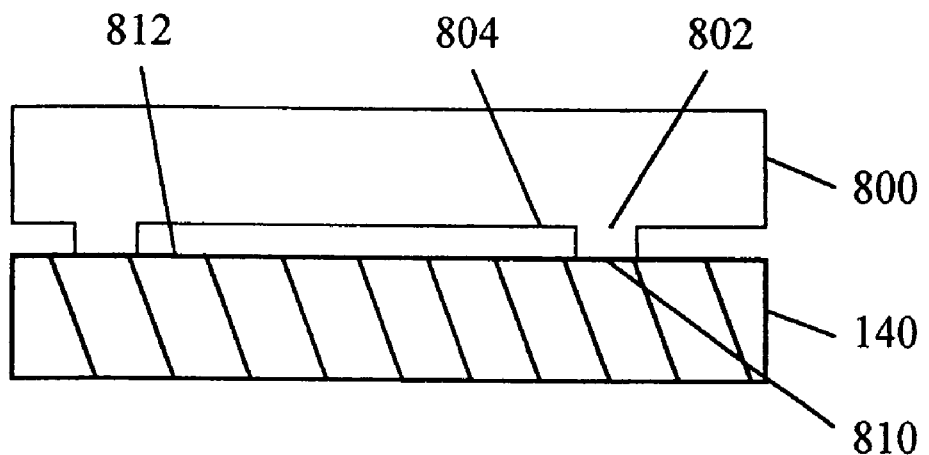
FIG. 6 is an artist's representation of finishing some unwanted raised regions and some regions below the unwanted raised regions with differential boundary lubrication.
Figure 6B:
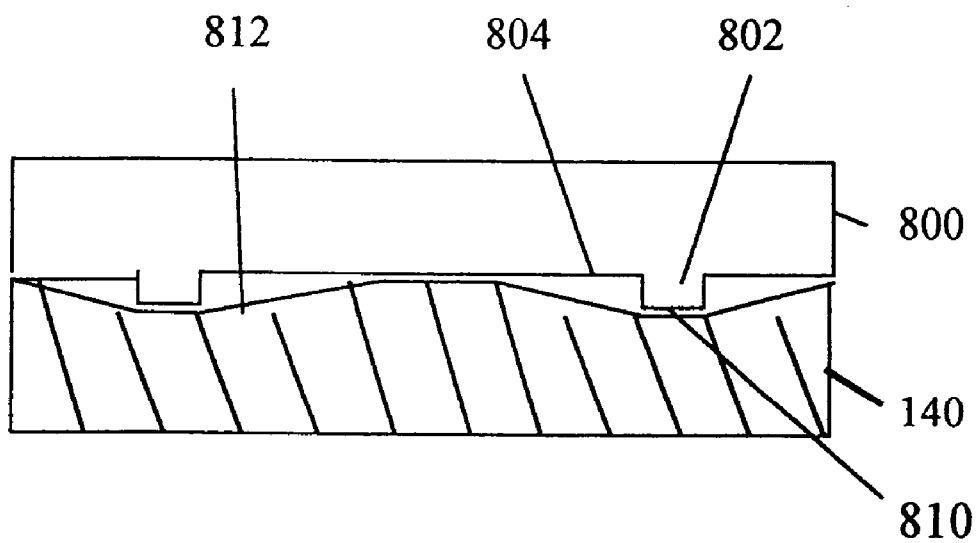

FIG. 6 is an artist's representation of finishing some unwanted raised regions and some regions below the unwanted raised regions. Reference Numeral 800 represents a portion of a semiconductor wafer surface having two unwanted raised regions. Reference Numeral 802 represent unwanted raised regions on the semiconductor surface being finished. Reference Numeral 804 represent lower local regions on the semiconductor surface being finished proximate to the unwanted raised regions. Reference Numeral 810 represents the finishing element finishing surface in local contact with the unwanted raised regions (Reference Numeral 802). Reference Numeral 812 represents the finishing element surface local region displaced from but proximate to and lower than the unwanted raised local regions. As shown the finishing element finishing surface can reduce pressure and/or lose actual contact with the lower local regions on the semiconductor proximate to the unwanted raised local regions. This leads to unwanted raised regions having higher pressure which in turn can reduce the lubricating boundary layer thickness in the unwanted raised regions. Reducing the lubricating boundary layer thickness generally increases local tangential friction forces, raises the finishing rate measured in angstroms per minute on the unwanted raised regions. Also the pressure in lower regions proximate the unwanted raised regions have lower pressure applied which in turn can increase lubricating boundary layer thickness in these lower regions. Increasing the lubricating boundary layer thickness generally decreases local tangential forces lowering the finishing rate measured in angstroms per minute in these lower regions proximate the unwanted raised regions. By increasing finishing rate in the unwanted raised regions and lowering the finishing rate in the proximate lower regions the planarity of the semiconductor is generally improved. This generally helps the unwanted raised regions to have higher finishing rates when measured in angstroms per minute and improves within die nonuniformity. As shown in the FIG. 6, the region of contact with the unwanted raised region is small which in turn raises the finishing pressure applied by the finishing elements having a higher flexural modulus and this increased pressure increases the finishing rate measured in angstroms per minute at the unwanted raised region. This higher pressure on the unwanted raised region also increases frictional heat which can further increase finishing rate measured in angstroms per minute in the unwanted raised region. Boundary lubrication on the unwanted raised region can be reduced due to the higher temperature and/or pressure which further increases friction and finishing rate measured in angstroms per minute. Higher stiffness finishing element finishing surfaces apply higher pressures to the unwanted raised local regions which can further improve planarization, finishing rates, and within die nonuniformity. Finishing using finishing elements of this in invention wherein the unwanted raised regions have a finishing rate measured in angstroms per minute of at least 1.6 times faster than in the proximate low local region measured in angstroms per minute is preferred and wherein the unwanted raised regions have a finishing rate of at least 2 times faster than in the proximate low local region is more preferred and wherein the unwanted raised regions have a finishing rate of at least 4 times faster than in the proximate low local region is even more preferred. Where there is no contact with the proximate low local region, the finishing rate in the low local region can be very small and thus the ratio between the finishing rate in the unwanted raised region to finishing rate in the low local region can be large. Using boundary lubrication control methods of this in invention wherein the unwanted raised regions have a finishing rate measured in angstroms per minute of from 1.6 to 500 times faster than in the proximate low local region measured in angstroms per minute is preferred and wherein the unwanted raised regions have a finishing rate of from 2 to 300 times faster than in the proximate low local region is more preferred and wherein the unwanted raised regions have a finishing rate of from 2 to 200 times faster than in the proximate low local region is even more preferred and wherein the unwanted raised regions have a finishing rate of from 4 to 200 times faster than in the proximate low local region is even more preferred.

By increasing the stiffness of the finishing element finishing surface, the pressure applied to the unwanted raised region can be increased. Flexural modulus as measured by ASTM 790 B at 73 degrees Fahrenheit is a useful guide to help raise the stiffness of a polymer finishing element. By adjusting the flexural modulus as measured by ASTM 790 B at 73 degrees Fahrenheit the pressure can be increased on the unwanted raised regions to increase finishing rates measured in Angstroms per minute. Applying at least two times higher pressure to the unwanted raised region when compared to the applied pressure in a lower region proximate unwanted raised region is preferred and applying at least three times higher pressure to the unwanted raised region when compared to the applied pressure in a lower region proximate unwanted raised region is more preferred and applying five times higher pressure to the unwanted raised region when compared to the applied pressure in a lower region proximate unwanted raised region is even more preferred. Because the lower region proximate the unwanted raised region can have a very low pressure, at most 100 times higher pressure in the unwanted raised regions compared to the pressure in a lower region proximate the unwanted raised region is preferred and at most 50 times higher pressure in the unwanted raised regions compared to the pressure in a lower region proximate the unwanted raised region is more preferred. By adjusting the flexural modulus of the finishing element finishing surface, lubricating boundary layer, and the other control parameters discussed herein, finishing and planarization of semiconductor wafer surfaces can be accomplished. The lubricating boundary layer will now be illustrated in FIG. 7.

Figure 7:
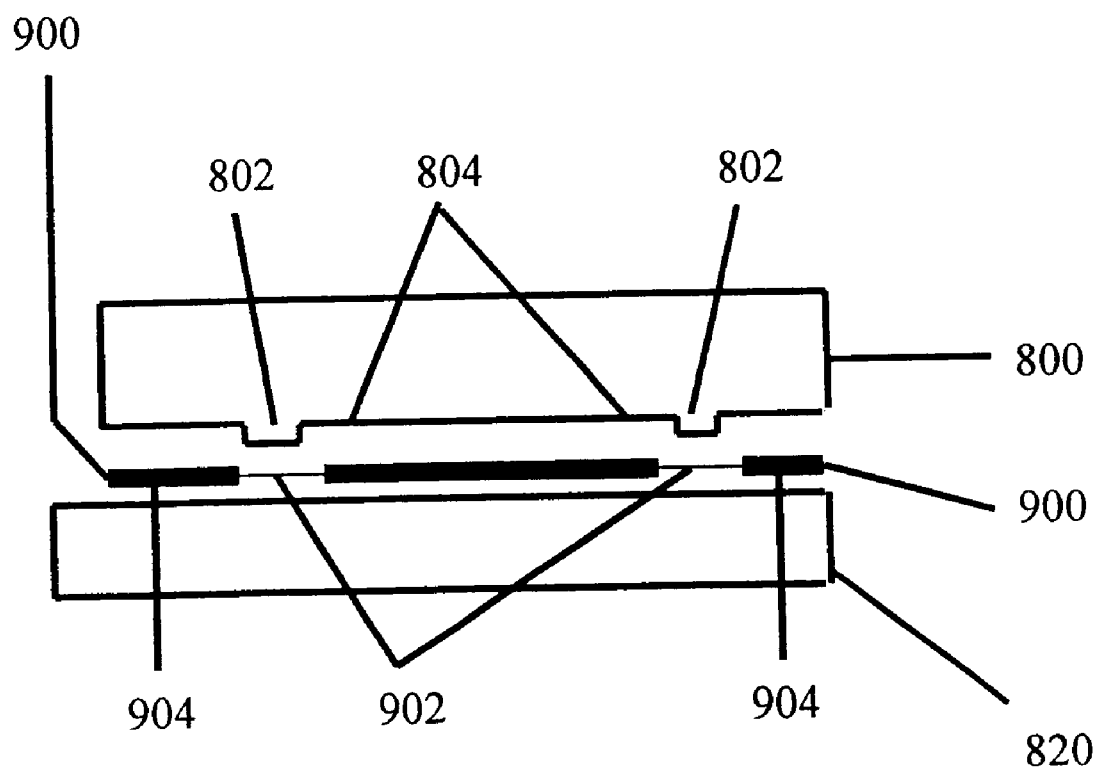
FIG. 7 is an artist's representation of an example of the effects on the boundary layer lubrication.

FIG. 7 is an artist's representation of an example of the effects on the boundary layer lubrication discussed herein above. As discussed herein, it is not drawn to scale so the boundary layer thickness can be illustrated in simple fashion for helpful guidance. Reference Numeral 800 represents a cross-sectional view of a semiconductor wafer having two unwanted raised regions (Reference Numeral 802). Reference Numeral 804 represents a cross-sectional view of a semiconductor wafer having lower regions proximate to the two unwanted raised regions (Reference Numeral 802). Reference Numeral 900 represents the lubricating boundary layer. Reference Numeral 902 represents thinner regions of lubricating boundary layer (for instance having a thickness of 4 molecules). Note that the thinner regions of a lubricating boundary layer can occur proximate the unwanted raised regions on the semiconductor wafer surface being finished. Reference Numeral 904 represents a thicker region of lubricating boundary layer which can generally occur in regions proximate to and below the unwanted raised regions. Reference Numeral 820 represents a small cross-section of finishing element. The different local regions having different lubricating boundary layers and lubricating properties is referred to herein as differential boundary lubrication. Differential boundary lubrication can improve planarization for some semiconductor wafers (particularly at the die level).

Stabilizing Fillers for Finishing Element

A fibrous filler is a preferred stabilizing filler for the finishing elements of this invention. A plurality of synthetic fibers are particularly preferred fibrous filler. Fibrous fillers tend to help generate a lower abrasion coefficient and/or stabilize the finishing element finishing surface from excessive wear. By reducing wear, the finishing element has improved stability during finishing.

A preferred stabilizing filler is a dispersion of fibrous filler material dispersed in the finishing element body. Organic synthetic resin fibers are a preferred fibrous filler. Preferred fibrous fillers include fibers selected from the group consisting of aramid fibers, polyester fibers, and polyamide fibers. Preferably the fibers have a fiber diameter of from 1 to 15 microns and more preferably, from 1 to 8 microns. Preferably the fibers have a length of less than 1 cm and more preferably a length from 0.1 to 0.6 cm and even more preferably a length from 0.1 to 0.3 cm. Particularly preferred are short organic synthetic resin fibers that can be dispersed in the finishing element and more preferably mechanically dispersed in at least a portion of the finishing element proximate to the finishing element finishing surface and more preferably, mechanically substantially uniformly dispersed in at least a portion of the finishing element proximate to the finishing element finishing surface and even more preferably, mechanically substantially uniformly dispersed in at least a portion of the finishing element proximate to the finishing element finishing surface. The short organic synthetic fibers are added in the form of short fibers substantially free of entanglement and dispersed in the finishing element matrix. Preferably, the short organic synthetic fibers comprise fibers of at most 0.6 cm long and more preferably 0.3 cm long. An aromatic polyamide fiber is particularly preferred. Aromatic polyamide fibers are available under the trade names of "Kevlar" from DuPont in Wilmington, Del. and "Teijin Cornex" from Teijin Co. Ltd. The organic synthetic resin fibers can be dispersed in the synthetic by methods generally known to those skilled in the art. As a nonlimiting example, the cut fibers can be dispersed in a thermoplastic synthetic resin particles of under 20 mesh, dried, and then compounded in a twin screw, counter rotating extruder to form extruded pellets having a size of from 0.2–0.3 cm. Optionally, the pellets can be water cooled, as appropriate. These newly formed thermoplastic pellets having substantially uniform discrete, dispersed, and unconnected fibers can be used to extruded or injection mold a finishing element of this invention. Aramid powder can also be used to stabilize the finishing element organic synthetic polymeric resins to wear. Organic synthetic resin fibers are preferred because they tend to reduce unwanted scratching to the workpiece surface.

U.S. Pat. No. 4,877,813 to Jimmo, U.S. Pat. No. 5,079,289 to Takeshi et. al., and U.S. Pat. No. 5,523,352 to Janssen are included herein by reference in its entirety for general guidance and appropriate modification by those skilled in the art.

Workpiece

A workpiece needing finishing is preferred. A homogeneous surface composition is a workpiece surface having one composition throughout and is preferred for some applications. A workpiece needing polishing is preferred. A workpiece needing planarizing is especially preferred. A workpiece having a microelectronic surface is preferred. A workpiece surface having a heterogeneous surface composition is preferred. A heterogeneous surface composition has different regions with different compositions on the surface, further the heterogeneous composition can change with the distance from the surface. Thus finishing can be used for a single workpiece whose surface composition changes as the finishing process progresses. A workpiece having a microelectronic surface having both conductive regions and non-conductive regions is more preferred and is an example of a preferred heterogeneous workpiece surface. Illustrative examples of conductive regions can be regions having copper or tungsten and other known conductors, especially metallic conductors. Metallic conductive regions in the workpiece surface including metals selected from the group consisting of copper, aluminum, and tungsten or combinations thereof are particularly preferred. A semiconductor device is a preferred workpiece. A substrate wafer is a preferred workpiece. A semiconductor wafer having a polymeric layer requiring finishing is preferred because a lubricant can be particularly helpful in reducing unwanted surface damage to the softer polymeric surfaces. An example of a preferred polymer is a polyimide. Polyimide polymers are commercially available from E. I. DuPont Co. in Wilmington, Del.

This invention is particularly preferred for workpieces requiring a highly flat surface. Finishing a workpiece surface to meet the specified semiconductor industry circuit design rule is preferred and finishing a workpiece surface to meet the 0.35 micrometers feature size semiconductor design rule is more preferred and finishing a workpiece surface to meet the 0.25 micrometers feature size semiconductor design rule is even more preferred and finishing a workpiece surface to meet the 0.18 micrometers semiconductor design rule is even more particularly preferred. An electronic wafer finished to meet a required surface flatness of the wafer device rule in to be used in the manufacture of ULSIs (Ultra Large Scale Integrated Circuits) is a particularly preferred workpiece made with a method according to preferred embodiments of this invention. The design rules for semiconductors are generally known to those skilled in the art. Guidance can also be found in the "The National Technology Roadmap for Semiconductors" published by SEMATECH in Austin, Tex.

A semiconductor wafer having a diameter of at least 200 mm is preferred and a semiconductor wafer having a diameter of at least 300 mm is more preferred. A substrate wafer is a preferred workpiece. A computer memory disk is a preferred substrate. A glass television faceplate is a preferred workpiece. An LCD display is a preferred workpiece. A CRT screen is a preferred workpiece. Polymer structures, particularly comprising low dielectric polymers, are a preferred workpiece. Optoelectronic parts are also a preferred workpiece. A flat panel display is a preferred workpiece. Particularly preferred workpieces include flat panel displays, semiconductor wafers, and optoelectronic parts. A workpiece selected from the group consisting of a workpiece having heterogeneous regions proximate to its surface is preferred and a workpiece selected from the group consisting of a workpiece having different compositions exposed on its surface to be finished is more preferred.

For finishing of semiconductor wafers having low-k dielectric layers (low dielectric constant layers), finishing aids, more preferably lubricating aids, are preferred. Illustrative nonlimiting examples of low-k dielectrics are low-k polymeric materials, low-k porous materials, and low-k foam materials. As used herein, a low-k dielectric has at most a k range of less than 3.5 and more preferably less than 3.0 and even more preferably less than 2.5 and even more especially preferred is less than 2.0. Illustrative examples include doped oxides, organic polymers, highly fluorinated organic polymers, and porous materials. Low-k dielectric materials are generally known to those skilled in the semiconductor wafer arts. Abrasive organic synthetic resin particles can be effective to finishing low-dielectric materials. Abrasive organic synthetic resin asperities can be effective to finishing low-dielectric materials. Multilevel semiconductor wafers such as those having low-k dielectric layers and multilevel metal layers are generally known by those skilled in the semiconductor arts and U.S. Pat. No. 6,153,833 to Dawson et al. is included herein by reference for general non-limiting guidance for those skilled in the art. Since low-k dielectric layers generally have lower mechanical strength, the lower coefficient of friction that is offered by organic lubricating boundary layers is particularly preferred. A semiconductor wafer having a plurality of low-k dielectric layers is a preferred workpiece and a semiconductor wafer having at least 3 of low-k dielectric layers is a more preferred workpiece and a semiconductor wafer having at least 5 of low-k dielectric layers is an even more preferred workpiece. Supplying a lubricant to a plurality of the low-k dielectric layers during finishing of the same semiconductor wafer is preferred and supplying a lubricant to at least 3 of the low-k dielectric layers during finishing of the same semiconductor wafer is more preferred and supplying a lubricant to at least 5 of the low-k dielectric layers during finishing of the same semiconductor wafer is even more preferred. A semiconductor wafer having at most 10 low-k dielectric layers is currently preferred but in the future this can increase. Semiconductor wafers for logic integrated circuits are particularly preferred. Defects caused during finishing can be reduced by supplying a lubricant.

A semiconductor wafer having a plurality of metal layers is a preferred workpiece and a semiconductor wafer having at least 3 of metal layers is a more preferred workpiece and a semiconductor wafer having at least 5 of metal layers is an even more preferred workpiece. A semiconductor wafer having at most 10 metal layers is currently preferred but in the future this will increase. A semiconductor wafer having logic chips or logic die is particularly preferred because they can have multiple metal layers for supplying lubricants such as preferred lubricants during finishing. Supplying a lubricant to a plurality of finishing layers of the same semiconductor wafer is preferred and supplying a lubricant to at least 3 of finishing layers of the same semiconductor wafer is more preferred and supplying a lubricant to at least 5 of finishing layers of the same semiconductor wafer is more preferred. Defects caused during finishing can be reduced by supplying a lubricant. Semiconductor wafers having a plurality of metal layers or dielectric layers are generally known to those skilled in the semiconductor wafer arts and U.S. Pat. No. 5,516,346 to Cadien et al. and U.S. Pat. No. 5,836,806 to Cadien et al. are included herein in their entirety for general illustrative guidance. Further, defects in the first finished layer can cause defects in the second finished layer (and so on). Thus by supplying a lubricant during finishing, one can improve yields by minimizing unwanted defects in both the current and subsequent layers. A method which updates the cost of manufacture control parameters, look-up tables, algorithms, or control logic consistent with the current manufacturing step is preferred. A method which updates the cost of manufacture control parameters, look-up tables, algorithms, or control logic consistent with the current manufacturing step while evaluating prior manufacturing steps (such as completed manufacturing steps) is preferred. A method which updates the cost of manufacture control parameters, look-up tables, algorithms, or control logic consistent with the current manufacturing step while evaluating future manufacturing steps is preferred. A method which updates the cost of manufacture control parameters, look-up tables, algorithms, or control logic consistent with the current manufacturing step while evaluating both prior and future manufacturing steps is more preferred. The semiconductor wafer can be tracked for each finishing step during processing with a tracking means such as tracking code. As an illustrative example, a semiconductor wafer can be assigned with a trackable UPC code. U.S. Pat. No. 5,537,325 issued to Iwakiri, et al., on Jul. 16, 1997 teaches a method to mark and track semiconductor wafers sliced from an ingot through the manufacturing process and is included for by reference in its entirety for general guidance and appropriate modification by those skilled in the art. As a nonlimiting example, Cognex Corporation in Natick, Mass. markets commercial tacking means for tracking semiconductor wafers. As further illustration of preferred tracking codes include 2D matrix (such as SEMI 2D matrix), alphanumeric, and bar codes. Processes, performance, and preferred lubrication conditions and information can be tracked and stored by wafer (and/or wafer batches) with this technology when used with the new disclosures herein.

Finishing Composition

Finishing compositions such as CMP slurries are generally known for finishing workpieces. A chemical mechanical polishing slurry is an example of a preferred finishing composition. Finishing compositions have their pH adjusted carefully, and generally comprise other chemical additives are used to effect chemical reactions and/other surface changes to the workpiece. A finishing composition having dissolved chemical additives is particularly preferred. Finishing compositions having small abrasive particles in a slurry are also preferred are preferred for many applications. Illustrative preferred examples include dissolved chemical additives include dissolved acids, bases, buffers, oxidizing agents, reducing agents, stabilizers, and chemical reagents. A finishing composition having a chemical which substantially reacts with material from the workpiece surface being finished is particularly preferred. A finishing composition chemical which selectively chemically reacts with only a portion of the workpiece surface is particularly preferred. A finishing composition having a chemical which preferentially chemically reacts with only a portion of the workpiece surface is particularly preferred.

Some illustrative nonlimiting examples of polishing slurries which can be used and/or modified by those skilled in the art are now discussed. An example slurry comprises water, a solid abrasive material and a third component selected from the group consisting of $HNO_3$, $H_2SO_4$, and $AgNO_3$ or mixtures thereof. Another polishing slurry comprises water, aluminum oxide, and hydrogen peroxide mixed into a slurry. Other chemicals such as KOH or potassium hydroxide can also be added to the above polishing slurry. Still another illustrative polishing slurry comprises $H_3PO_4$ at from about 0.1% to about 20% by volume, $H_2O_2$ at from 1% to about 30% by volume, water, and solid abrasive material. Still another polishing slurry comprises an oxidizing agent such as potassium ferricyanide, an abrasive such as silica, and has a pH of between 2 and 4. Still another polishing slurry comprises high purity fine metal oxides particles uniformly dispersed in a stable aqueous medium. Still another polishing slurry comprises a colloidal suspension of $SiO_2$ particles having an average particle size of between 20 and 50 nanometers in alkali solution, demineralized water, and a chemical activator. U.S. Pat. No. 5,209,816 to Yu et. al. issued in 1993, U.S. Pat. No. 5,354,490 to Yu et. al. issued in 1994, U.S. Pat. No. 5,540,810 to Sandhu et. al. issued in 1996, U.S. Pat. No. 5,516,346 to Cadien et. al. issued in 1996, U.S. Pat. No. 5,527,423 to Neville et. al. issued in 1996, U.S Pat. No. 5,622,525 to Haisma et. al. issued in 1997, and U.S. Pat. No. 5,645,736 to Allman issued in 1997 comprise illustrative nonlimiting examples of slurries contained herein for further general guidance and modification by those skilled in the arts. Commercial CMP polishing slurries are also available from Rodel Manufacturing Company in Newark, Del.

Lubricant

Supplying an effective amount of a lubricant which reduces the coefficient of friction between the finishing element finishing surface and the workpiece surface being finished is preferred. Supplying an effective amount of a lubricant which reduces the unwanted surface damage to the surface of the workpiece being finished during finishing is preferred. Supplying an effective amount of a lubricant which differentially lubricates different regions of the work piece and reduces the unwanted surface damage to at least a portion of the surface of the workpiece being finished during finishing is preferred.

The lubricant can help reduce the formation of surface defects for high precision part finishing. Fluid based a lubricant can be incorporated in the finishing element finishing surface. A method of finishing which adds an effective amount of fluid based lubricant to the interface between the finishing element finishing surface and workpiece surface being finished is preferred. A preferred effective amount of fluid based lubricating reduces the occurrence of unwanted surface defects. A preferred effective amount of fluid based lubricant can reduce the coefficient of friction between the work piece surface being finished and the finishing element finishing surface.

A lubricant which is water soluble is preferred for many applications. A lubricant which has a different solubility in water at different temperatures is more preferred. A degradable lubricant is also preferred and a biodegradable lubricant is even more preferred. An environmentally friendly lubricant is particularly preferred.

Certain particularly important workpieces in the semiconductor industry have regions of high conductivity and regions of low conductivity. The higher conductivity regions are often comprised of metallic materials such as tungsten, copper, aluminum, and the like. An illustrative example of a common lower conductivity region is silicon or silicon oxide. A lubricant which differentially lubricates the two regions is preferred and a lubricant which substantially lubricates two regions is more preferred. An example of a differential lubricant is if the coefficient of friction is changed by different amounts in one region versus the other region during finishing. An example of differential lubrication is where the boundary lubricant reacts differently with different chemical compositions to create regions having different local regions of tangential friction force and different coefficients of friction. Another example is where the semiconductor surface being finished topography (for instance unwanted raised regions) interact within the operative finishing interface to create local regions having different tangential friction forces and different coefficients of friction (see for example FIG. 6 discussion herein). For instance one region (or area) can have the coefficient of friction reduced by 20% and the other region (or area) reduced by 40%. This differential change in lubrication can be used to help in differential finishing of the two regions. An example of differential finishing is a differential finishing rate between the two regions. For example, a first region can have a finishing rate of "X" angstroms/minute and a second region can have a finishing rate of "Y" angstroms per minute before lubrication and after differential lubrication, the first region can have a finishing rate of 80% of "X" and the second region can have a finishing rate of 60% of "Y". Different regions can have different lubricating boundary layer thicknesses. An example of where this will occur is when the lubricant tends to adhere to one region because of physical or chemical surface interactions (such as a metallic conductive region) and not adhere or not adhere as tightly to the an other region (such as a non metallic, non conductive region). Changing the finishing control parameters to change the differential lubrication during finishing of the workpiece is a preferred method of finishing. Changing the finishing control parameters to change the differential lubrication during finishing of the workpiece which in turn changes the regional finishing rates in the workpiece is a more preferred method of finishing. Changing the finishing control parameters with in situ process control to change the differential lubrication during finishing of the workpiece which in turn changes the region finishing rates in the workpiece is an even more preferred method of finishing. The friction sensor probes play an important role in detecting and controlling differential lubrication in the workpieces having heterogeneous surface compositions needing finishing.

A lubricant comprising a reactive lubricant is preferred. A lubricant comprising a boundary lubricant is also preferred. A lubricating boundary layer is particularly preferred. A preferred reactive lubricant is a lubricant which chemically reacts with the workpiece surface being finished. A lubricant free of sodium is a preferred lubricant. As used herein a lubricant free of sodium means that the sodium content is below the threshold value of sodium which will adversely impact the performance of a semiconductor wafer or semiconductor parts made therefrom. A boundary layer lubricant is a preferred example of a lubricant which can form a lubricating film on the surface of the workpiece surface. As used herein a boundary lubricant is a thin layer on one or more surfaces which prevents or at least limits, the formation of strong adhesive forces between the workpiece being finished and the finishing element finishing surface and therefore limiting potentially damaging friction junctions between the workpiece surface being finished and the finishing element finishing surface. A boundary layer film has a comparatively low shear strength in tangential loading which reduces the tangential force of friction between the workpiece being finished and the finishing element finishing surface which can reduce surface damage to the workpiece being finished. In other words, a lubricating boundary layer is lubrication in which friction between two surfaces in relative motion, such as the workpiece surface being finished and the finishing element finishing surface, is determined by the properties of the surfaces, and by the properties of the lubricant other than the viscosity. A boundary film generally forms a thin film, perhaps even several molecules thick, and the boundary film formation depends on the physical and chemical interactions with the surface. A boundary lubricant which forms of thin film is preferred. A boundary lubricant forming a film having a thickness from 1 to 10 molecules thick is preferred and a boundary lubricant forming a film having a thickness from 1 to 6 molecules thick is more preferred and a boundary lubricant forming a film having a thickness from 1 to 4 molecules thick is even more preferred. A boundary lubricant forming a film having a thickness from 1 to 10 molecules thick on at least a portion of the workpiece surface being finished is particularly preferred and a boundary lubricant forming a film having a thickness from 1 to 6 molecules thick on at least a portion of the workpiece surface being finished is more particularly preferred and a boundary lubricant forming a film having a thickness from 1 to 4 molecules thick on at least a portion of the workpiece surface being finished is even more particularly preferred. A boundary lubricant forming a film having a thickness of at most 10 molecules thick on at least a portion of the workpiece surface being finished is particularly preferred and a boundary lubricant forming a film having a thickness of at most 6 molecules thick on at least a portion of the workpiece surface being finished is more particularly preferred and a boundary lubricant forming a film having a thickness of at most 4 molecules thick on at least a portion of the workpiece surface being finished is even more particularly preferred. An operative motion which continues in a substantially uniform direction can improve boundary layer formation and lubrication. A discontinuous operative motion can be used to change the lubricating boundary layer. Friction sensor subsystems and finishing sensor subsystems having the ability to control the friction probe motions and workpiece motions are preferred and uniquely able to improve finishing in many real time lubrication changes to the operative finishing interface. Boundary lubricants, because of the small amount of required lubricant, are particularly effective lubricants for inclusion in finishing elements. The molecular thickness of lubricating boundary layers can be measured with generally known frictional force measures and/or energy change sensors discussed herein. Changing the pressure in the operative finishing interface and/or in the secondary friction sensor interface can be used to determine molecular thickness. Controls can also be used by using various generally known analytical techniques such as spectroscopy and these results used to calibrate target energy change sensors and frictional force measures. Thermal analysis can also be used to measure the quantity of organic boundary layer on a surface and then the thickness calculated. Thermal analysis can be used to determine the efficacy of a particular lubricating boundary layer including solid boundary lubricant zone, boundary liquid lubricant zone, and boundary lubricant desorbed zone and the transition temperatures therebetween.

Changing the lubrication at least once during the finishing cycle time to change the coefficient of friction between the finishing element finishing surface and the workpiece surface being finished is preferred. Changing the lubrication a plurality of times during the finishing cycle time to change the coefficient of friction between the finishing element finishing surface and the workpiece surface being finished a plurality of times during the finishing cycle time is more preferred. Changing the amount of lubricant at the operative finishing interface is a preferred method to change the lubrication. Changing the composition of the lubricant at the operative finishing interface is a preferred method to change the lubrication. Changing the number of lubricants in the operative finishing interface is a preferred method to change the lubrication. Changing the number of organic lubricating boundary layers in the operative finishing interface is a preferred method to change the lubrication. Changing the composition of organic lubricating boundary layer(s) at the operative finishing interface is a preferred method to change the lubrication. Changing the number of organic lubricating films in the operative finishing interface is a preferred method to change the lubrication. Changing the composition of organic lubricating film(s) in the operative finishing interface is a preferred method to change the lubrication. Changing the form of the organic lubricating boundary layer(s) is a preferred method to change the lubrication. Changing the form of the organic lubricating film(s) is a preferred method to change the lubrication. Supplying an effective amount of lubricant which reduces the unwanted surface damage to the surface of the workpiece being finished during finishing is preferred. Changing the lubrication during the finishing cycle time can improve finishing control and improve finishing performance, particularly where using in situ control as discussed elsewhere herein. Changing lubrication in situ with a control subsystem is particularly preferred. The coefficient of friction in a uniform region of the workpiece is preferred and changing the coefficient of friction in a plurality of uniform regions of the workpiece is more preferred.

A plurality of operative sensors, preferably friction sensors, can aid in an important way in detecting and controlling differential lubrication in the workpieces having heterogeneous surface compositions needing finishing. Differential lubrication with a plurality of lubricants can be preferred because it can improve lubrication and coefficient of friction control. Differential lubrication with a plurality of organic lubricating films can be more preferred because it can further improve lubrication and coefficient of friction control. Differential lubrication with a plurality of organic lubricating boundary layers can be even more preferred because it can further improve lubrication and coefficient of friction control.

An organic lubricating film which interacts with the semiconductor wafer surface is preferred. An organic lubricating film which adheres to the semiconductor wafer surface is preferred. An organic lubricating film which interacts with and adheres to the semiconductor wafer surface is more preferred. An organic lubricating film which interacts with the uniform region of the semiconductor wafer surface is preferred. An organic lubricating film which adheres to the uniform region of the semiconductor wafer surface is preferred. An organic lubricating film which interacts with and adheres to the uniform region of the semiconductor wafer surface is more preferred A uniform functional region is a preferred uniform region. A conductive region is a preferred uniform functional region. A nonconductive region is a preferred uniform functional region. By having the organic lubricating film interact with and adhere to a uniform region of the semiconductor wafer surface, localized finishing control can be improved and unwanted surface defects can generally be reduced using the teaching and guidance herein.

A lubricating aid comprising a reactive lubricant is preferred. A lubricating aid comprising a boundary lubricant is also preferred. A reactive lubricant is a lubricant which chemically reacts with the workpiece surface being finished. A boundary layer lubricant is a preferred example of a lubricant which can form a lubricating film on the surface of the workpiece surface. An organic lubricating film is a preferred lubricating film. An organic lubricating film which adheres to the workpiece surface being finished is preferred and an organic lubricating film which interacts with and adheres to the workpiece surface being finished is more preferred. An organic lubricating boundary layer is preferred example of an organic lubricating film. As used herein a boundary lubricant is a thin layer on one or more surfaces which prevents or at least limits, the formation of strong adhesive forces between the workpiece being finished and the finishing element finishing surface and therefore limiting potentially damaging friction junctions between the workpiece surface being finished and the finishing element finishing surface. A boundary layer film has a comparatively low shear strength in tangential loading which reduces the tangential force of friction between the workpiece being finished and the finishing element finishing surface which can reduce surface damage to the workpiece being finished. In other words, boundary lubrication is a lubrication in which friction between two surfaces in relative motion, such as the workpiece surface being finished and the finishing element finishing surface, is determined by the properties of the surfaces, and by the properties of the lubricant other than the viscosity. Organic lubrication layers wherein the friction between two surfaces is dependent on lubricant properties other than viscosity is preferred. Different regional boundary layers on a semiconductor wafer surface being finished can be preferred for some finishing—particularly planarizing. A boundary film generally forms a thin film, perhaps even several molecules thick, and the boundary film formation depends on the physical and chemical interactions with the surface. An organic lubricating film is preferred. A boundary lubricant which forms of thin film can be more preferred.

An organic lubricating film having a thickness from 1 to 10 molecules thick is preferred and an organic lubricating film having a thickness from 1 to 6 molecules thick is more preferred and an organic lubricating film having a thickness from 1 to 4 molecules thick is even more preferred. An organic lubricating film having a thickness from 1 to 10 molecules thick on at least a portion of the workpiece surface being finished is particularly preferred and an organic lubricating film having a thickness from 1 to 6 molecules thick on at least a portion of the workpiece surface being finished is more particularly preferred and an organic lubricating film having a thickness from 1 to 4 molecules thick on at least a portion of the workpiece surface being finished is even more particularly preferred. An organic lubricating film having a thickness of at most 10 molecules thick on at least a portion of the workpiece surface being finished is particularly preferred and an organic lubricating film having a thickness of at most 6 molecules thick on at least a portion of the workpiece surface being finished is more particularly preferred and an organic lubricating film having a thickness of at most 4 molecules thick on at least a portion of the workpiece surface being finished is even more particularly preferred. Thin organic lubricating films can help reduce unwanted surface damage and aid in heterogeneous lubrication.

Heterogeneous lubricating boundary layers can improve finishing and planarizing of some semiconductor wafers where a differential finishing rate is desired in different regions. A semiconductor wafer surface having at least one unwanted raised region wherein the lubricating boundary layer thickness is at most one half the molecular layer thickness of the lubricating boundary layer thickness proximate to the unwanted raised region is preferred. A semiconductor wafer surface having at least one unwanted raised region wherein the boundary lubrication thickness is at most one third the molecular layer thickness of the lubricating boundary layer thickness proximate to the unwanted raised region is more preferred. A semiconductor wafer surface having at least one unwanted raised region wherein the lubricating boundary layer thickness is at most one quarter the molecular layer thickness of the lubricating boundary layer thickness proximate to the unwanted raised region is more preferred. Applications of this technology are further discussed herein elsewhere.

Controlling the thickness of the lubricating boundary layer by changing at least one control parameter in a manner that changes the tangential force of friction in at least one region of the semiconductor wafer surface in response to an in situ control signal is preferred. Controlling the thickness of the lubricating boundary layer by changing at least one control parameter in a manner that changes the tangential force of friction in at least two different regions of the semiconductor wafer surface in response to an in situ control signal is more preferred. Preferably the unwanted raised regions are related to a repeating pattern in the semiconductor wafer die. A plurality of die each having the same repeating pattern on the semiconductor wafer surface being finished is more preferred. These repeating patterns are generally created during semiconductor wafer manufacture and can be related to pattern densities. This is because small changes in lubricating boundary layers can change finishing rate, finishing rate selectivity, and finished surface quality.

A boundary lubricant which forms a thin lubricant film on the metal conductor portion of a workpiece surface being finished is particularly preferred. A nonlimiting preferred group of example boundary lubricants include at least one lubricant selected from the group consisting of fats, fatty acids, esters, and soaps. A preferred group of boundary lubricants comprise organic boundary lubricants. Another preferred group of boundary lubricants comprise organic synthetic lubricants. A phosphorous containing compound can be an effective preferred boundary lubricant. A phosphate ester is an example of a preferred phosphorous containing compound which can be an effective boundary lubricant. A chlorine containing compound can be an effective preferred boundary lubricant. A sulfur containing compound can be an effective preferred boundary lubricant. A nitrogen containing compound can be an effective preferred boundary lubricant. An amine derivative of a polyglycol can be a preferred boundary lubricant. A diglycol amine is a preferred amine derivative of a polyglycol. A compound containing atoms selected from the group consisting of at least one of the following elements oxygen, fluorine, nitrogen, or chlorine can be a preferred lubricant. A compound containing atoms selected from the group consisting of at least two of the following elements oxygen, fluorine, nitrogen, or chlorine can be a more preferred lubricant. A synthetic organic polymer containing atoms selected from the group consisting of at least one of the following elements oxygen, fluorine, nitrogen, or chlorine can be a preferred lubricant. A synthetic organic polymer containing atoms selected from the group consisting of at least two of the following elements oxygen, fluorine, nitrogen, or chlorine can be a more preferred lubricant. A synthetic organic polymer containing atoms selected from the group consisting of at least two of the following elements oxygen, fluorine, nitrogen, or chlorine can be a preferred lubricant. A sulfated vegetable oil and sulfurized fatty acid soaps are preferred examples of a sulfur containing compound. A lubricant which reacts physically with at least a portion of the workpiece surface being finished is a preferred lubricant. A lubricant which reacts chemically with at least a portion of the workpiece surface being finished is often a more preferred lubricant because it is often a more effective lubricant and can also aid at times directly in the finishing. A lubricant which reacts chemically with at least a portion of the workpiece surface being finished and which is non-staining is a particularly preferred lubricant because it is often a more effective lubricant, is generally easily cleaned from the workpiece, and can also aid directly in the finishing as discussed herein.

Limited zone lubrication between the workpiece being finished and the finishing element finishing surface is preferred. As used herein, limited zone lubricating is lubricating to reduce friction between two surfaces while simultaneously having wear occur. Limited zone lubricating which simultaneously reduces friction between the operative finishing interface while maintaining a cut rate on the workpiece surface being finished is preferred. Limited zone lubricating which simultaneously reduces friction between the operative finishing interface while maintaining an acceptable cut rate on the workpiece surface being finished is more preferred. Limited zone lubricating which simultaneously reduces friction between the operative finishing interface while maintaining a finishing rate on the workpiece surface being finished is preferred. Limited zone lubricating which simultaneously reduces friction between the operative finishing interface while maintaining an acceptable finishing rate on the workpiece surface being finished is more preferred. Limited zone lubricating which simultaneously reduces friction between the operative finishing interface while maintaining a planarizing rate on the workpiece surface being finished is preferred. Limited zone lubricating which simultaneously reduces friction between the operative finishing interface while maintaining an acceptable planarizing rate on the workpiece surface being finished is more preferred. Limited zone lubricating which simultaneously reduces friction between the operative finishing interface while maintaining a polishing rate on the workpiece surface being finished is preferred. Limited zone lubricating which simultaneously reduces friction between the operative finishing interface while maintaining an acceptable polishing rate on the workpiece surface being finished is preferred. Lubricant types and concentrations are preferably controlled during limited zone lubricating. Limited zone lubricating offers the advantages of controlled wear along with reduced unwanted surface damage. In addition, since limited zone lubrication often involves thin layers of lubricant, often less lubricant can be used to finish a workpiece.

Lubricants which are polymeric can be very effective lubricants. A boundary lubricant comprising organic synthetic polymers are preferred lubricants. Supplying a lubricant to the interface of the workpiece surface being finished and the finishing element finishing surface wherein the lubricant is from 0.1 to 15% by weight of the total fluid between the interface is preferred and from 0.2 to 12% by weight of the total fluid between the interface is more preferred and from 0.3 to 12% by weight of the total fluid between the interface is even more preferred and from 0.3 to 9% by weight of the total fluid between the interface is even more particularly preferred. These preferred ranges are given for general guidance and help to those skilled in the art. Lubricants outside this range are currently believed to be useful but not as economical to use.

A lubricant having functional groups containing elements selected from the group consisting of chlorine, sulfur, and phosphorous is preferred and a boundary lubricant having functional groups containing elements selected from the group consisting of chlorine, sulfur, and phosphorous is more preferred. A lubricant comprising a fatty acid substance is a preferred lubricant. An preferred example of a fatty substance is a fatty acid ester or salt. Fatty acid salts of plant origin can be particularly preferred. A lubricant comprising a synthetic polymer is preferred and a lubricant comprising a boundary lubricant synthetic polymer is more preferred and a lubricant comprising a boundary lubricant synthetic polymer and wherein the synthetic polymer is water soluble is even more preferred. A polymer having a number average molecular weight from 200 to 150,000 is preferred and having a number average molecular weight from 200 to 100,000 is more preferred and having a number average molecular weight from 400 to 50,000 is even more preferred.

A lubricant comprising a polyalkylene glycol polymer is a preferred composition. A polymer of polyoxyalkylene glycol monoacrylate or polyoxyalkylene glycol monomethacrylate is very useful as a base of lubricant. A polyglycol having a molecular weight of 200 to 3000 is preferred and a polyethylene glycol having a molecular weight from 200 to 2500 is more preferred for some applications. Polyglycols selected from the group polymers consisting of ethylene oxide, propylene oxide, and butylene oxide and mixtures thereof are particularly preferred. A fatty acid ester can be an effective lubricant.

A lubricant can be contained in the finishing element finishing surface and then supplied to the interface between the workpiece being finished and the finishing element finishing surface by the operative finishing motion. The interface between the workpiece being finished and the finishing element finishing surface is often referred to herein as the operative finishing interface. Alternately, the lubricant can be delivered in the finishing composition, preferably in a fluid, and more preferably in a aqueous finishing composition. Both techniques have advantages in different finishing situations. When the lubricant is contained in the finishing element surface the need for lubricants in the finishing composition is reduced or eliminated. Supplying lubricants in a fluid finishing composition generally offers improved control of lubrication at the operative finishing interface. Both the concentration and the feed rate of the lubricant can be controlled. If the lubricants are supplied in a first finishing composition free of abrasives and abrasives are supplied in a second finishing composition, then the lubricants, preferably organic lubricants, can be controlled separately and independently from any supplied abrasive. If the lubricants are supplied in a first finishing composition free of abrasives and abrasives are supplied in the finishing element finishing surface, then the lubricants, preferably lubricants, can be again controlled separately and independently from any supplied abrasive. Supplying lubricant separately and independently of the abrasive to the operative finishing interface is preferred because this improves finishing control.

A preferred type of lubricant is a lubricant which can be included in the finishing element. A lubricant distributed in at least a portion of the finishing element proximate to the finishing element finishing surface is preferred and a lubricant distributed substantially uniformly in at least a portion of the finishing element proximate to the finishing element finishing surface is more preferred and a lubricant distributed uniformly in at least a portion of the finishing element proximate to the finishing element finishing surface is even more preferred. A lubricant selected from the group consisting of liquid and solid lubricants and mixtures thereof is a preferred lubricant.

A finishing element finishing surface can have a lubricant in the finishing surface. A combination of a liquid lubricant and ethylene vinyl acetate, particularly ethylene vinyl acetate with 15 to 50% vinyl acetate by weight, can be a preferred effective lubricant additive. Preferred liquid lubricants include paraffin of the type which are solid at normal room temperature and which become liquid during the production of the finishing element. Typical examples of desirable liquid lubricants include paraffin, naphthene, and aromatic type oils, e.g. mono- and polyalcohol esters of organic and inorganic acids such as monobasic fatty acids, dibasic fatty acids, phthalic acid and phosphoric acid.

The lubricant can be contained in finishing element body in different preferred forms. A lubricant dispersed in an organic synthetic polymer is preferred. A lubricant dispersed in a minor amount of organic synthetic polymer which is itself dispersed in the primary organic synthetic polymeric resin in discrete, unconnected regions is more preferred. As an illustrative example, a lubricant dispersed in a minor amount of an ethylene vinyl acetate and wherein the ethylene vinyl acetate is dispersed in discrete, unconnected regions in a polyacetal resin. A lubricant dispersed in discrete, unconnected regions in an organic synthetic polymer is preferred.

A polyglycol is an example of a preferred lubricant. Preferred polyglycols include glycols selected from the group consisting of polyethylene glycol, an ethylene oxide-propylene butyl ethers, a diethylene glycol butyl ethers, ethylene oxide-propylene oxide polyglycol, a propylene glycol butyl ether, and polyol esters. A mixture of polyglycols is a preferred lubricant. Alkoxy ethers of polyalkyl glycols are preferred lubricants. An ultra high molecular weight polyethylene, particularly in particulate form, is an example of preferred lubricant. A fluorocarbon resin is an example of a preferred lubricating agent. Fluorocarbons selected from the group consisting of polytetrafluoroethylene (PTFE), ethylene tetrafluoride/propylene hexafluoride copolymer resin (FEP), an ethylene tetrafluoride/perfluoroalkoxyethylene copolymer resin (PFA), an ethylene tetra fluoride/ethylene copolymer resin, a trifluorochloroethylene copolymer resin (PCTFE), and a vinylidene fluoride resin are examples of preferred fluorocarbon resin lubricants. A polyphenylene sulfide polymer is a preferred polymeric lubricant. Polytetrafluoroethylene is a preferred lubricant. Polytetrafluoroethylene in particulate form is a more preferred lubricant and polytetrafluoroethylene in particulate form which resists reaggolmeration is a even more preferred lubricant. A silicone oil is a preferred lubricant. A polypropylene is a preferred lubricant, particularly when blended with polyamide and more preferably a nylon 66. A lubricating oil is a preferred lubricant. A polyolefin polymer can be a preferred effective lubricant, particularly when incorporated into polyamide resins and elastomers. A high density polyethylene polymer is a preferred polyolefin resin. A polyolefin/polytetrafluoroethylene blend is also a preferred lubricant. Low density polyethylene can be a preferred lubricant. A fatty acid substance can be a preferred lubricant. An examples of a preferred fatty acid substance is a fatty ester derived from a fatty acid and a polyhydric alcohol. Examples fatty acids used to make the fatty ester are lauric acid, tridecylic acid, myristic acid, pentadecylic acid, palmitic acid, margaric acid, stearic acid, nonadecylic acid, arachidic acid, oleic acid, elaidic acid and other related naturally occurring fatty acids and mixtures thereof Examples of preferred polyhydric alcohols include ethylene glycol, propylene glycol, homopolymers of ethylene glycol and propylene glycol or polymers and copolymers thereof and mixtures thereof.

Illustrative, nonlimiting examples of useful lubricants and systems for use in lubricated finishing element finishing surface systems and general useful related technology are given in the U.S. Pat. No. 3,287,288 to Reilling, U.S. Pat. No. 3,458,596 to Eaigle, U.S. Pat. No. 4,877,813 to Jimo et. al., U.S Pat. No. 5,079,287 to Takeshi et. al., U.S Pat. No. 5,110,685 to Cross et. al., U.S. Pat. No. 5,216,079 to Crosby et. al., U.S. Pat. No. 5,523,352 to Janssen, and U.S. Pat. No. 5,591,808 to Jamison and are included herein by reference in their entirety for guidance and modification as appropriate by those skilled in the art. Further illustrative, non limiting examples of useful lubricants and fluid delivery systems and general useful related technology are given in U.S. Pat. No. 4,332,689 to Tanizaki, U.S. Pat. No. 4,522,733 to Jonnes, U.S. Pat. No. 4,544,377 to Schwen, U.S. Pat. No. 4,636,321 to Kipp et. al., U.S. Pat. No. 4,767,554 to Malito et. al., U.S. Pat. No. 4,950,415 to Malito, U.S. Pat. No. 5,225,249 to Biresaw, U.S. Pat. No. 5,368,757 to King, U.S. Pat. No. 5,401,428 to Kalota, U.S. Pat. No. 5,433,873 to Camenzind, U.S. Pat. No. 5,496,479 to Videau et. al., and U.S. Pat. No. 5,614,482 to Baker et. al. are included for guidance and modification by those skilled in the art and are included by reference in their entirety herein. It is also understood that the lubricants and lubricant systems can be combined in many different ways in this invention to produce useful finishing results given the new guidance herein.

For general guidance for lubricants, some general test methods are discussed. Generally those skilled in the art know how to measure the kinetic coefficient of friction. A preferred method is ASTM D 3028-95 and ASTM D 3028-95 B is particularly preferred. Those skilled in the art can modify ASTM D 3028-95 B to adjust to appropriate finishing velocities and to properly take into consideration appropriate fluid effects due to the lubricant and finishing composition. Preferred lubricants and finishing compositions do not corrode the workpiece or localized regions of the workpiece. Corrosion can lead to workpiece failure even before the part is in service. ASTM D 130 is a is a useful test for screening lubricants for particular workpieces and workpiece compositions. As an example a metal strip such as a copper strip is cleaned and polished so that no discoloration or blemishes detectable. The finishing composition to be tested is then added to a test tube, the copper strip is immersed in the finishing composition and the test tube is then closed with a vented stopper. The test tube is then heated under controlled conditions for a set period of time, the metal strip is removed, the finishing composition removed, and the metal strip is compared to standards processed under identical conditions to judge the corrosive nature and acceptableness of the finishing composition. ASTM D 1748 can also be used to screen for corrosion. These test methods are included herein by reference in their entirety.

Some preferred suppliers of lubricants include Dow Chemical, Huntsman Corporation, and Chevron Corporation.

Operative Finishing Motion

Chemical mechanical finishing during operation has the finishing element in operative finishing motion with the surface of the workpiece being finished. A relative lateral parallel motion of the finishing element to the surface of the workpiece being finished is an operative finishing motion. Lateral parallel motion can be over very short distances or macro-distances. A parallel circular motion of the finishing element finishing surface relative to the workpiece surface being finished can be effective. A tangential finishing motion can also be preferred. U.S. Pat. No. 5,177,908 to Tuttle issued in 1993, U.S. Pat. No. 5,234,867 to Schultz et. al. issued in 1993, U.S. Pat. No. 5,522,965 to Chisholm et. al. issued in 1996, U.S. Pat. No. 5,735,731 to Lee in 1998, and U.S. Pat. No. 5,962,947 to Talieh issued in 1997 comprise illustrative nonlimiting examples of operative finishing motion contained herein for further general guidance of those skilled in the arts.

Some illustrative nonlimiting examples of preferred operative finishing motions for use in the invention are also discussed. This invention has some particularly preferred operative finishing motions of the workpiece surface being finished and the finishing element finishing surface. Moving the finishing element finishing surface in an operative finishing motion to the workpiece surface being finished is a preferred example of an operative finishing motion. Moving the workpiece surface being finished in an operative finishing motion to the finishing element finishing surface is a preferred example of an operative finishing motion. Moving the finishing element finishing surface in a parallel circular motion to the workpiece surface being finished is a preferred example of an operative finishing motion. Moving the workpiece surface being finished in a parallel circular motion to the finishing element finishing surface is a preferred example of an operative parallel motion. Moving the finishing element finishing surface in a parallel linear motion to the workpiece surface being finished is a preferred example of an operative finishing motion. Moving the workpiece surface being finished in a parallel linear motion to the finishing element finishing surface is a preferred example of an operative parallel. The operative finishing motion performs a significant amount of the polishing and planarizing in this invention.

High speed finishing of the workpiece surface with finishing elements can cause surface defects in the workpiece surface being finished at higher than desirable rates because of the higher forces generated. As used herein, high speed finishing involves relative operative motion having an equivalent linear velocity of greater than 300 feet per minute and low speed finishing involves relative operative motion having an equivalent linear velocity of at most 300 feet per minute. The relative operative speed is measured between the finishing element finishing surface and the workpiece surface being finished. Supplying a lubricant between the interface of finishing element finishing surface and the workpiece surface being finished when high speed finishing is preferred to reduce the level of surface defects. Supplying a lubricant between the interface of a cylindrical finishing element and a workpiece surface being finished is a preferred example of high speed finishing. Supplying a lubricant between the interface of a belt finishing element and a workpiece surface being finished is a preferred example of high speed finishing. Nonlimiting illustrative examples of a belt finishing element and a cylindrical finishing element are found in patents U.S. Pat. No. 5,735,731 to Lee and U.S. Pat. No. 5,762,536 to Pant and which can be modified by those skilled in the art as appropriate. U.S. Pat. No. 5,735,731 to Lee and U.S. 5,762,536 to Pant are included herein by reference in their entirety.

Friction Sensor Probe

A friction sensor probe to facilitate measurement and control of finishing in this invention is preferred. A secondary friction detector comprises a probe that can sense friction at the interface between a material which is separated from the workpiece surface being finished. A preferred secondary friction sensor comprises a friction sensor probe. A friction sensor probe comprises a probe that can sense friction at the interface between a material which is separate and unconnected to the workpiece surface being finished and the finishing element finishing surface. A friction sensor probe having a friction sensor surface in operative friction motion with the finishing element finishing surface is particularly preferred. A friction sensor surface comprising a material which comprises the same material contained in the workpiece is preferred and which comprises the same a material selected from the proximate surface of the workpiece is more preferred and which comprises a material selected from the surface of the workpiece is even more preferred. Friction sensor surface comprising a material which reacts in a similar manner with the lubricant as a material contained in the workpiece is preferred and which reacts a similar manner with the lubricant as a material selected the same as a material selected from the proximate surface of the workpiece is more preferred and which reacts a similar manner with the lubricant as a material selected a material selected from the surface of the workpiece is even more preferred.

Sensing the change in friction of the friction sensor probe can be accomplished using technology disclosed herein. Sensing a change in friction of an operative friction sensor is preferred and sensing a change in friction with a plurality of operative friction sensors is more preferred. Sending the information sensed from an operative friction sensor about finishing to a processor having access to cost of manufacture parameters is preferred and sending the information sensed from a plurality of operative friction sensors about finishing to a processor having access to cost of manufacture parameters is more preferred. An optical friction sensor is a preferred friction sensor. Non-limiting preferred examples of optical friction sensors is an infrared thermal sensing unit such as a infrared camera and a laser adjusted to read minute changes of movement friction sensor probe to a perturbation. A non-optical sensing friction sensor is a preferred friction sensor. Non-limiting preferred examples of non-optical friction sensors include thermistors, thermocouples, diodes, thin conducting films, and thin metallic conducting films. Electrical performance versus temperature such as conductivity, resistance, and voltage is measured. Those skilled in the thermal measurement arts are generally familiar with non-optical thermal sensors and their use. A change in friction can be detected by rotating the friction sensor probe in operative friction contact with the finishing element finishing surface with electric motors and measuring current changes on one or both motors. The current changes related to friction changes can then be used to produce a signal to operate the friction sensor subsystem. A change in friction can be detected by rotating the friction sensor probe in operative friction contact with the finishing element finishing surface with electric motors and measuring power changes on one or both motors. The power changes related to friction changes can then be used to produce a signal to operate the finishing control subsystem. Optionally one can integrate the total energy used by one or both motors over known time periods to monitor friction changes. One can monitor the temperature of the friction sensor surface with a friction sensor to develop a signal related to the friction at the interface between the friction sensor surface and the finishing element finishing surface. A sensor can also be used to detect imparted translational motion which corresponds to changes in friction. Using this information, integration coefficients can be developed to predict finishing effectiveness. An infrared camera or another type infrared temperature measuring device can be used for detecting and mapping of a temperature of the friction sensor surface which is predictive of the friction at the interface of the friction sensor surface and the finishing element finishing surface. The thermal image can then be analyzed and used to control the operational parameters of finishing. Methods to measure friction are generally well known to those skilled in the art. Energy change sensors are a preferred type of sensor for feed back of in situ control information. Non limiting examples of methods to measure friction are described in the following U.S. Pat. No. 5,069,002 to Sandhu et. al., U.S. Pat. No. 5,196,353 to Sandhu, U.S. Pat. No. 5,308,438 to Cote et. al., U.S. Pat. No. 5,595,562 to Yau et. al., U.S. Pat. No. 5,597,442 to Chen, U.S. Pat. No. 5,643,050 to Chen, and U.S. Pat. No. 5,738,562 to Doan et. al. and are included by reference herein in their entirety for guidance. Those skilled in the art can modify this information using the confidential information disclosed herein for use in the friction sensor probes of this invention.

By having at least one friction sensor probe to detect and output signals in real time on changes in friction due to operating parameters changes in lubrication and finishing can be more effectively controlled. By having two friction sensor probes, differential changes in friction can be monitored and used to even more effectively control finishing. Differential changes in friction can be monitored that are due to differential reaction and lubrication of different materials on two different friction sensor probe friction sensor surfaces which in turn can be used to better control finishing of the workpiece surface having these two materials. Further the differential lubrication can be related to such finishing control parameters as operative finishing motion speed, type of motion such as continuous or vibrating motions, applied pressure, temperature of finishing, etc. By having at least one friction sensor probe, more preferably two friction sensor probes, which has been calibrated overtime, such changes can be recognized and adjusted by those generally skilled in the art with mathematical equations and modeling within the capability of current processor devices such as computers.

By having one friction probe friction sensor surface comprising at least one material selected from the proximate surface of the workpiece surface being finished, control of the active lubrication at the interface between the workpiece being finished and the finishing element finishing surface can be controlled more effectively. By having one friction probe friction sensor surface comprising at least one material selected from the operative finishing interface, control of the active lubrication at the interface between the workpiece being finished and the finishing element finishing surface can be controlled more effectively. By having two friction sensor probe friction sensor surfaces, each comprising at least one material selected from the proximate surface of the workpiece surface being finished, control of the active lubrication at the interface between the workpiece being finished and the finishing element finishing surface can be controlled for the effect the lubrication on both materials proximate to the surface of the workpiece surface being finished. By having two friction sensor probe friction sensor surfaces, each comprising at least one material selected from the operative finishing interface, control of the active lubrication at the interface between the workpiece being finished and the finishing element finishing surface can be controlled for the effect the lubrication on both materials proximate to the surface of the workpiece surface being finished. Lubricant concentration can vary non linearly with the active lubrication at the operative finishing interface and even with different regions in a heterogeneous workpiece surface because selective reactions with the regions on the workpiece surface being finished. A heterogeneous workpiece surface being finished can have variations from bulk lubrication due to different selective reactions with the lubricant and different materials on the workpiece surface being finished. By having the friction sensor probes, one can control lubrication by the intended result (effect on friction) rather than by concentrations or feed rates. For boundary lubrication with a reactive lubricant, less lubricant is needed once the desired level of boundary lubrication is established. Using a friction sensor probes, desired lubrication can be more effectively controlled. Using friction sensor probes, marginal lubrication can be more effectively controlled.

A friction sensor probe of this invention has at least one friction sensor and a friction sensor probe with at least two friction sensors is preferred. A friction sensor probe of this invention has at least one friction sensor surface and a friction sensor probe having at least two friction sensor surfaces is more preferred for some applications. By having more than one friction sensor (such as two thermocouples or one optical temperature sensor and one non-optical friction sensor) a more precise friction can often be obtained. With very expensive workpieces such as semiconductor wafers the additional cost is often justified. By having more than one friction sensor surface, multiple friction readings can be obtained without the additional expense of having two friction probe bodies. Two separate friction sensor probes have additional degrees of freedom in their measurement and freedom of movement so they can often be cost justified. A friction sensor surface generates friction while contacting the surface of the finishing element finishing surface which produces heat. A thermal measurement of the finishing element finishing surface immediately after it departs from the area of friction with the friction sensor probe can also be made with a infrared camera or other optical friction sensor. Applicant currently particularly prefers to measure the friction at a point where the friction sensor surface is still in contact with the finishing element finishing surface (as would occur in use with the friction sensor probe in FIG. 6). Sensing the temperature of the friction sensor surface is very preferred and sensing changes in the temperature of the friction sensor surface is even more preferred. Sensing changes in temperature of the friction sensor surface by sensing changes in temperature of the friction sensing element is also more preferred and sensing changes in temperature of the friction sensor surface by sensing changes in temperature of the friction sensing element is also even more preferred. Applicant recommends having a low thermal mass in the friction sensor surface to increase response time to friction generated heat when a thermal sensor is employed.

A friction sensor subsystem as used herein is the combination of the friction sensor probe operatively connected to a processor and a controller which is capable of controlling the finishing control parameters and the friction sensing control parameters. A preferred friction sensor subsystem has access to cost of manufacture parameters, preferably useful cost of manufacture parameters, and even more preferably trackable and useful cost of manufacture parameters. A preferred example of generally useful cost of manufacture information is current cost of manufacture information which has been tracked and more preferably updated using generally known activity based accounting techniques. Another preferred example of useful cost of manufacture parameters is the cost of manufacture of manufacturing steps which preceded the current finishing step such as prior finishing steps, metallization steps, or interlayer dielectric steps. Another preferred example of useful cost of manufacture parameters is the cost of manufacture of manufacturing steps which occur after the current finishing step such as later finishing steps, metallization steps, or interlayer dielectric steps. The current finishing step can affect the cost of manufacture of a later step because some defects such generally poor planarity can adversely impact latter manufacturing step costs such as by negativity impacting latter step yields. A preferred friction sensor subsystem has access to cost of manufacture parameters, preferably current cost of manufacture parameters, and even more preferably trackable cost of manufacture parameters. Non-limiting friction control parameters include the operative friction motion, temperature, and finishing composition type and feed rate. Non-limiting preferred operative friction sensor motions include relative motion between the finishing element finishing surface and the friction sensor surface including velocity, continuous or periodic, and applied pressure. Still further examples of friction sensor motions include circular, tangential, linear, orbital, repetitive, and intermittent motions. A vibrating friction sensor motion is a preferred friction sensor motion for some applications. Mechanical mechanisms to deliver effect these operative friction sensor motions are well understood by those skilled in the art are not repeated herein. Electric motors and electric stepper motors are generally known in the industry for driving a mechanical mechanism. Guidance can also be found in mechanical mechanisms used for the carrier motions known in the general CMT industry and adapted for use with a friction sensor probe(s).

A friction sensor subsystem which uses processor which uses at least in part a mathematical equation to aid control is preferred. A mathematical equation developed from laboratory experience, semiworks experience, test wafer experience, and/or actual production can be preferred. Curve fitting to determine mathematical equations based on laboratory experience, semiworks experience, test wafer experience, and/or actual production are generally known to those skilled in the semiconductor arts. Mathematical equations can be used also generally for interpolation and extrapolation. Multiple mathematical equations with multiple unknowns can be solved or resolved in real time for improved process control with a processor. Differential information from multiple workpiece sensors and/or friction sensors can generally be used to improve real time (in situ) control with a processor. A lubrication control subsystem, a friction sensor subsystem, a finishing control subsystem, and a control subsystem can generally use mathematical equations to aid control. A friction sensor subsystem having at least one friction sensors is preferred and having at least two friction sensors is more preferred. A friction sensor subsystem having at least one friction sensor probe is preferred and having at least two friction sensor probes is more preferred. A friction sensor subsystem having at least two friction sensor probes and which uses processor which uses at least in part a mathematical equation to extrapolate from the information from the two probes is also more preferred. A friction sensor subsystem having at least two friction sensor probes and which uses processor which uses at least in part a mathematical equation to interpolate between the range of information derived from the two probes during the finishing cycle time is more preferred. A friction sensor subsystem having at least two friction sensor probes and which uses processor which uses at least in part a mathematical equation to interpolate between the information from the two probes at a particular time during the cycle time is more particularly preferred. Controlling finishing with current information from the friction sensor probes for interpolations are often more effective and precise than historical predictions, particularly when the finishing element finishing surface changes with time. Controlling finishing with current information from the friction sensor probes for extrapolations are often more effective and precise than historical predictions, particularly when the finishing element finishing surface changes with time.

Secondary friction detectors can be used to sense changes in friction and tangential friction forces. Some illustrative secondary friction sensor motions are pulsed direction changes, pulsed pressure changes, continuous motion such as circular, elliptical, and linear. An operative secondary friction sensor motion is an operative secondary friction sensor motion between the secondary friction sensor surface and the finishing element finishing surface. An absolute motion of the secondary friction sensor is preferred.

Workpiece Finishing Sensor

A workpiece finishing sensor is a sensor which senses the finishing progress to the workpiece in real time so that an in situ signal can be generated. A workpiece finishing sensor is preferred. A workpiece finishing sensor which facilitates measurement and control of finishing in this invention is preferred. A workpiece finishing sensor probe which generates a signal which can be used cooperatively with the friction sensor signal to improve finishing is more preferred.

The change in friction during finishing can be accomplished using technology generally familiar to those skilled in the art. A change in friction can be detected by rotating the workpiece being finished and the finishing element finishing surface with electric motors and measuring current changes on one or both motors. The current changes related to friction changes can then be used to produce a signal to operate the finishing control subsystem. A change in friction can be detected by rotating the workpiece finishing surface with the finishing element finishing surface with electric motors and measuring power changes on one or both motors. Changes in friction can also be measured with thermal sensors. A thermistor is a non-limiting example of preferred non-optical thermal sensor. A thermal couple is another preferred non-optical thermal sensor. An optical thermal sensor is a preferred thermal sensor. A infrared thermal sensor is a preferred thermal sensor. A sensors to measure friction in workpieces being finished are generally known to those skilled in the art. Non limiting examples methods to measure friction in friction sensor probes are described in the following U.S. Pat. No. 5,069,002 to Sandhu et. al., U.S. Pat. No. 5,196,353 to Sandhu, U.S. Pat. No. 5,308,438 to Cote et. al., U.S. Pat. No. 5,595,562 to Yau et. al., U.S. Pat. No. 5,597,442 to Chen, U.S. Pat. No. 564,050 to Chen, and U.S. Pat. No. 5,738,562 to Doan et. al. and are included by reference herein in their entirety for guidance and can be advantageously modified by those skilled in the art for use in this invention. Thermal sensors are available commercially from Terra Universal, Inc. in Anaheim, Calif. and Hart Scientific in American Fork, Utah. Measuring the changes in friction at the interface between the workpiece being finished and the finishing element finishing surface to generate an in situ signal for control is particularly preferred because the it can be effectively combined with at least one friction sensor probes to this invention to improve finishing control.

A workpiece finishing sensor for the workpiece being finished is preferred. A sensor for the workpiece being finished selected from the group consisting of friction sensors, thermal sensors, optical sensors, acoustical sensors, and electrical sensors are preferred sensors for the workpiece being finished in this invention. Workpiece thermal sensors and workpiece friction sensors are non-limiting examples of preferred workpiece friction sensors. As used herein, a workpiece friction sensor surface can sense the friction between the interface of the workpiece being finished and the finishing element finishing surface during operative finishing motion.

Additional non-limiting preferred examples of workpiece sensors will now be discussed. Preferred optical workpiece sensors are discussed. Preferred non-optical workpiece sensors are also discussed. The endpoint for planarization can be effected by monitoring the ratio of the rate of insulator material removed over a particular pattern feature to the rate of insulator material removal over an area devoid of an underlying pattern. The endpoint can detected by impinging a laser light onto the workpiece being polished and measuring the reflected light versus the expected reflected light as an measure of the planarization process. A system which includes a device for measuring the electrochemical potential of the slurry during processing which is electrically connected to the slurry, and a device for detecting the endpoint of the process, based on upon the electrochemical potential of the slurry, which is responsive to the electrochemical potential measuring device. Endpoint detection can be determined by an apparatus using an interferometer measuring device to direct at an unpatterned die on the exposed surface of the wafer to detect oxide thickness at that point. A semiconductor substrate and a block of optical quartz are simultaneously polished and an interferometer, in conjunction with a data processing system are then used to monitor the thickness and the polishing rate of the optical block to develop an endpoint detection method. A layer over a patterned semiconductor is polished and analyzed using optical methods to determine the end point. An energy supplying means for supplying prescribed energy to the semiconductor wafer are used to develop a detecting means for detecting a polishing end point tot the polishing of film by detecting a variation of the energy supplied tot the semiconductor wafer. The use of sound waves can be used during chemical mechanical polishing by measuring sound waves emanating from the chemical mechanical polishing action of the substrate against the finishing element. A control subsystem can maintain a wafer count, corresponding to how many wafers are finished and the control subsystem regulates the backside pressure applied to each wafer in accordance with a predetermined function such that the backside pressure increases monotonically as the wafer count increases. The above methods are generally known to those skilled in the art. U.S. Pat. No. 5,081,796 to Schultz, U.S. Pat. No. 5,439,551 to Meikle et al., U.S. Pat. No. 5,461,007 to Kobayashi, U.S. Pat. No. 5,413,941 to Koos et. al., U.S. Pat. No. 5,637,185 Murarka et al., U.S. Pat. No. 5,643,046 Katakabe et al., U.S. Pat. No. 5,643,060 to Sandhu et al., U.S. Pat. No. 5,653,622 to Drill et al., and U.S. Pat. No. 5,705,435 to Chen. are included by reference in their entirety and included herein for general guidance and modification by those skilled in the art.

Changes in lubrication, particularly active lubrication, at the operative finishing interface can significantly affect finishing rates and finishing performance in ways that current workpiece sensors cannot handle as effectively as desired. For instance, current workpiece sensors are less effective to adequately monitor and control real time changes in lubrication, particularly active lubrication, and changes in finishing such as finishing rates. This renders prior art workpiece sensors less effective for lubricating boundary layer for controlling and stopping finishing where friction is adjusted or changed in real time. In marked contrast to the prior art, the friction sensor subsystems and finishing sensor subsystems of this invention can detect and control both the friction detectors and the active lubrication at the operative finishing interface to improve real time finishing control during finishing and detecting the end point of finishing. Where the material changes with depth during the finishing of workpiece being finished, one can monitor friction changes in the friction sensor probes having dissimilar materials even with active lubrication and therefore readily detect the end point. As an additional example, the finishing rate can be correlated with the instantaneous lubrication at the operative finishing interface, a mathematical equation can be developed to monitor finishing rate with instantaneous lubrication information from the friction sensor probes, and the processor then in real time calculates finishing rates and indicates the end point to the controller.

Platen

The platen is generally a stiff support structure for the finishing element. The platen surface facing the workpiece surface being finished is parallel to the workpiece surface being planarized and is flat and generally made of metal. The platen reduces flexing of the finishing element by supporting the finishing element, optionally a pressure distributive element can also be used. The platen surface during polishing is in operative finishing motion to the workpiece surface being finished. The platen surface can be static while the workpiece surface being finished is moved in an operative finishing motion. The platen surface can be moved in a parallel motion fashion while the workpiece surface being finished is static. Optionally, both the platen surface and the workpiece being finished can be in motion in a way that creates operative finishing motion between the workpiece and the finishing element. Other types of platens are generally known in the industry and functional. A finishing element support mechanism is generally used for finishing.

Base Support Structure

The base support structure forms structure which can indirectly aid in applying pressure to the workpiece surface being finished. It generally forms a support surface for those members attached to it directly or operatively connected to the base support structure. Other types of base support structure are generally known in the industry and functional.

Finishing Element Conditioning

A finishing element can be conditioned before use or between the finishing of workpieces. Conditioning a finishing element is generally known in the CMP field and generally comprises changing the finishing element finishing surface in a way to improve the finishing of the workpiece. As an example of conditioning, a finishing element having no basic ability or inadequate ability to absorb or transport a finishing composition can be modified with an abrasive finishing element conditioner to have a new texture and/or surface topography to absorb and transport the finishing composition. As a non-limiting preferred example, an abrasive finishing element conditioner having a mechanical mechanism to create a finishing element finishing surface which more effectively transports the finishing composition is preferred. The abrasive finishing element conditioner having a mechanical mechanism to create a finishing element finishing surface which more effectively absorbs the finishing composition is also preferred. A abrasive finishing element conditioner having mechanical mechanism comprising a plurality of abrasive points which through controlled abrasion can modify the texture or surface topography of a finishing element finishing surface to improve finishing composition absorption and/or transport is preferred. An abrasive finishing element conditioner having a mechanical mechanism comprising a plurality of abrasive points comprising a plurality of diamonds which through controlled abrasion can modify the texture and/or surface topography of a finishing element finishing surface to improve finishing composition absorption and/or transport is preferred.

Modifying a virgin finishing element finishing surface with a finishing element conditioner before use is generally preferred. Modifying a finishing element finishing surface with a finishing element conditioner a plurality of times is also preferred. conditioning a virgin finishing element finishing surface can improve early finishing performance of the finishing element such as by exposing the lubricants. Modifying a finishing element finishing surface with a finishing element conditioner a plurality of times during it useful life in order to improve the finishing element finishing surface performance over the finishing cycle time by exposing new, unused lubricant, particularly new lubricant particles, is preferred. Conditioning a finishing element finishing surface a plurality of times during it useful life can keep the finishing element finishing surface performance higher over its useful lifetime by exposing fresh lubricant particles to improve finishing performance is also preferred. Conditioning a finishing surface by cleaning is preferred. Nondestructive conditioning is a preferred form of conditioning. Using feedback information, preferably information derived from a friction sensor probes, to select when to modify the finishing element finishing surface with the finishing element conditioner is preferred. Using feedback information, preferably information derived from a friction sensor probe, to optimize the method of modifying the finishing element finishing surface with the finishing element conditioner is more preferred. Use of feedback information is discussed further herein in other sections. When using a fixed abrasive finishing element, a finishing element having three dimensionally dispersed lubricants is preferred because during the finishing element conditioning process, material is often mechanically removed from the finishing element finishing surface and preferably this removal exposes fresh lubricants, particularly lubricant particulates, to improve finishing.

Nonlimiting examples of textures and topographies useful for improving transport and absorption of the finishing composition and/or finishing element conditioners and general use are given in U.S. Pat. No. 5,216,843 to Breivogel, U.S. Pat. No. 5,209,760 to Wiand, U.S. Pat. No. 5,489,233 to Cook et. al., U.S. Pat. No. 5,664,987 to Renteln, U.S. Pat. No. 5,655,951 to Meikle et. al., U.S. Pat. No. 5,665,201 to Sahota, and U.S. Pat. No. 5,782,675 to Southwick and are included herein by reference in their entirety for general background and guidance and modification by those skilled in the art.

Cleaning Composition

After finishing the workpiece such as a electronic wafer, the workpiece is generally carefully cleaned before the next manufacturing process step. A lubricant or abrasive particles remaining on the finished workpiece can cause quality problems later on and yield losses.

A lubricant which can be removed from the finished workpiece surface by supplying a water composition to the finished workpiece is preferred and a lubricant which can be removed from the finished workpiece surface by supplying a hot water composition to the finished workpiece is also preferred. An example of a water composition for cleaning is a water solution comprising water soluble surfactants. An effective amount of lubricant which lowers the surface tension of water to help clean abrasive and other adventitious material from the workpiece surface after finishing is particularly preferred.

A lubricant which can be removed from the finished workpiece surface by supplying pure water to the finished workpiece to substantially remove all of the lubricant is preferred and a lubricant which can be removed from the finished workpiece surface by supplying hot pure water to the finished workpiece to substantially remove all of the lubricant is also preferred. A lubricant which can be removed from the finished workpiece surface by supplying a pure water to the finished workpiece to completely remove the lubricant is more preferred and a lubricant which can be removed from the finished workpiece surface by supplying hot pure water to the finished workpiece in to completely remove the lubricant is also more preferred. A preferred form of pure water is deionized water. Supplying a cleaning composition having a surfactant which removes lubricant from the workpiece surface just polished is a preferred cleaning step. A lubricant which lowers the surface tension of the water and thus helps remove any particles from the finished workpiece surface is preferred.

By using water to remove lubricant, the cleaning steps are lower cost and generally less apt to contaminate other areas of the manufacturing steps. A water cleaning based process is generally compatible with many electronic wafer cleaning process and thus is easier to implement on a commercial scale.

Cost of Manufacture Information

Figure 8:
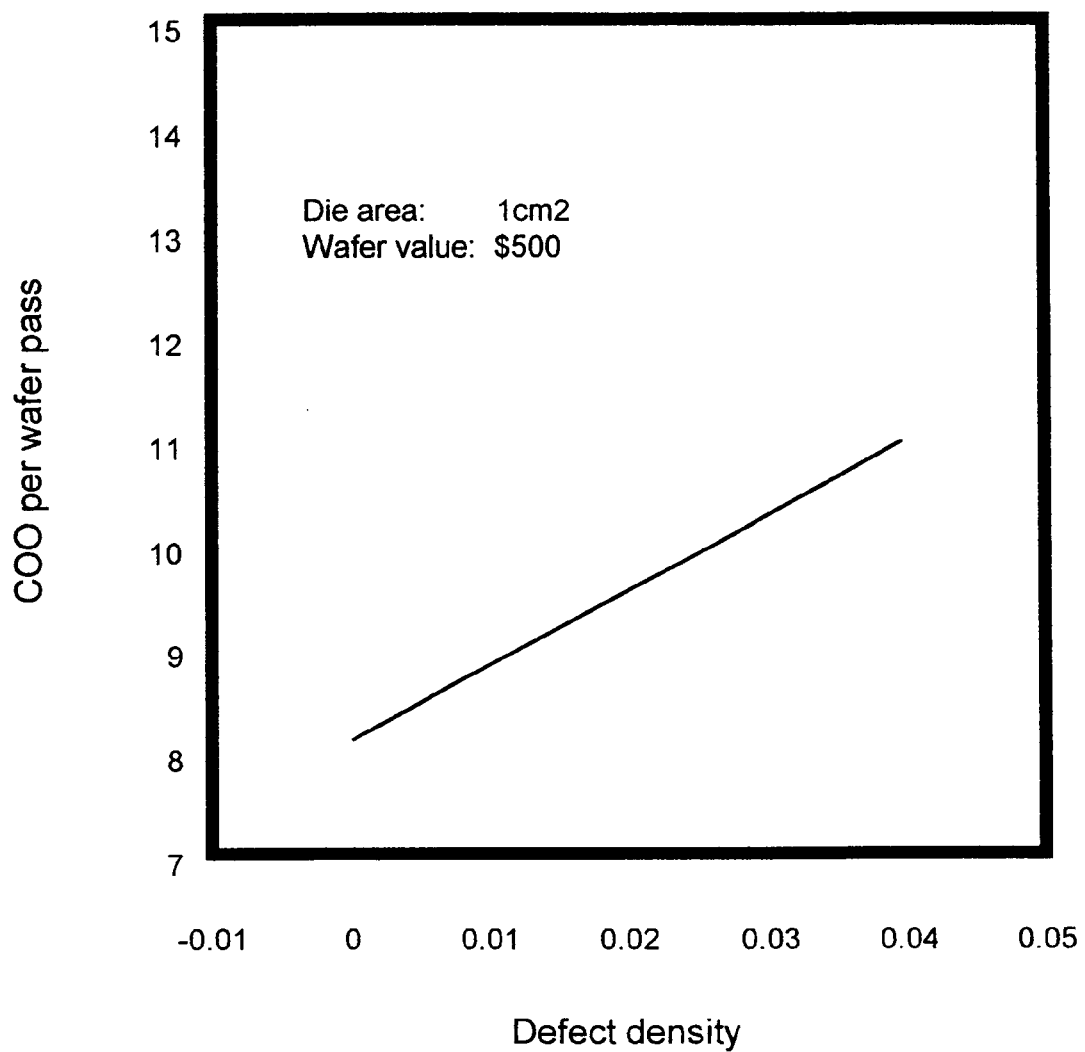
FIG. 8 is a plot of cost of ownership vs defect density
Figure 9:
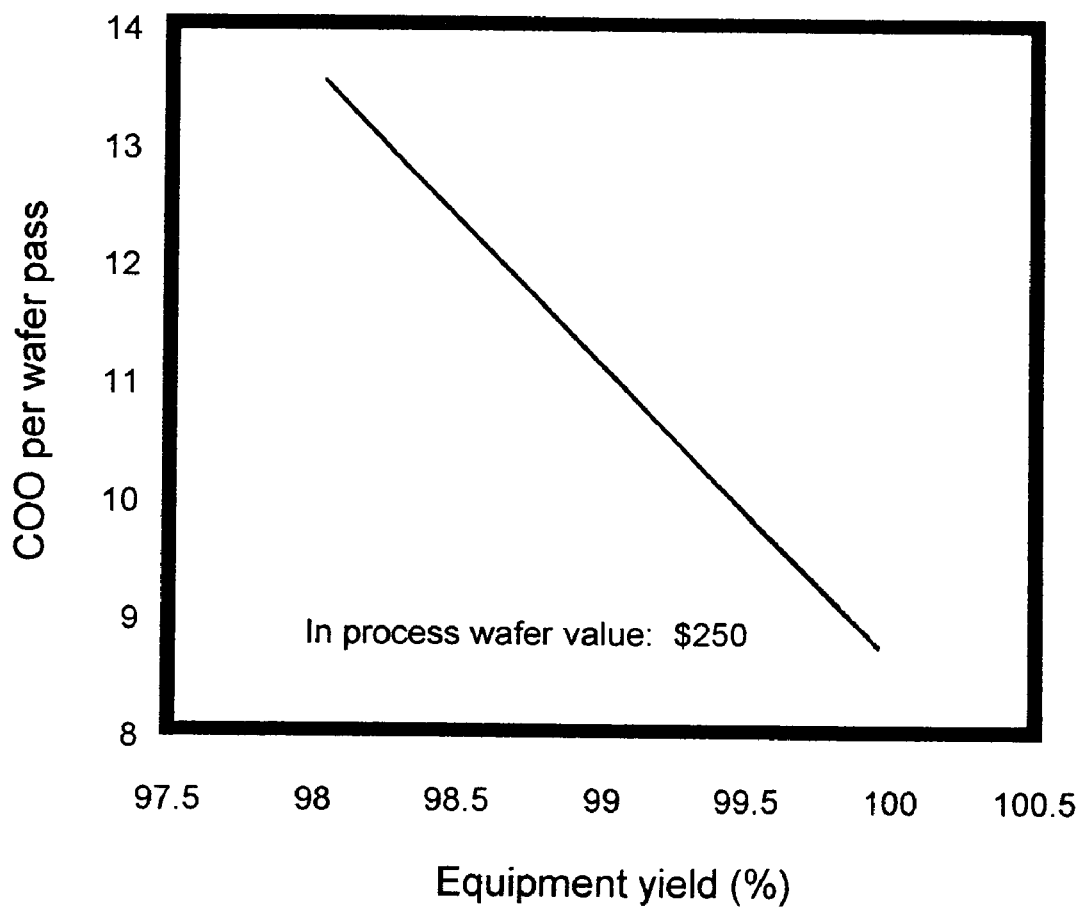
FIG. 9 is a plot of cost of ownership vs equipment yield
Figure 10:
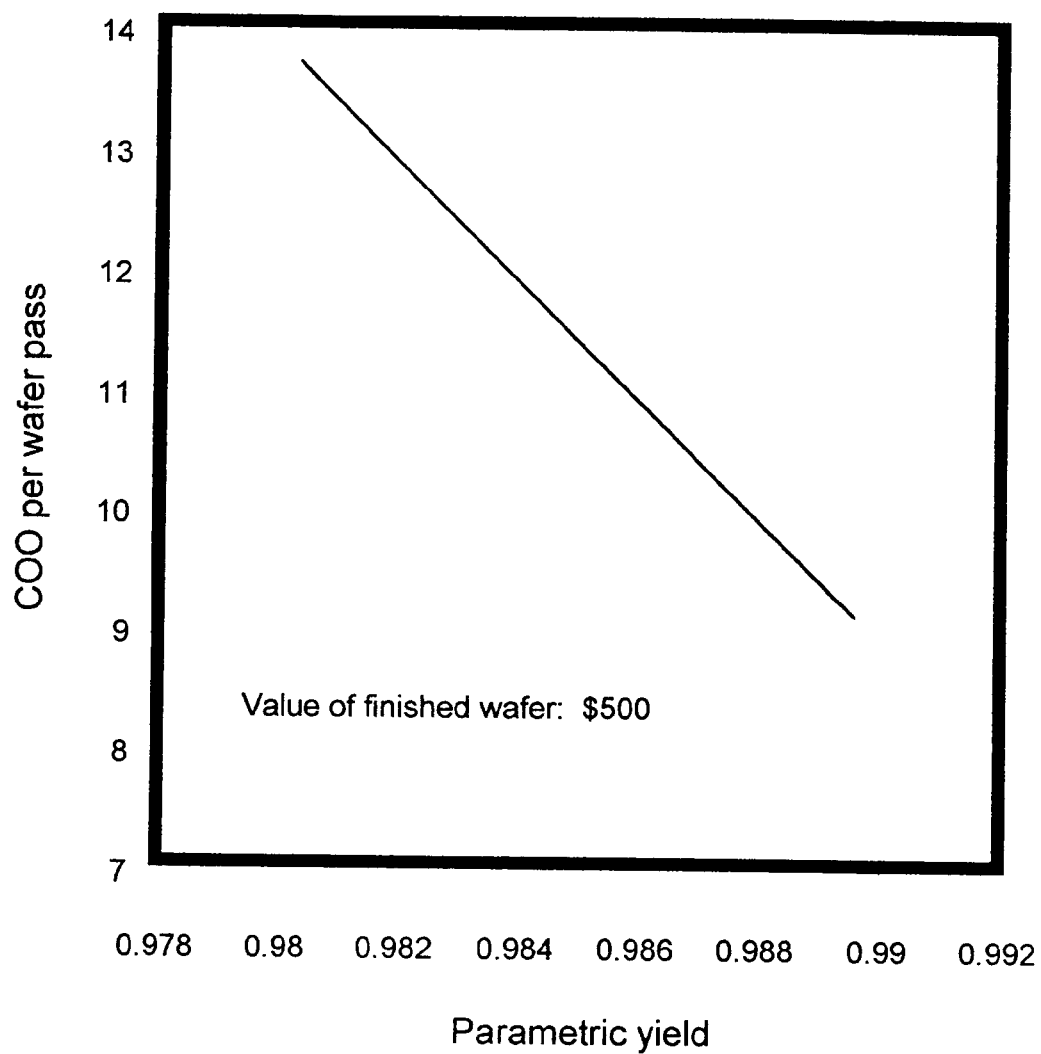
FIG. 10 is a plot of cost of ownership vs parametric yield loss
Figure 11:
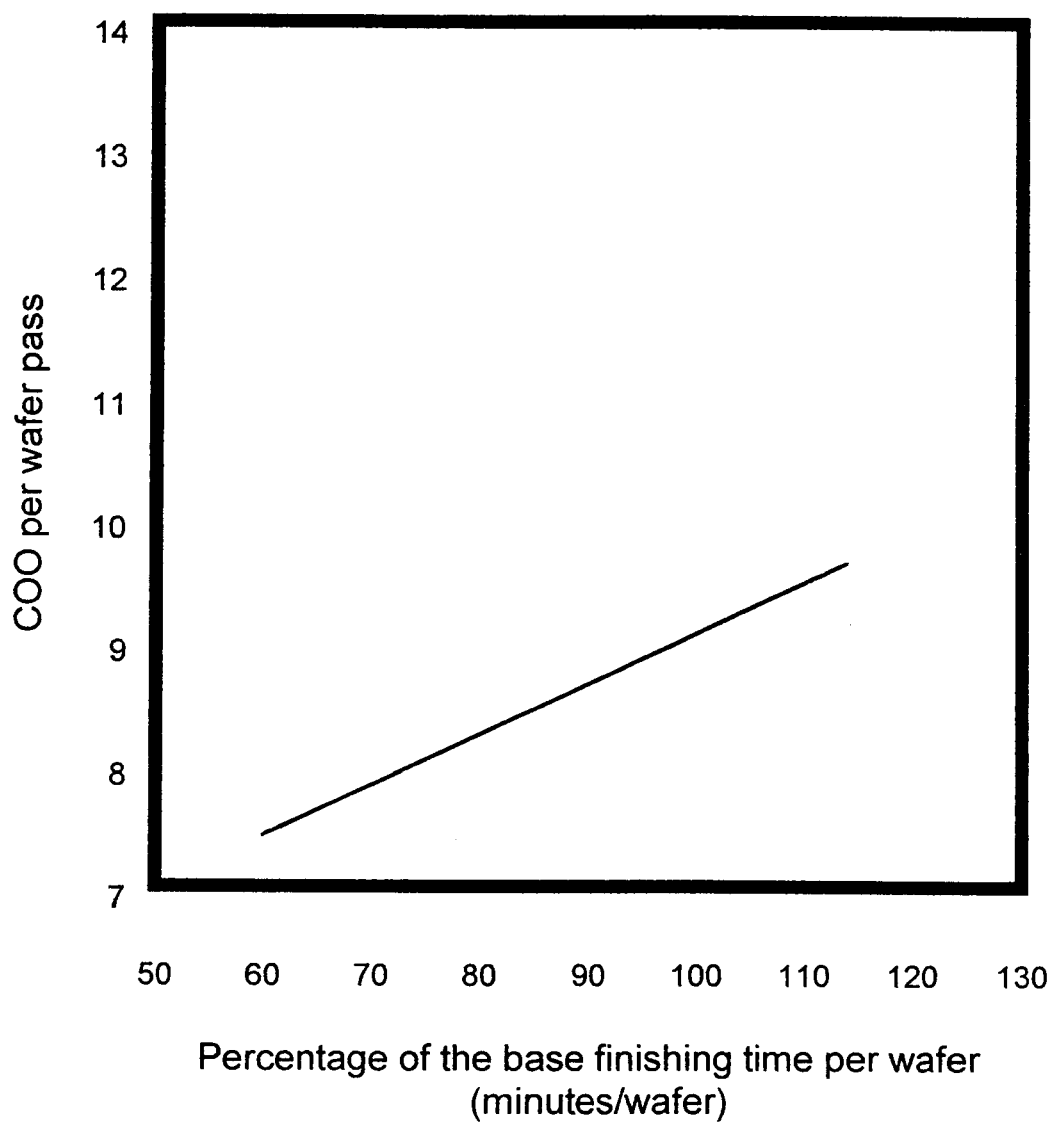
FIG. 11 is a plot of finishing rate effect on cost of ownership

Cost of manufacture parameters for chemical mechanical finishing are very complex. To applicant's knowledge, because of their complexity they have not been used for in situ process improvement. Applicant has now found unexpectedly that cost of manufacture parameters can be used to advantage to improve both finishing control and cost of manufacture during real-time finishing. Particular cost of manufacture parameters are preferred because they have a large impact on efficiency and effectiveness of chemical mechanical finishing as well as the proper selection of improved process control parameters and their selected values. A preferred cost of manufacture parameter is the defect density. FIG. 8 illustrates the effect of defect density on the cost of manufacture for a particular semiconductor wafer (finished wafer valued of $500). Note that an increase of defect density from 0.01 to 0.03 can increase the cost of manufacture for finishing by about $1.50. Another preferred cost of manufacture parameter is equipment yield. FIG. 9 illustrates the effect of a decrease of 1% in equipment yield can increase the cost of manufacture by $2.50 (in process wafer valued of $250). Another preferred cost of manufacture parameter for in situ process control is the parametric yield. FIG. 10 illustrates the effect of a decrease of 1% in parametric yield which can increase the cost of manufacture by $5.00 (finished wafer valued of $500). Another preferred cost of manufacture parameter for in situ process control is the finishing rate. FIG. 11 illustrates the effect of a finishing rate improvement on the cost of manufacture. It is also important to note that depending on the particular finishing conditions, an increase in finishing rate can have a lowering effect on cost of manufacture due to an increase in throughput and can simultaneously increase the cost of manufacture by increasing the yield loss due to increased defect density. By using a processor, appropriate calculations can be made in situ to improve cost of manufacture in real-time. Without the processor and the ready access to preferred cost of manufacture parameters, it is difficult to properly improve the process control parameters during real-time finishing. Cost of manufacture parameters and Cost of Ownership metrics are generally known by those skilled in the semiconductor arts. Some preferred examples of cost of manufacture parameters comprise at least one parameter(s) selected from the group consisting of equipment cost ($), spares cost ($), consumables costs (such as abrasives, slurry, and/or finishing elements in $), MTBF (mean time between failure in hours), MTTR (mean time to repair in hours), scheduled preventive maintenance, raw product throughput (workpieces per hour), production tests (hours), mean time to test (hours), systems/operator, equipment yield, incoming wafer value ($), density defect, faulty probability, device area, and completed workpiece value ($). Another set of preferred examples of cost of manufacture parameters comprise at least one parameter(s) selected from the group consisting of fixed costs, recurring costs, yield costs, tool life, throughput, composite yield, and utilization. SEMATECH has published generally widely accepted cost of manufacture parameters and Cost of Ownership metrics which are included herein by reference in their entirety for guidance and use of those skilled in the semiconductor art. Further, Wright Williams and Kelly of Dublin, Calif. have published a manual entitled "Understanding and Using Cost of Ownership" (rev. 0595-1) containing cost of manufacture parameters and equations for cost of manufacture calculation which is also included herein by reference in its entirety for guidance and use of those skilled in the semiconductor arts. Where specific reference is made herein to a specific definition of a particular cost of manufacture metric, applicant will use for instance the Wright Williams and Kelly parametric yield or the SEMATECH equipment yield naming for additional specificity. Where further specificity is desirable, the Wright Williams and Kelly definition shall be used for that term for claim interpretation for that term (unless the term is expressly defined in the claim).

Non limiting example of methods to make available preferred cost of manufacture information include use of various mathematical equations, calculating specific parameters, memory look-up tables or databases for generating certain parameters such as historical performance or preferred parameters or constants, neural networks, fuzzy logic techniques for systematically computing or obtaining preferred parameter values. It is also to be understood that often a single semiconductor wafer can undergo multiple wafer finishing steps. Each time the semiconductor wafer is finished in a wafer pass, the value of the semiconductor wafer increases due to multiple processing steps and thus the value of the equipment yield changes. A method which updates the cost of manufacture parameters consistent with the current manufacturing step is preferred. Those skilled in the arts of activity based accounting can generally setup appropriate look-up tables containing appropriate cost of manufacture parameters to use for in situ process control given the teachings and guidance herein. The semiconductor wafer can be tracked during processing with a tracking code. As an illustrative example, a semiconductor wafer can be assigned with a trackable UPC code. U.S. Pat. No. 5,537,325 issued to Iwakiri, et al., on Jul. 16, 1997 teaches a method to mark and track semiconductor wafers sliced from an ingot through the manufacturing process and is included for by reference in its entirety for general guidance and appropriate modification by those skilled in the art. Process and cost of manufacture information can be tracked and stored by wafer with this technology when used with the new disclosures herein.

Figure 12:
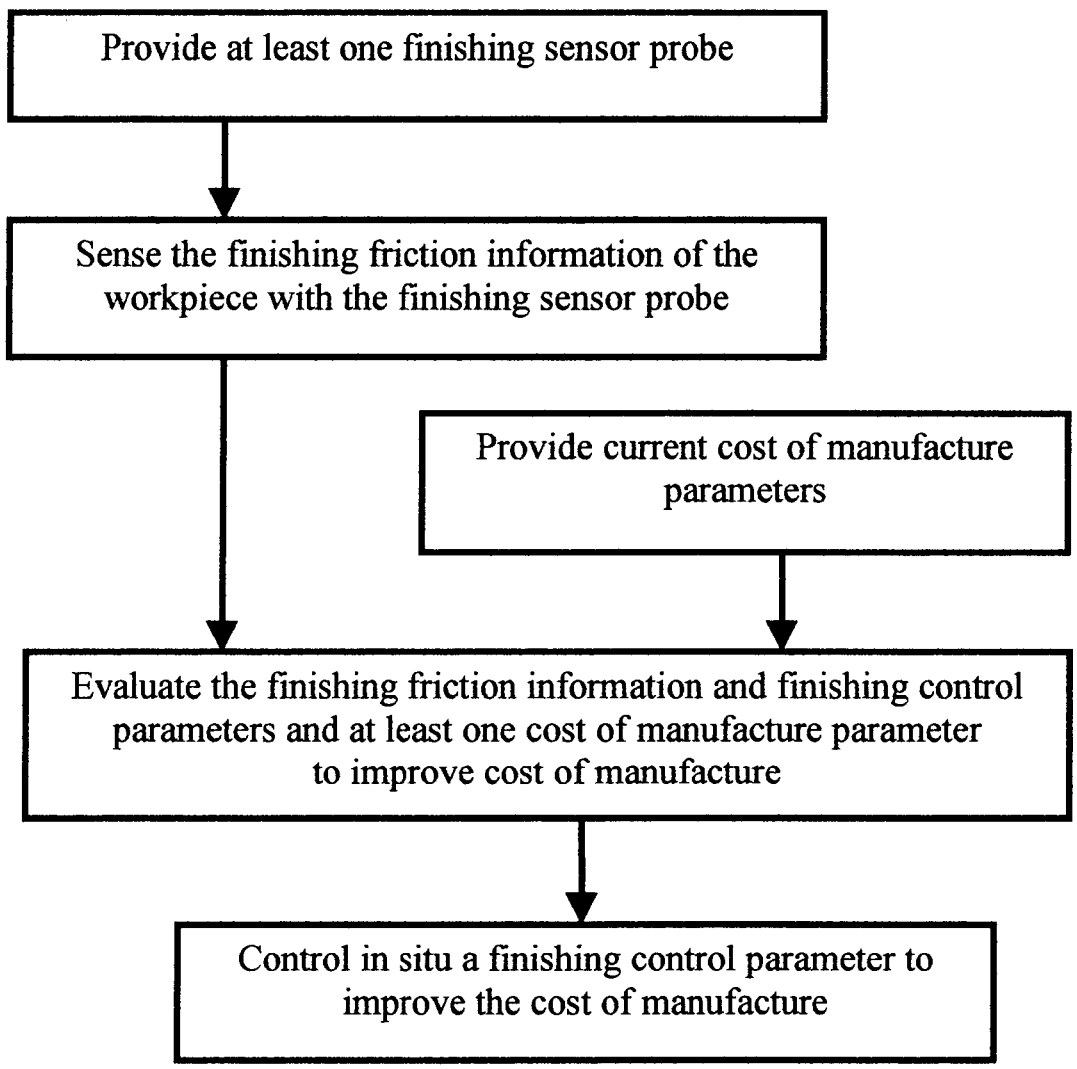
FIG. 12 includes examples of preferred steps in one embodiment of a method to control semiconductor wafer finishing using cost of manufacture parameters.
Figure 13:
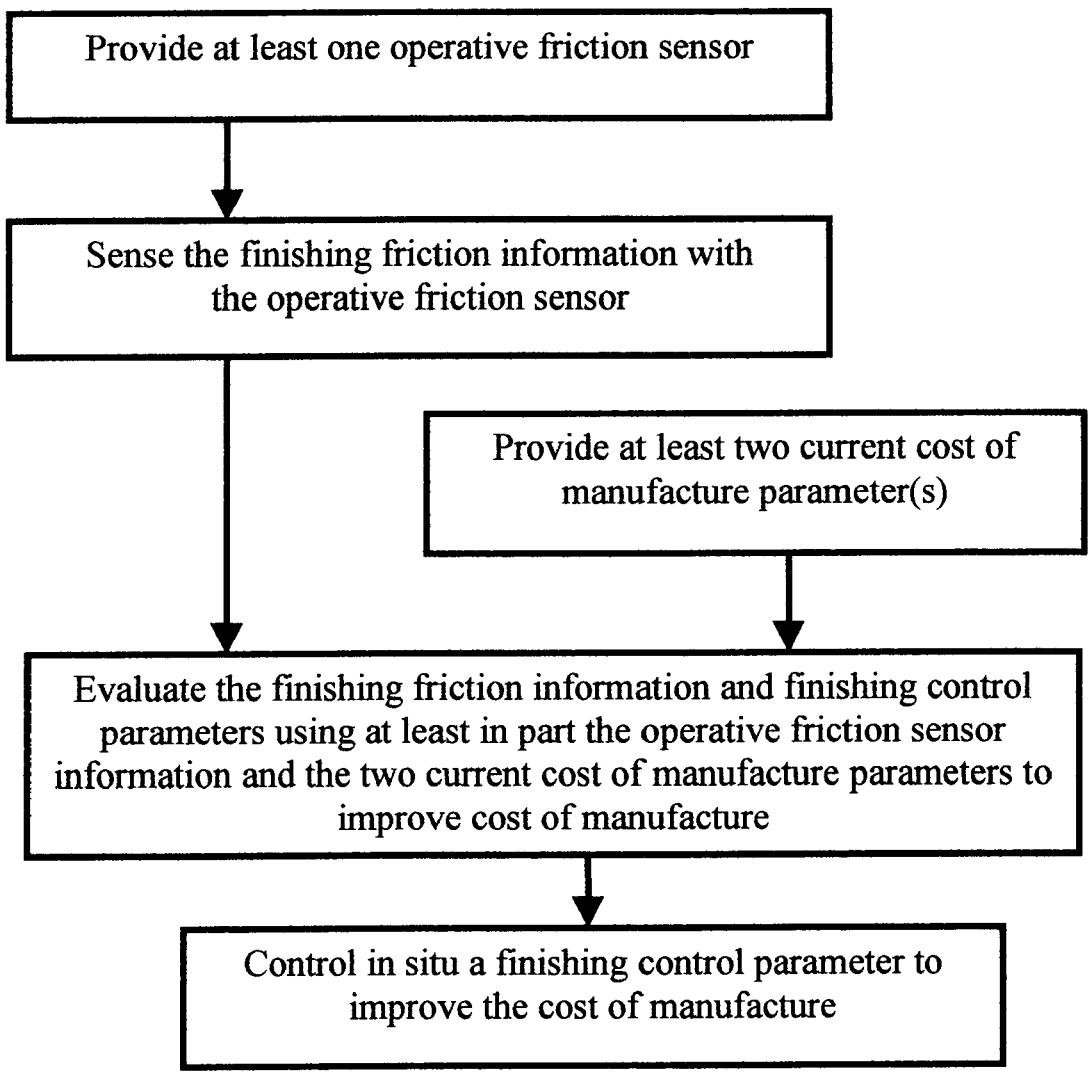
FIG. 13 includes examples of preferred steps in another embodiment of a method to control semiconductor wafer finishing using cost of manufacture parameters.

A method of finishing of a semiconductor wafer surface being finished wherein a mathematical formula is used to calculate in situ at least one improved process control parameter value based at least in part upon at least one cost of manufacture parameter selected from the group consisting of parametric yield, equipment yield, defect density, and finishing rate and then adjusting in situ at least one improved process control parameter is preferred. A method of finishing wherein at least one cost of manufacture parameter is evaluated in situ for improvement and used at least in part to improve control is preferred and a method of finishing wherein at least two cost of manufacture parameters are evaluated in situ for improvement and used at least in part to improve control is more preferred and a method of finishing wherein at least three cost of manufacture parameters are evaluated in situ for improvement and used at least in part to improve control is even more preferred. A method of finishing of a semiconductor wafer surface being finished wherein a mathematical formula is used to calculate in situ at least one improved process control parameter value based at least in part upon at least two cost of manufacture parameters selected from the group consisting of parametric yield, equipment yield, defect density, and finishing rate and then adjusting in situ at least one improved process control parameter is more preferred. A method of finishing of a semiconductor wafer surface being finished wherein a mathematical formula is used to calculate in situ at least one improved process control parameter value based at least in part upon at least three cost of manufacture parameters selected from the group consisting of parametric yield, equipment yield, defect density, and finishing rate and then adjusting in situ at least one improved process control parameter is even more preferred. A method of finishing of a semiconductor wafer surface being finished wherein a mathematical formula is used to calculate in situ at least two improved process control parameter values based at least in part upon at least two cost of manufacture parameters selected from the group consisting of parametric yield, equipment yield, defect density, and finishing rate and then adjusting in situ at least those two improved process control parameters is even more particularly preferred. These preferred cost of manufacture parameters are relatively difficult to improve during in situ processing because of their complexity and because they can have opposite effects on the cost of manufacture and thus a processor is generally quite effective for these calculations. Preferably, the calculation to improve cost of manufacture using the cost of manufacture parameters can be completed at least 4 times during the finishing cycle time and more preferably the calculations can be completed at least 6 times during the finishing cycle time and even more preferably the calculations can be completed at least 10 times during the finishing cycle time and even more particularly preferably the calculations can be completed at least 20 times during the finishing cycle time. Preferably, the in situ process control parameter value can be adjusted at least 4 times during the finishing cycle time and more preferably at least 6 times during the finishing cycle time and even more preferably at least 10 times during the finishing cycle time and even more particularly preferably at least 20 times during the finishing cycle time. Preferably, the in situ process control parameter value is controlled at least 4 times during the finishing cycle time and more preferably at least 6 times during the finishing cycle time and even more preferably at least 10 times during the finishing cycle time and even more particularly preferably at least 20 times during the finishing cycle time. Currently, a finishing cycle time of at most 6 minutes is preferred and of at most 4 minutes is more preferred and of at most 3 minutes is even more preferred and of at most 2 minutes is even more particularly preferred. Generally shorter cycle times are preferred because this generally increases throughput and reduces costs. Currently, a finishing cycle time of at least one half minute is preferred. Finishing cycle time is a preferred cost of manufacture parameter for optimization. By repeatedly calculating and adjusting the process control parameter (s) value(s), better process control and improved cost of manufacture can be effected. Generally, a maximum of one hundred calculations and process control parameter adjustments during a finishing cycle time are preferred although more can be used for particularly critical semiconductor wafer finishing. A process control parameter which changes the friction during finishing is a preferred process control parameter and a process control parameter which changes the coefficient of friction is a more preferred process control parameter. FIG. 12 includes examples of preferred steps in one embodiment of a method to control semiconductor wafer finishing using cost of manufacture parameters. FIG. 13 includes examples of preferred steps in another embodiment of a method to control semiconductor wafer finishing using cost of manufacture parameters.

A processor can evaluate input signals rapidly with the cost of manufacture parameters with algorithms, look-up tables, fuzzy logic, iterative calculation methods, and/or solving multiple simultaneous equations to develop an improved output control signal from the controller and/or subsystem controller.

Process Control Parameters

Preferred process control parameters include those control parameters which can be changed during processing and affect workpiece finishing. Control of the operative finishing motion is a preferred process control parameter. Examples of preferred operative finishing motions include relative velocity, pressure, and type of motion. Examples of preferred types of operative finishing motion include tangential motion, planar finishing motion, linear motion, vibrating motion, oscillating motion, and orbital motion. Finishing temperature is a preferred process control parameter. Finishing temperature can be controlled by changing the heat supplied to the platen or heat supplied to the finishing composition. Alternately, friction can also change the finishing temperature and can be controlled by changes in lubrication, applied pressure during finishing, and relative operative finishing motion velocity. Changes in lubricant can be effected by changing finishing composition(s) and/or feed rate(s). A preferred group of process control parameters consists of parameters selected from the group consisting of wafer relative velocity, platen velocity, polishing pattern, finishing temperature, force exerted on the operative finishing interface, finishing composition, finishing composition feed rate, and finishing pad conditioning Processor A processor is preferred to help evaluate the friction sensor probe information. A processor can be a microprocessor, an ASIC, or some other processing means. A processor preferably has computational and digital capabilities. Non limiting examples of processing information include use of various mathematical equations, calculating specific parameters, memory look-up tables or databases for generating certain parameters such as historical performance or preferred parameters or constants, neural networks, fuzzy logic techniques for systematically computing or obtaining preferred parameter values. Input parameter(s) can include information on current wafers being polished such as uniformity, expected polish rates, preferred lubricants(s), preferred lubricant concentrations, entering film thickness and uniformity, workpiece pattern. Further preferred non-limiting processor capabilities including adding, subtracting, multiplying, dividing, use functions, look-up tables, noise subtraction techniques, comparing signals, and adjusting signals in real time from various inputs and combinations thereof.

Use of Information for Feedback and Controller

Controllers to control the finishing of workpieces are generally known in the art. Controllers generally use information at least partially derived from the processor to make changes to the process control parameters.

An advantage of this invention is the excellent degree of control it gives to the operator performing planarization and/or polishing. To better utilize this control, the use of feedback information to control the finishing control parameters is preferred and in situ control is more preferred. Controlling the finishing control parameters selected from the group consisting of finishing composition feed rates, finishing composition concentration, operative finishing motion, and operative finishing pressure is preferred to improve control of the finishing of the workpiece surface being finished and in situ control is more particularly preferred. Another preferred example of an finishing control parameter is to use a different finishing element for a different portion the finishing cycle time such as one finishing element for the planarizing cycle time and a different finishing element for the polishing cycle time. Workpiece film thickness, measuring apparatus, and control methods are preferred methods of control. Mathematical equations including those developed based on process results can be used. Finishing uniformity parameters selected from the group consisting of Total Thickness Variation (TTV), Focal plane deviation (FPD), Within-Wafer Non-Uniformity (WIW NU), and surface quality are preferred. Average cut rate is a preferred finishing rate control parameter. Average finishing rate is a preferred finishing rate control parameter. Controlling finishing for at least a portion of the finishing cycle time with a finishing sensor subsystem to adjust in situ at least one finishing control parameter that affect finishing results is a preferred method of control finishing. Information feedback subsystems are generally known to those skilled in the art. Illustrative non limiting examples of wafer process control methods include U.S. Pat. No. 5,483,129 to Sandhu issued in 1996, U.S. Pat. No. 5,483,568 to Yano issued in 1996, U.S. Pat. No. 5,627,123 to Mogi issued in 1997, U.S. Pat. No. 5,653,622 to Drill issued in 1997, U.S. Pat. No. 5,657,123 to Mogi issued in 1997, U.S. Pat. No. 5,667,629 to Pan issued in 1997, and U.S. Pat. No. 5,695,601 to Kodera issued in 1997 are included herein for guidance and modification by those skilled in the art and are included herein by reference in their entirety.

Controlling at least one of the finishing control parameters based on using friction sensor information combined with workpiece sensor information is preferred and controlling at least two of the finishing control parameters using friction sensor information combined with workpiece sensor information is more preferred. Using a electronic finishing sensor subsystem to control the finishing control parameters is preferred. Feedback information selected from the group consisting of finishing rate information and product quality information such as surface quality information is preferred. Cost of manufacture information is also preferred information for control. Non-limiting preferred examples of process rate information include polishing rate, planarizing rate, and workpiece finished per unit time. Non-limiting preferred examples of quality information include first pass first quality yields, focal plane deviation, total thickness variation, measures of non uniformity. Non-limiting examples particularly preferred for electronics parts information includes Total Thickness Variation (TTV), Focal plane deviation (FPD), Within-Wafer Non-Uniformity (WIW NU), and surface quality.

In situ process control systems relying on workpiece finishing sensors are generally known to those skilled in the CMP industry. Commercial CMP equipment advertised by Applied Materials and IPEC reference some of this equipment.

Further Comments on Method of Operation

Some preferred embodiments are now further discussed.

Providing a finishing element finishing surface for finishing is preferred and providing a finishing element finishing surface having lubricants for finishing is also preferred and providing a finishing element having a finishing element finishing surface having lubricants dispersed therein for finishing is also preferred. Providing the workpiece surface being finished proximate to the finishing surface is preferred and positioning the workpiece surface being finished proximate to the finishing element finishing surface is more preferred.

Supplying an operative finishing motion between the workpiece surface being finished and the finishing element finishing surface is preferred and applying an operative finishing motion between the workpiece surface being finished and the finishing element finishing surface is more preferred. The operative finishing motion creates the movement and pressure at the operative finishing interface which supplies the finishing action such as chemical reactions, tribochemical reactions and/or abrasive wear generally caused by the abrasive particles. An operative finishing element finishing surface capable of inducing a tribochemical reaction is preferred. An operative finishing motion capable of inducing a tribochemical reaction is also preferred. Applying an operative finishing motion that transfers the lubricant to the interface between the finishing surface and the workpiece surface being finished is preferred and applying an operative finishing motion that transfers the lubricant, forming a marginally effective lubricating layer in the operative finishing interface is more preferred and applying an operative finishing motion that transfers the lubricant, forming a marginally effective lubricating boundary layer in the operative finishing interface is even more preferred. The lubrication at the interface reduces the occurrence of high friction, facilitates reductions in finishing energy, and can help reduce related workpiece surface damage. Applying an operative finishing motion that transfers the lubricant, forming a lubricating boundary layer between at least a portion of the finishing surface and the workpiece surface being finished is preferred and applying an operative finishing motion that transfers the lubricant, forming a marginally effective lubricating layer between at least a portion of the finishing surface and the workpiece surface being finished in order to control abrasive wear occurring to the workpiece surface being finished is more preferred and applying an operative finishing motion that transfers the lubricant, forming a marginally effective lubricating boundary layer between at least a portion of the finishing surface and the workpiece surface being finished in a manner that tribochemical wear occurs to the workpiece surface being finished is even more preferred and applying an operative finishing motion that transfers the lubricant, differentially lubricating different regions of the heterogeneous workpiece surface being finished is even more particularly preferred. With heterogeneous workpiece surfaces, the potential to differentially lubricate and finish a workpiece surface has high value where the differential lubrication is understood and controlled.

A lubricant selected from the group consisting of a lubricant and chemically reactive aid is preferred. A lubricant which reacts with the workpiece surface being finished is preferred and which reacts with a portion of the workpiece surface being finished is more preferred and which differentially reacts with heterogeneous portions of a workpiece surface being finished is even more preferred. By reacting with the workpiece surface, control of finishing rates can be improved and some surface defects minimized or eliminated. A lubricant which reduces friction during finishing is also preferred because surface defects can be minimized.

Cleaning the workpiece surface reduces defects in the semiconductor later on in wafer processing.

Supplying a lubricant to the workpiece surface being finished which changes the rate of a chemical reaction is preferred. Supplying and controlling a lubricant to the workpiece surface being finished having a property selected from the group consisting of changing the workpiece surface coefficient of friction, changing workpiece surface average cut rate, and changing the cut rate of a specific material of the workpiece surface being finished is particularly preferred.

Providing at least one friction sensor having a friction sensing surface proximate to the finishing element finishing surface and free of contact with the workpiece surface is preferred and providing at least two friction sensors having a friction sensing surfaces proximate to the finishing element finishing surface and free of contact with the workpiece surface is more preferred. Applying an operative friction sensor motion between the friction sensor surface and the finishing element finishing surface is preferred and applying an operative friction sensor motion between at least two friction sensor surfaces and the finishing element finishing surface is more preferred applying at least two separate and independent operative friction sensor motions between at least two friction sensor surfaces and the finishing element finishing surface is even more preferred in complex finishing situations. Organic lubrication layers wherein the friction between two surfaces is dependent on lubricant properties other than viscosity is preferred. Different regional boundary layers on a semiconductor wafer surface being finished can be preferred for some finishing—particularly planarizing. A friction sensor, preferably a plurality of friction sensors, can better detect changes in and control of finishing in many finishing situations and especially when lubricants are added to the operative finishing interface. Controlling in situ a finishing control parameter with a friction sensor subsystem is preferred and controlling in situ a finishing control parameter with a finishing sensor subsystem is more preferred. Controlling in situ the friction sensor motion is preferred and controlling and changing in situ the friction sensor motion is more preferred. Controlling in situ the operative friction sensor motion is even more preferred and controlling and changing in situ the operative friction sensor motion is also even more preferred. This can improve the quality and type of information available for controlling the finishing control parameter(s). As used herein, a friction sensor subsystem includes the friction sensor probe, the processor, and the controller along with the operative connections needed therefore. As used herein, a finishing sensor subsystem includes the friction sensor probe, workpiece sensor (if available), a processor, and a controller along with the operative connections needed therefore. As used herein, a finishing sensor subsystem preferably has at least one operative friction sensor and a finishing sensor subsystem having at least two operative friction sensors is more preferred and a finishing sensor subsystem having at least one friction sensor and at least one workpiece sensor is also more preferred and a finishing sensor subsystem having at least two friction sensors and at least one workpiece sensor is particularly preferred for controlling finishing of semiconductor wafers. A preferred finishing sensor subsystem has access to cost of manufacture parameters, preferably current cost of manufacture parameters, and even more preferably, trackable current cost of manufacture parameters.

Sensing the friction between the friction sensor surface and the finishing element finishing surface with at least one friction sensor subsystem is preferred. Sensing the friction between the friction sensor surface and the finishing element finishing surface with at least one finishing sensor subsystem is more preferred, particularly if a workpiece sensor is operable.

Using the method of this invention to finish a workpiece, especially a semiconductor wafer, by controlling finishing for a period of time with a friction sensor subsystem to adjust in situ at least one finishing control parameter that affects finishing selected from the group consisting of the finishing rate and the finishing uniformity is preferred. A preferred group of finishing control parameters are selected from the group consisting of the finishing composition, finishing composition feed rate, finishing temperature, finishing pressure, operative finishing motion velocity and type, and finishing element type and condition change are preferred. A preferred friction sensor subsystem and a preferred finishing sensor subsystem is operatively connected electrically to the lubrication control mechanism(s). A preferred method to measure finishing rate is to measure the change in the amount of material removed in angstroms per unit time in minutes (.ANG./min). Guidance on the measurement and calculation for polishing rate for semiconductor part is found in U.S. Pat. No. 5,695,601 to Kodera et. al. issued in 1997 and is included herein in its entirety for illustrative guidance. Methods to measure and monitor finishing rate in angstroms per minute is generally known to those skilled in the relevant art.

An average finishing rate range is preferred, particularly for workpieces requiring very high precision finishing such as in process electronic wafers. Average cut rate is used as a preferred metric to describe preferred finishing rates. Average cut rate is metric generally known to those skilled in the art. For electronic workpieces, such as wafers, a cut rate of from 100 to 25,000 Angstroms per minute on at least a portion of the workpiece is preferred and a cut rate of from 200 to 15,000 Angstroms per minute on at least a portion of the workpiece is more preferred and a cut rate of from 500 to 10,000 Angstroms per minute on at least a portion of the workpiece is even more preferred and a cut rate of from 500 to 7,000 Angstroms per minute on at least a portion of the workpiece is even more particularly preferred and a cut rate of from 1,000 to 5,000 Angstroms per minute on at least a portion of the workpiece is most preferred. A finishing rate of at least 100 Angstroms per minute for at least one of the regions on the surface of the workpiece being finished is preferred and a finishing rate of at least 200 Angstroms per minute for at least one of the materials on the surface of the workpiece being finished is preferred and a finishing rate of at least 500 Angstroms per minute for at least one of the. regions on the surface of the workpiece being finished is more preferred and a finishing rate of at least 1000 Angstroms per minute for at least one of the regions on the surface of the workpiece being finished is even more preferred where significant removal of a surface region is desired. During finishing there are often regions where the operator desires that the finishing stop when reached such when removing a conductive region (such as a metallic region) over a non conductive region (such as a silicon dioxide region). For regions where it is desirable to stop finishing (such as the silicon dioxide region example above), a finishing rate of at most 1000 Angstroms per minute for at least one of the regions on the surface of the workpiece being finished is preferred and a finishing rate of at least 500 Angstroms per minute for at least one of the materials on the surface of the workpiece being finished is preferred and a finishing rate of at least 200 Angstroms per minute for at least one of the regions on the surface of the workpiece being finished is more preferred and a finishing rate of at least 100 Angstroms per minute for at least one of the regions on the surface of the workpiece being finished is even more preferred where significant removal of a surface region is desired. The finishing rate can be controlled lubricants and with the process control parameters discussed herein.

Using finishing of this invention to remove raised surface perturbations and/or surface imperfections on the workpiece surface being finished is preferred. Using the method of this invention to finish a workpiece, especially a semiconductor wafer, at a planarizing rate and/or planarizing uniformity according to a controllable set of finishing control parameters that upon variation change the planarizing rate and/or planarizing uniformity and wherein the finishing parameters of at least two finishing control parameters is more preferred. Using the method of this invention to polish a workpiece, especially a semiconductor wafer, wherein an finishing sensor subsystem changes an operative finishing composition feed mechanism in situ is preferred. The finishing sensor subsystem and/or friction sensor subsystem is preferably operatively connected electrically to the operative lubrication feed mechanism.

Using the method of this invention to polish or planarize a workpiece, especially a semiconductor wafer, supplying lubrication moderated by a finishing element having at least two layers is preferred. More preferably the finishing element having at least two layers wherein the finishing surface layer has a higher hardness than the subsurface layer is more preferred, particularly for planarizing. A finishing element having at least two layers wherein a finishing surface layer has a lower hardness than the subsurface layer is also preferred, particularly for polishing.

Changes in boundary lubricant, particularly active boundary lubrication, at the operative finishing interface can significantly affect finishing rates and finishing performance in ways that current workpiece sensors cannot handle effectively. For instance, current workpiece sensors cannot effectively monitor and control multiple real time changes in boundary lubricant, particularly active boundary lubrication, and changes in finishing such as finishing rates. This renders prior art workpiece sensors lubricating boundary layer for controlling and stopping finishing where friction is adjusted or changed in real time. Friction sensor subsystems as indicated above can help to improve real time control wherein the boundary lubrication is changed during the finishing cycle time. Preferred friction sensors include optical friction sensors and non-optical friction sensors. An optical friction sensor is a preferred friction sensor. Non-limiting preferred examples of optical friction sensors is an infrared thermal sensing unit such as a infrared camera and a laser adjusted to read minute changes of movement friction sensor probe to a perturbation. A non-optical sensing friction sensor is a preferred friction sensor. Non-limiting preferred examples of non-optical friction sensors include thermistors, thermocouples, diodes, thin conducting films, and thin metallic conducting films. Electrical performance versus temperature such as conductivity, voltage, and resistance is measured. Those skilled in the thermal measurement arts are generally familiar with non-optical thermal sensors and their use. A change in friction can be detected by rotating the friction sensor in operative friction contact with the finishing element finishing surface with electric motors and measuring current changes on one or both motors. The current changes related to friction changes can then be used to produce a signal to operate the friction sensor subsystem. Where the material changes with depth during the finishing of workpiece being finished, one can monitor friction changes with the friction sensor probe having dissimilar materials even with active lubrication and therefore readily detect the end point. As an additional example, the finishing rate can be correlated with the instantaneous boundary lubrication at the operative finishing interface, a mathematical equation can be developed to monitor finishing rate with instantaneous lubrication information from the secondary sensor and the processor then in real time calculates finishing rates and indicates the end point to the controller. The friction sensor probes of this invention are particularly for sensing and controlling changes in the lubricating boundary layer and resulting changes in friction therefrom. The control subsystems can readily help to make in situ process changes to improve finishing and reduce manufacturing costs.

Changing the pressure at the operative finishing interface can change the lubricating boundary layer performance. Changing the motion such as speed or type of motion can change the lubricating boundary layer performance. Changing the pressure applied in the operative finishing interface, either total pressure or regional pressure can change the lubricating boundary layer performance. Changing the temperature in the operative finishing interface, either average or regional temperatures can change the lubricating boundary layer performance. Changing the concentration of the boundary lubricant by changing finishing elements can change the lubricating boundary performance. Changing the chemistry of the boundary lubricant in the finishing element can change the lubricating boundary performance by changing finishing elements during the finishing cycle time can be a lubricating control parameter. The above parameters comprise preferred lubricating boundary layer control parameters and can be used to effect changes in the finishing of the workpiece surface being finished. Changing a lubricating boundary layer control parameter to change the tangential force of friction at the operative finishing interface is preferred and changing a lubricating boundary layer control parameter to change the tangential force of friction at a region in the operative finishing interface is more preferred and changing a lubricating boundary layer control parameter to change the tangential force of friction in at least two regions of the operative finishing interface is even more preferred. Changing a control parameter to change the tangential force of friction at the operative finishing interface is preferred and changing a control parameter to change the tangential force of friction at a region in the operative finishing interface is more preferred and changing a control parameter to change the tangential force of friction in at least two regions of the operative finishing interface is even more preferred. Changing the lubricating boundary control parameters at least once during the finishing cycle time is preferred and changing the lubricating control parameters at least twice during the finishing cycle time is more preferred. Changing the lubricating boundary layer control parameters in situ is preferred and changing the lubricating boundary layer control parameters in situ with a subsystem controller is more preferred and changing the lubricating boundary layer control parameters in situ with a controller based on a secondary friction sensor signal is even more preferred.

Changing at least one control parameter in situ is preferred and changing at least one control parameter in situ with a subsystem controller is more preferred and changing at least one control parameter in situ with a controller based on a friction sensor signal is even more preferred. Controlling at least one control parameter in situ is preferred and controlling at least one control parameter in situ with a subsystem controller is more preferred and controlling at least one control parameter in situ with a controller based on a friction sensor signal is even more preferred. Changing at least one control parameter in situ is preferred and changing at least one control parameter in situ with a subsystem controller is more preferred and changing at least one control parameter in situ with a controller based on a secondary friction sensor signal is preferred. Controlling at least one control parameter in situ is preferred and controlling at least one control parameter in situ with a subsystem controller is more preferred and controlling at least one control parameter in situ with a controller based on a secondary friction sensor signal is even more preferred. Evaluating finishing control parameters in situ for improved adjustment using finishing control is preferred and using the finishing control parameters in situ at least in part for this improved adjustment of finishing control is more preferred. Evaluating cost of manufacture parameter(s) in situ for improved adjustment of finishing control is preferred and using the cost of manufacture parameters in situ at least in part for this improved adjustment of finishing control is more preferred.

Applying higher pressure in the unwanted raised region on the semiconductor wafer surface compared to pressure applied to the region below the unwanted raised region causing the boundary layer lubrication thickness to be less on the unwanted raised region and the boundary layer lubrication thickness to be greater on at least portion of the semiconductor wafer surface below the raised region is a preferred method for differential finishing rates. Applying higher pressure in the unwanted raised region on the semiconductor wafer surface compared to pressure applied to the region below the unwanted raised region causing the boundary layer lubrication thickness to be less on the unwanted raised region and a higher temperature on the unwanted raised region and the boundary layer lubrication thickness to be greater on at least portion of the semiconductor wafer surface below the raised region and a lower temperature is more preferred method for differential finishing rates.

Applying higher pressure in the unwanted raised region on the semiconductor wafer surface compared to pressure applied to the region below the unwanted raised region causing the organic lubricating film thickness to be less on the unwanted raised region and the organic lubricating film thickness to be greater on at least portion of the semiconductor wafer surface below the raised region is a preferred method for differential finishing rates. Applying higher pressure in the unwanted raised region on the semiconductor wafer surface compared to pressure applied to the region below the unwanted raised region causing the organic lubricating film thickness to be less on the unwanted raised region and a higher temperature on the unwanted raised region and the organic lubricating film thickness to be greater on at least portion of the semiconductor wafer surface below the raised region and a lower temperature is more preferred method for differential finishing rates.

Applying an operative finishing motion in the operative finishing interface forming an organic lubricating layer such that a tangential friction force is created in the operative finishing interface which is dependent on lubricant properties other than lubricant viscosity is preferred. Applying an operative finishing motion in the operative finishing interface forming an organic lubricating layer such that a tangential friction force is created in the operative finishing interface which depends on lubricant properties other than lubricant viscosity is preferred. Applying an operative finishing motion in the operative finishing interface forming a differential organic lubricating layer such that a plurality of different tangential friction forces are created in different regions of the operative finishing interface and wherein the plurality of the different tangential friction forces are dependent on lubricant properties other than lubricant viscosity is more preferred. Applying the greater tangential friction force in the unwanted raised region of the semiconductor wafer surface being finished and also applying the lower tangential friction force to a region below and proximate to the unwanted raised region of the semiconductor wafer surface being finished is also more preferred. By creating this type of lubricating layer, finishing of the semiconductor wafer can be accomplished with good finishing rates and reduced unwanted surface defects. Planarization can be improved. Within die nonuniformity can be improved. By in situ improving cost of manufacture parameters, the cost of finishing of a semiconductor can be reduced.

A method which updates the cost of manufacture control parameters, look-up tables, algorithms, or control logic consistent with the current manufacturing step is preferred. A method which updates the cost of manufacture control parameters, look-up tables, algorithms, or control logic consistent with the current manufacturing step while evaluating prior manufacturing steps (such as completed manufacturing steps) is preferred. A method which updates the cost of manufacture control parameters, look-up tables, algorithms, or control logic consistent with the current manufacturing step while evaluating future manufacturing steps is preferred. A method which updates the cost of manufacture control parameters, look-up tables, algorithms, or control logic consistent with the current manufacturing step while evaluating both prior and future manufacturing steps is more preferred. A tracking code is a preferred method to aid evaluation of prior, current, and future manufacture steps. The tracking code can be by individual semiconductor wafer and/or by semiconductor batch. This can facilitate low cost manufacture and improved in situ control of lubrication (such as lubricating films and/or active lubrication). This is preferred for multi-level semiconductor wafer processing because one level finishing can affect the next level finishing. Further, the type and composition of each layer can impact the improved real time control of finishing such as where a layer has a reduce strength such as a porous layer.

A lubrication control parameter is a parameter which affects the lubrication of the operative finishing interface. A lubricating control parameter is a parameter which affects the lubrication in the operative finishing interface-such as regional lubrication or average lubrication. A lubricating control parameter selected from the group consisting of the lubricant chemistry, lubricant concentration, lubricant transfer rate, operative finishing interface temperature, operative finishing interface pressure, and operative finishing interface motion is a preferred group of lubricating boundary layer control parameters. A parameter selected from the group consisting of the local lubricant chemistry, local lubricant concentration, local lubricant feed rate, local operative finishing interface temperature, local operative finishing interface pressure, and local operative finishing interface motion is also a preferred group of lubricating control parameters.

A lubrication control parameter is a parameter which affects the lubrication of the operative finishing interface. A boundary lubrication control parameter is a parameter which affects the lubrication such as the lubricating boundary layer or lubricating boundary film in the operative finishing interface. A parameter selected from the group consisting of the lubricant chemistry, lubricant concentration, lubricant transfer rate, operative finishing interface temperature, operative finishing interface pressure, and operative finishing interface motion is a preferred group of lubricating boundary layer control parameters. A parameter selected from the group consisting of the local lubricant chemistry, local lubricant concentration, local lubricant feed rate, local operative finishing interface temperature, local operative finishing interface pressure, and local operative finishing interface motion is a preferred group of local lubricating layer control parameters. An example of a local operative finishing interface pressure and local lubricating boundary layer is the local pressure and lubrication as illustrated and described in FIGS. 6 and 7 herein.

Supplying an organic lubricant for a portion of finishing cycle time is preferred. Supplying an organic lubricant for a secondary finishing step after a first finishing step free of lubricant can be preferred. Using two finishing steps, one with lubricant and one free of lubricant can reduce unwanted surface damage when finishing a semiconductor wafer. Using two finishing steps can also increase the finishing rate.

A reactive boundary lubricant is a preferred lubricant. A lubricating boundary layer comprising physical adsorption (physisorption) of the lubricant molecules to the semiconductor surface being finished is a preferred lubricating boundary layer. Van der Waals surface forces are a preferred example of physical adsorption. Dipole-dipole interaction between the boundary lubricant and the semiconductor wafer surface being finished is a preferred example of physical adsorption. A reversible dipole-dipole interaction between the boundary lubricant and the semiconductor wafer surface is an example of a more preferred physical adsorption lubricating boundary layer. An organic alcohol is an illustrative preferred example. A polar organic molecule containing the hetereoatom oxygen is preferred. An organic boundary lubricating layer which is a solid film generally has a greater ability to separate the finishing element finishing surface from the semiconductor wafer surface being finished. A heat of adsorption of from 2,000 to 10,000 cal/mole is preferred for physisorption. A physisorption organic boundary lubricating layer is a preferred reversible lubricating layer.

A lubricating boundary layer comprising chemisorption of lubricant molecules to the semiconductor wafer being finished is a preferred lubricating boundary layer. In chemisorption, chemical bonds hold the boundary lubricants to the semiconductor wafer surface being finished. As an illustrative example, a reaction of stearic acid forms a "metal soap" thin film on a metal surface. An organic carboxylic acid is a preferred example. Further, the "metal soap" can have a higher melting temperature and thus form regional areas of an organic boundary layer having higher temperature lubricating capacity as discussed further herein below. A heat of absorption of between 10,000 to 100,000 cal/mole is preferred for chemisorption.

A solid film organic boundary lubricating layer generally has a greater ability to separate the finishing element finishing surface from the semiconductor wafer surface being finished. A solid film organic boundary lubricating layer can thus help reduce finishing rates as measured in angstroms per minute (compared to a liquid film). A liquid film organic boundary lubricating layer generally has a lower ability to separate the finishing element finishing surface from the semiconductor wafer surface being finished can thus help increase finishing rates as measured in angstroms per minute (compared to a solid film). The same boundary lubricant can form either solid film organic boundary lubricating layer or a liquid film organic boundary lubricating layer depending on the operative finishing interface process conditions. A reversible organic boundary lubricating layer (which can change from solid to liquid to solid depending on processing conditions such as temperature) is preferred. Finishing a heterogeneous semiconductor wafer surface having at least one unwanted raised region wherein the lubricating boundary layer comprises a liquid film on the unwanted raised region and the lubricating boundary layer comprises a solid film in the region below and proximate to the unwanted raised region is preferred. Finishing a heterogeneous semiconductor wafer surface having at least one unwanted raised region wherein the lubricating boundary layer comprises a higher temperature liquid film on the unwanted raised region and the lubricating boundary layer comprises a lower temperature solid film in the region below and proximate to the unwanted raised region is preferred. Applying an operative finishing motion to the operative finishing interface forming a heterogeneous temperature profile on the semiconductor wafer surface being finishing and wherein the temperature is higher on a plurality of unwanted raised regions of the heterogeneous semiconductor wafer surface and the temperature is lower proximate to and below the plurality of unwanted raised regions of the heterogeneous semiconductor wafer surface and further the plurality of unwanted raised regions have a liquid lubricating films on them and the regions proximate to and below the plurality of unwanted raised regions solid lubricating films on them. See for instance Reference Numerals 802 (unwanted raised region) and 804 (region proximate to and below the unwanted raised region) for further helpful guidance. An example is octadecyl alcohol forms a solid lubricant film on copper at about 20 to 55 degrees centigrade and a liquid film on copper at about 65 to 110 degrees centigrade. An organic boundary lubricating layer that is capable of changing from a solid film to a liquid film in the operative finishing interface temperature range during a finishing cycle time is preferred. An organic boundary lubricating layer that is capable of changing from a solid film to a different physical form in the operative finishing interface temperature range during a finishing cycle time is preferred. An organic boundary lubricating layer that is capable of changing from a liquid film to a different physical form in the operative finishing interface temperature range during a finishing cycle time is preferred. An organic boundary lubricating layer that is capable of changing from a solid film to a liquid film in the temperature range from 20 to 100 degrees centigrade is more preferred. By increasing the finishing rate in the unwanted raised region and lowering the finishing rate in the region proximate to and below the unwanted raised region, planarization can be improved. Changing the lubricating boundary layer film physical form by changing at least one lubrication control parameter in situ based on feed back information from a lubrication control subsystem having an energy change sensor is preferred. Controlling the lubricating boundary layer film physical form by changing at least one lubrication control parameter in situ based on feed back information from a lubrication control subsystem having an energy change sensor is more preferred. Controlling the lubricating boundary layer film by changing at least one lubrication control parameter in real time during at least of portion of the finishing cycle time based on feed back information from a lubrication control subsystem is preferred. Controlling the lubricating boundary layer film physical form by changing at least one lubrication control parameter in real time during at least of portion of the finishing cycle time based on feed back information from a lubrication control subsystem having an energy change sensor is very preferred. Increasing temperature on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is preferred. Increasing temperature with frictional heat on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is more preferred. Using and controlling the lubricating boundary layer physical form can help customize finishing for the particular semiconductor wafers needing finishing. The operative motion interacts with the lubricating boundary layer in a new and useful way to finish a workpiece surface, preferably a semiconductor wafer surface.

A method of finishing wherein the controlling and adjusting the process control parameters changes either one or both the tangential force of friction or the coefficient of friction in the operative finishing interface is preferred and wherein adjusting the process control parameters change one or both the tangential force of friction or the coefficient of friction two times in the operative finishing interface during the finishing cycle time is more preferred and wherein adjusting the process control parameters change one or both the tangential force of friction or the coefficient of friction four times in the operative finishing interface during the finishing cycle time is even more preferred. A plurality of friction sensors generally aids this advanced control. Use of a plurality of cost of manufacture parameters also generally aids this advanced control to reduce the finishing cost of the semiconductor wafer. Some further nonlimiting examples follow. A method of finishing wherein the semiconductor wafer surface has at least one uniform region and controlling and adjusting 4 times a minimum of three process control parameters changes a coefficient of friction in at least the uniform region of the semiconductor wafer surface at least two times during the finishing cycle time is preferred. A method of finishing wherein the semiconductor wafer surface has at least one uniform region wherein the controlling and adjusting 4 times a minimum of two process control parameters changes in a tangential force of friction in at least a region of the operative finishing interface at least two times during the finishing cycle time is preferred.

A semiconductor wafers having low-k dielectric layers(s) are preferred workpiece. Illustrative nonlimiting examples of low-k dielectrics are low-k polymeric materials, low-k porous materials, and low-k foam materials. As used herein, a low-k dielectric has at most a k range of less than 3.5 and more preferably less than 3.0. Illustrative examples include doped oxides, organic polymers, highly fluorinated organic polymers, and porous materials. Low-k dielectric materials are generally known to those skilled in the semiconductor wafer arts.

For finishing of semiconductor wafers having low-k dielectric layers an organic boundary lubricating layer is preferred. Finishing a semiconductor wafer using the friction control subsystem and methods discussed herein can improve finishing. An organic lubricating boundary layer can help reduce harmful tangential friction forces. Illustrative nonlimiting examples of low-k dielectrics are low-k polymeric materials, low-k porous materials, and low-k foam materials. A preferred low-k dielectric can be a spin-on dielectric. "SiLK" and "FLARE" are illustrative examples of spin-on low-k dielectrics. A preferred low-k is a CVD low-k film. "Black Diamond" and SiOF are illustrative examples of CVD low-k films. A preferred low-k dielectric is a porous film. Xerogels and aerogels are illustrative examples of low-k porous films. Illustrative examples include doped oxides, organic polymers, highly fluorinated organic polymers, and porous materials.

Given the guidance and disclosure herein, one of skilled in the art can generally see that the friction sensor subsystems and finishing sensor subsystems can easily be used to detect changes to the finishing element finishing surface by monitoring real time changes in friction whether or not changes in lubrication are made and this information can be used by the subsystem to determine advantageous timing for finishing element finishing conditioning and thus improve finishing to a workpiece surface. Given the guidance and disclosure herein, one of skilled in the art can easily see that the friction sensor subsystems and finishing sensor subsystems can easily be used to detect changes in friction to the finishing element finishing surface by monitoring real time changes in friction, whether or not changes in lubrication are made. Friction sensor surface can be surfaces similar to the workpiece, surfaces essentially identical to those contained in the workpiece, a standard surface to compare surface friction against, or even an identical finishing element finishing surface. By measuring the change in friction with time or number of wafers process, improved and cost effective finishing element conditioning can be accomplished. At least two friction sensor probes are preferred when lubricants are used to help different changes in friction due to finishing element finishing surface wear and changes due to lubricant additions and/or changes. The friction sensor probes can be used for finishing element finishing surfaces having a fixed abrasive. The friction sensor probes can give a real time read-out on changes to the "cut-ability" of the fixed abrasive finishing element finishing surfaces and they can also be used to adjust finishing control parameters appropriately to these changes to effect improved finishing of the workpiece surface.

Common semiconductor wafer finishing involves the removal of one layer comprised predominantly of a conductive material such as copper during finishing in order to change the to a predominantly conductive material. Changes in friction measured by the friction sensor probes, with or without the addition of lubricant, along with knowledge of finishing performance as a function of this measure friction, and particularly when integrated with a workpiece sensor, can deliver good finishing control and ability to stop finishing when desired. Changes in friction measured by a plurality of operative friction sensors, with or without the addition of lubricant, along with knowledge of finishing performance as a function of this measure friction, and particularly when integrated with a workpiece sensor (and preferably, a plurality of workpiece sensors), can deliver good finishing control and ability to stop finishing when desired. Organic lubricants are preferred. Inorganic lubricants can also be used. Solid lubricants can be used. End points can be detected by detecting a changed level of friction at the operative finishing interface by using the friction sensor probes to detect and develop information to correct in real time to changing finishing control parameters including, but not limited to, changes in lubrication and changes in finishing element finishing surface changes with time.

Summary

Illustrative nonlimiting examples useful technology have referenced by their patents numbers and all of these patents are included herein by reference in their entirety for further general guidance and modification by those skilled in the arts. The scope of the invention should be determined by the appended claims and their legal equivalents, rather than by the preferred embodiments and details as discussed herein.

I claim:

1. A finishing apparatus comprising:
   a workpiece carrier for holding a workpiece surface;
   a finishing element finishing surface positioned proximate the workpiece surface;
   a mechanism for applying an operative finishing motion to an operative finishing interface comprising the workpiece surface and the finishing element finishing surface; and
   a friction control subsystem having at leat one friction sensor probe having a friction sensor surface proximate to the finishing element finishing surface and free of contact with the workpiece surface and the friction sensor subsystem for in situ control of a finishing control parameter and the friction control subsystem having access to cost of manufacture parameters.

2. The finishing apparatus according to claim 1 wherein the friction sensor subsystem has a plurality of friction sensor probe surfaces proximate the finishing element finishing surface and free of contact with the workpiece.

3. The finishing apparatus according to claim 1 wherein the friction control subsystem has a plurality of friction sensor probe surfaces proximate the finishing element finishing surface and free of contact with the workpiece and the friction control subsystem further comprises at least one operatively connected workpiece sensor.

4. A finishing apparatus comprising:
a workpiece carrier for holding a workpiece surface;
a finishing element finishing surface positioned proximate the workpiece surface;
a mechanism for applying an operative finishing motion to the operative finishing interface comprising the workpiece surface and finishing element finishing surface; and
a friction control subsystem having at least one friction sensor probe having a friction sensor surface proximate to the finishing element finishing surface and free of contact with the workpiece surface, the friction sensor probe for measuring a change in tangential force of friction and the friction sensor subsystem for in situ control of a finishing control parameter responsive to a signal from the friction sensor probe and the friction control subsystem having access to current cost of manufacture parameters.

5. The finishing apparatus according to claim 4 wherein the friction control subsystem has a plurality of friction sensor probe surfaces proximate the finishing element finishing surface and free of contact with the workpiece.

6. The finishing apparatus according to claim 4 wherein the friction control subsystem has a plurality of friction sensor probe surfaces proximate the finishing element finishing surface and free of contact with the workpiece and friction control subsystem further comprises at least one operatively connected workpiece sensor and the friction control subsystem for use of the friction sensor probe information and the workpiece sensor information for in situ control of the finishing control parameter.

7. The finishing apparatus according to claim 6 wherein the friction sensor subsystem is for applying and controlling a friction sensor motion to detect a change in tangential force of friction.

8. A finishing apparatus comprising:
a semiconductor wafer carrier for holding a semiconductor wafer surface;
a finishing element finishing surface positioned proximate the semiconductor wafer surface;
a mechanism for applying an operative finishing motion to an operative finishing interface comprising the semiconductor wafer surface and finishing element finishing surface; and
a friction control subsystem having at least one friction sensor probe having a friction sensor surface proximate to the finishing element finishing surface and free of contact with the semiconductor wafer surface and the friction sensor subsystem for in situ control of a finishing control parameter and the friction control subsystem having access to trackable cost of manufacture parameters.

9. The finishing apparatus according to claim 8 wherein the friction control subsystem has a plurality of friction sensor probe surfaces proximate the finishing element finishing surface and free of contact with the semiconductor wafer.

10. The finishing apparatus according to claim 8 wherein the friction control subsystem has access to current cost of manufacture parameters for in situ process control.

11. The finishing apparatus according to claim 8 wherein the friction control subsystem has a plurality of friction sensor probe surfaces proximate the finishing element finishing surface and free of contact with the semiconductor wafer and the friction control subsystem further comprises at least one operatively connected semiconductor wafer sensor.

12. A finishing apparatus comprising:
a semiconductor wafer carrier for holding a semiconductor wafer surface;
a finishing element finishing surface positioned proximate the semiconductor wafer surface;
a mechanism for applying an operative finishing motion to an operative finishing interface comprising the semiconductor wafer surface and finishing element finishing surface; and
a friction control subsystem having at least one friction sensor probe having a friction sensor surface proximate to the finishing element finishing surface and free of contact with the semiconductor wafer surface, the friction sensor probe for measuring a change in tangential force of friction and the friction sensor subsystem for in situ control of a finishing control parameter responsive to a signal from the friction sensor probe.

13. The finishing apparatus according to claim 12 wherein the friction control subsystem has a plurality of friction sensor surfaces proximate the finishing element finishing surface and free of contact with the semiconductor wafer.

14. The finishing apparatus according to claim 12 wherein the friction control subsystem has a plurality of friction sensor surfaces proximate the finishing element finishing surface and free of contact with the semiconductor wafer and the friction control subsystem further comprises at least one operatively connected semiconductor wafer sensor and the friction control subsystem for use of the friction sensor information and the semiconductor wafer sensor information for in situ control of the finishing control parameter.

15. The finishing apparatus according to claim 12 wherein the friction control subsystem is for applying and controlling a friction sensor motion to detect a change in tangential force of friction.

16. A method of finishing of a semiconductor wafer having a semiconductor wafer surface comprising the steps of:
providing a finishing element finishing surface;
positioning the semiconductor wafer surface proximate to the finishing element finishing surface;
providing an organic lubricant to an interface formed between the semiconductor wafer surface and the finishing element finishing surface;
providing at least one operative friction sensor for gaining information about the finishing;
applying an operative finishing motion between the semiconductor wafer surface and the finishing element finishing surface forming an operative finishing interface having a friction;
sensing the friction with the operative friction sensor and sending the information about the friction to a processor having access to current cost of manufacture parameters;
evaluating process control parameters for improved adjustment using at least in part a minimum of two cost of manufacture parameters; and
controlling at least two process control parameters to improve the cost of manufacture of the semiconductor wafer.

17. The method of finishing according to claim 16 wherein:
the semiconductor wafer surface has a first uniform region and a second uniform region;
the organic lubricant comprises a plurality of different organic lubricants; and
the plurality of different organic lubricants differentially lubricate the first uniform region and the second uniform region with compositionally different organic lubricating films.

18. The method of finishing according to claim 17 wherein the semiconductor wafer has a plurality of low-k dielectric layers, each having a value of less than 2.0.

19. The method of finishing according to claim 17 wherein the semiconductor wafer surface has a plurality of metal layers.

20. The method of finishing according to claim 16 wherein:
the semiconductor wafer surface has a first uniform region and a second uniform region;
the organic lubricant comprises a plurality of different organic lubricants; and
the plurality of different organic lubricants differentially lubricate the first uniform region and the second uniform region with compositionally different organic lubricating films; and wherein the differential lubrication changes the control of the at least two process control parameters to improve the cost of manufacture when compared to the control of the same plurality of process control parameters when the operative finishing interface is free of differential lubrication.

21. The method of finishing according to claim 20 wherein the two cost of manufacture parameters are selected from the group consisting of parametric yield, equipment yield, defect density, and finishing rate.

22. The method of finishing according to claim 20 wherein the semiconductor wafer has a low-k dielectric layer having a value of less than 2.5.

23. The method of finishing according to claim 20 wherein the semiconductor wafer has at least 3 porous low-k dielectric layers.

24. The method of finishing according to claim 23 wherein semiconductor wafer is finished on at least a plurality of layers and the control of the finishing parameters to improve cost of manufacture is different for at least a plurality of the different layers.

25. The method of finishing according to claim 20 wherein the semiconductor wafer has at least 3 of the metal layers.

26. The method of finishing according to claim 25 wherein semiconductor wafer is finished on at least a plurality of the metal layers and the control of the finishing parameters to improve cost of manufacture is different for at least a plurality of the different metal layers.

27. The method of finishing according to claim 16 wherein the finishing element finishing surface comprises, at least in part, an abrasive polymeric material.

28. A method of finishing a semiconductor wafer surface having a finishing cycle time comprising the steps of:
providing a finishing element finishing surface;
positioning the semiconductor wafer surface proximate to the finishing element finishing surface;
providing an organic lubricant to an interface formed between the semiconductor wafer surface and the finishing element finishing surface;
providing at least two operative friction sensors for gaining information about the finishing;
applying an operative finishing motion between the semiconductor wafer surface and the finishing element finishing surface forming an operative finishing interface with at least one friction;
sensing friction with the at least two operative friction sensors and sending the information about the finishing to a processor having access to cost of manufacture parameters;
evaluating process control parameters for improved adjustment using at least in part a minimum of three cost of manufacture parameters; and
controlling and adjusting at least 4 times a minimum of two process control parameters to improve the cost of manufacture of the semiconductor wafer during the finishing cycle time.

29. The method of finishing according to claim 28 wherein the three cost of manufacture parameters are selected from the group consisting of parametric yield, equipment yield, defect density, and finishing rate.

30. The method of finishing according to claim 29 wherein the controlling and adjusting 4 times a minimum of the two process control parameters changes a tangential force of friction in at least a region of the operative finishing interface at least two times during the finishing cycle time.

31. A method of finishing a semiconductor wafer having a semiconductor wafer surface and having a finishing cycle time comprising the steps of:
providing an abrasive finishing surface;
positioning the semiconductor wafer surface proximate to the abrasive finishing surface;
providing an organic lubricant and a finishing composition to an interface formed between the abrasive finishing surface and the semiconductor wafer surface;
providing at least one operative friction sensor for gaining information about the finishing;
applying an operative finishing motion between the semiconductor wafer surface and the abrasive finishing surface forming an operative finishing interface;
sensing the progress of the finishing of the semiconductor wafer surface with the operative sensor and sending the information about the finishing to a processor having access to current cost of manufacture parameters;
evaluating finishing control parameters for improved adjustment using at least in part a minimum of three current cost of manufacture parameters; and
controlling two process control parameters at least 4 times during the finishing cycle time to improve the cost of manufacture of the semiconductor wafer.

32. The method of finishing according to claim 31 wherein the semiconductor wafer surface has at least one uniform region and the step of controlling the two process control parameters comprises controlling the two process control parameters at least 4 times changes a coefficient of friction in at least the uniform region of the semiconductor wafer surface at least two times during the finishing cycle time.

33. A method of finishing of a semiconductor wafer surface comprising the steps of:
providing a finishing element finishing surface;
positioning the semiconductor wafer surface proximate to the finishing element finishing surface;
providing an organic lubricant and a finishing composition to an interface formed between the finishing element finishing surface and the semiconductor wafer surface;

providing at least one operative friction sensor for gaining information about the finishing;

applying an operative finishing motion between the semiconductor wafer surface and the finishing element finishing surface forming an operative finishing interface;

sensing the progress of finishing information of the semiconductor wafer surface with the operative sensor and sending the progress of finishing information about the finishing to a processor having access to cost of manufacture parameters;

evaluating process control parameters for improved adjustment using at least in part at least two cost of manufacture parameters; and controlling at least two process control parameters to improve the cost of manufacture of the semiconductor wafer.

34. A method of finishing having a finishing cycle time comprising the steps of:

providing a semiconductor wafer having a semiconductor wafer surface and a tracking code;

providing a finishing element finishing surface;

positioning the semiconductor wafer surface proximate to the finishing element finishing surface;

providing a lubricant to an interface formed between the semiconductor wafer surface and the finishing element finishing surface;

providing at least one operative friction sensor for gaining information about the finishing;

applying an operative finishing motion between the semiconductor wafer surface and the finishing element finishing surface forming an operative finishing interface having a friction;

sensing the friction with the operative friction sensor and sending the information about the friction to a processor having access to current cost of manufacture parameters;

evaluating process control parameters for improved adjustment using at least in part a minimum of a plurality of the current cost of manufacture parameters; and controlling at least two process control parameters to improve the cost of manufacture of the semiconductor wafer.

35. The method of finishing according to claim 34 wherein the two cost of manufacture parameters are selected from the group consisting of parametric yield, equipment yield, defect density, and finishing rate.

36. The method of finishing according to claim 35 wherein the evaluating finishing control parameters for improved control comprises evaluating finishing control parameters for improved control using a mathematical formula to calculate in situ at least one improved process control parameter value based at least in part upon a minimum of a plurality of the cost of manufacture parameters selected from the group consisting of parametric yield, equipment yield, defect density, and finishing rate.

37. The method of finishing according to claim 36 wherein the evaluating finishing control parameters for improved control comprises evaluating finishing control parameters for improved control using a mathematical formula to calculate in situ at least one improved process control parameter at least 4 times during the finishing cycle time.

38. The method of finishing according to claim 37 wherein:

the semiconductor wafer surface has a first uniform region and a second uniform region;

wherein the lubricant comprises an organic lubricant and the organic lubricant differentially lubricates the first uniform region and the second uniform region; and wherein the differential lubrication changes the control of the at least one process control parameter to improve the cost of manufacture when compared to the control of the same process control parameter when the operative finishing interface is free of differential lubrication.

39. The method of finishing according to claim 35 wherein the evaluating finishing control parameters for improved control comprises evaluating finishing control parameters for improved control using a mathematical formula to calculate in situ at least two improved process control parameter values based at least in part upon a minimum of a plurality of the cost of manufacture parameters selected from the group consisting of parametric yield, equipment yield, defect density, and finishing rate and then adjusting in situ at least those two improved process control parameters.

40. The method of finishing according to claim 39 wherein the evaluating finishing control parameters for improved control comprises evaluating finishing control parameters for improved control using a mathematical formula to calculate in situ at least one improved process control parameter at least 10 times during the finishing cycle time.

41. The method of finishing according to claim 40 wherein:

the semiconductor wafer surface has a first uniform region and a second uniform region;

and wherein the lubricant comprises a reactive lubricant; and the reactive lubricant differentially lubricates the first uniform region and the second uniform region; and wherein the differential lubrication changes the control of the at least one process control parameter to improve the cost of manufacture when compared to the control of the same process control parameter when the operative finishing interface is free of differential lubrication.

42. A method of finishing comprising the steps of:

providing a semiconductor wafer having a tracking code;

providing an abrasive finishing surface;

positioning the semiconductor wafer surface proximate to the abrasive finishing surface;

providing at least one operative friction sensor;

applying an operative finishing motion between the semiconductor wafer surface and the abrasive finishing surface forming an operative finishing interface having a friction;

sensing the friction with the operative friction sensor and sending the information about the friction to a processor having access to current cost of manufacture parameters;

evaluating using a mathematical formula to calculate in situ at least two improved process control parameter values based at least in part upon at least two cost of manufacture parameters selected from the group consisting of parametric yield, equipment yield, defect density, and finishing rate; and controlling at least two process control parameters to improve the cost of manufacture of the semiconductor wafer.

* * * * *